United States Patent
Mudd et al.

(10) Patent No.: US 11,815,920 B2
(45) Date of Patent: *Nov. 14, 2023

(54) FLOW CONTROL SYSTEM, METHOD, AND APPARATUS

(71) Applicant: Ichor Systems, Inc., Fremont, CA (US)

(72) Inventors: Daniel T. Mudd, Reno, NV (US); Sean Joseph Penley, Sparks, NV (US); Michael Maeder, Reno, NV (US); Patti J. Mudd, Reno, NV (US)

(73) Assignee: ICHOR SYSTEMS, INC.

( * ) Notice: Subject to any disclaimer, the term of this patent is extended or adjusted under 35 U.S.C. 154(b) by 78 days.

This patent is subject to a terminal disclaimer.

(21) Appl. No.: 17/468,042

(22) Filed: Sep. 7, 2021

(65) Prior Publication Data

US 2022/0004209 A1 Jan. 6, 2022

Related U.S. Application Data

(63) Continuation of application No. 17/027,333, filed on Sep. 21, 2020, now Pat. No. 11,144,075, and a
(Continued)

(51) Int. Cl.
*G05D 7/06* (2006.01)
*G01F 1/684* (2006.01)
(Continued)

(52) U.S. Cl.
CPC ......... *G05D 7/0126* (2013.01); *F16K 27/003* (2013.01); *G01F 1/6842* (2013.01);
(Continued)

(58) Field of Classification Search
USPC .......................................................... 73/1.16
See application file for complete search history.

(56) References Cited

U.S. PATENT DOCUMENTS 2,615,659 A 10/1952 Gardner, Jr. et al.
2,666,297 A 1/1954 Skousgaard
(Continued)

FOREIGN PATENT DOCUMENTS

CN 1461429 A 12/2003
CN 1816733 8/2006
(Continued)

OTHER PUBLICATIONS

Ieki, Atsushi, *Design Method of PID Compensator*, International Model Control, English Edition No. 43, May 2015, pp. 49-52.
(Continued)

*Primary Examiner* — Clayton E. LaBalle
*Assistant Examiner* — Warren K Fenwick
(74) *Attorney, Agent, or Firm* — The Belles Group, P.C.

(57) ABSTRACT

A gas flow control system for delivering a plurality of gas flows. The gas flow control system has a gas flow path extending from a gas inlet to first and second gas outlets. First and second flow restrictors are operably coupled to the gas flow path. First and second valves are operably coupled to the gas flow path such that when both first and second valves are in a fully open state, flows of gas from the first and second gas outlets are split according to the impedances of the first and second flow restrictors.

20 Claims, 87 Drawing Sheets

Related U.S. Application Data continuation-in-part of application No. 16/985,635, filed on Aug. 5, 2020, now Pat. No. 11,585,444, and a continuation-in-part of application No. 16/985,540, filed on Aug. 5, 2020, and a continuation-in-part of application No. 16/864,117, filed on Apr. 30, 2020, now Pat. No. 11,424,148, said application No. 17/027,333 is a continuation-in-part of application No. 16/383,844, filed on Apr. 15, 2019, now Pat. No. 10,782,710, application No. 17/468,042 is a continuation-in-part of application No. 16/282,737, filed on Feb. 22, 2019, now Pat. No. 10,838,437, said application No. 16/864,117 is a continuation of application No. 15/717,562, filed on Sep. 27, 2017, now Pat. No. 10,679,880, said application No. 16/383,844 is a continuation of application No. 15/638,742, filed on Jun. 30, 2017, now Pat. No. 10,303,189.

(60) Provisional application No. 62/882,794, filed on Aug. 5, 2019, provisional application No. 62/882,814, filed on Aug. 5, 2019, provisional application No. 62/633,945, filed on Feb. 22, 2018, provisional application No. 62/400,324, filed on Sep. 27, 2016, provisional application No. 62/357,113, filed on Jun. 30, 2016.

(51) Int. Cl.
  *G01F 15/00* (2006.01)
  *G05D 7/01* (2006.01)
  *F16K 27/00* (2006.01)

(52) U.S. Cl.
  CPC .......... *G01F 1/6847* (2013.01); *G01F 15/002* (2013.01); *G05D 7/0635* (2013.01); *G05D 7/0682* (2013.01)

(56) References Cited

U.S. PATENT DOCUMENTS

| | | |
|---|---|---|
| 3,071,160 A | 1/1963 | Weichbrod |
| 3,271,994 A | 9/1966 | Fournier et al. |
| 3,335,748 A | 8/1967 | Klemm et al. |
| 3,453,861 A | 7/1969 | Levasseur |
| 3,491,946 A | 1/1970 | Muller |
| 3,504,692 A | 4/1970 | Goldstein |
| 3,559,482 A | 2/1971 | Baker et al. |
| 3,570,807 A | 3/1971 | Sturman et al. |
| 3,807,456 A | 4/1974 | Colletti |
| 3,814,541 A | 6/1974 | Dent et al. |
| 3,841,520 A | 10/1974 | Bryant et al. |
| 3,851,526 A | 12/1974 | Drexel |
| 3,910,113 A | 10/1975 | Brown |
| 4,015,626 A | 4/1977 | Thordarson |
| 4,096,746 A | 6/1978 | Wilson et al. |
| 4,118,009 A | 10/1978 | Chmura |
| 4,203,465 A | 5/1980 | Rissi |
| 4,253,156 A | 2/1981 | Lisle et al. |
| 4,275,752 A | 6/1981 | Collier et al. |
| 4,304,263 A | 12/1981 | Choate |
| 4,315,523 A | 2/1982 | Mahawili et al. |
| 4,327,757 A | 5/1982 | Weevers |
| 4,406,161 A | 9/1983 | Locke et al. |
| 4,450,718 A | 5/1984 | Hartemink |
| 4,462,915 A | 7/1984 | Friedman |
| 4,497,202 A | 2/1985 | Mermelstein |
| 4,527,600 A | 7/1985 | Fisher et al. |
| 4,576,043 A | 3/1986 | Nguyen |
| 4,589,440 A | 5/1986 | Panet |
| 4,718,443 A | 1/1988 | Adney et al. |
| 4,741,359 A | 5/1988 | Siebald |
| 4,796,651 A | 1/1989 | Ginn et al. |
| 4,858,643 A | 8/1989 | Vavra et al. |
| 4,888,117 A | 12/1989 | Brown et al. |
| 4,904,285 A | 2/1990 | Yamada et al. |
| 4,918,995 A | 4/1990 | Pearman et al. |
| 5,003,810 A | 4/1991 | Jepson et al. |
| 5,044,199 A | 9/1991 | Drexel et al. |
| 5,052,363 A | 10/1991 | Stiles |
| 5,062,446 A | 11/1991 | Anderson |
| 5,080,131 A | 1/1992 | Ono et al. |
| 5,100,100 A | 3/1992 | Benson et al. |
| 5,100,551 A | 3/1992 | Pall et al. |
| 5,114,447 A | 5/1992 | Davis et al. |
| 5,123,439 A | 6/1992 | Powers |
| 5,129,418 A | 7/1992 | Shimomura et al. |
| 5,152,483 A | 10/1992 | Maeng |
| 5,159,951 A | 11/1992 | Ono et al. |
| 5,161,576 A | 11/1992 | Hekkert et al. |
| 5,187,771 A | 2/1993 | Uchida |
| 5,187,972 A | 2/1993 | Defriez |
| 5,190,068 A | 3/1993 | Philbin |
| 5,259,243 A | 11/1993 | Drexel et al. |
| 5,267,584 A | 12/1993 | Smith |
| 5,280,773 A | 1/1994 | Becker |
| 5,285,673 A | 2/1994 | Drexel et al. |
| 5,297,427 A | 3/1994 | Shambayati |
| 5,305,638 A | 4/1994 | Saghatchi et al. |
| 5,311,762 A | 5/1994 | Drexel |
| 5,321,992 A | 6/1994 | Mudd et al. |
| 5,325,705 A | 7/1994 | Tom |
| 5,329,966 A | 7/1994 | Fenimore et al. |
| 5,359,878 A | 11/1994 | Mudd |
| 5,419,133 A | 5/1995 | Schneider |
| 5,439,026 A | 8/1995 | Moriya et al. |
| 5,445,035 A | 8/1995 | Delajoud |
| 5,511,585 A | 4/1996 | Lee |
| 5,542,284 A | 8/1996 | Layzell et al. |
| 5,549,272 A | 8/1996 | Kautz |
| 5,576,498 A | 11/1996 | Shambayati |
| 5,583,282 A | 12/1996 | Tom |
| 5,624,409 A | 4/1997 | Seale |
| 5,640,299 A | 6/1997 | Leach |
| 5,660,207 A | 8/1997 | Mudd |
| 5,669,408 A | 9/1997 | Nishino et al. |
| 5,711,786 A | 1/1998 | Hinishaw |
| 5,730,181 A | 3/1998 | Doyle et al. |
| 5,762,086 A | 6/1998 | Ollivier |
| 5,769,122 A | 6/1998 | Baumann et al. |
| 5,804,717 A | 9/1998 | Lucas |
| 5,816,285 A | 10/1998 | Ohmi et al. |
| 5,865,205 A | 2/1999 | Wilmer |
| 5,868,159 A | 2/1999 | Loan et al. |
| 5,904,170 A | 5/1999 | Harvey et al. |
| 5,911,238 A | 6/1999 | Bump et al. |
| 5,917,066 A | 6/1999 | Eisenmann et al. |
| 5,918,616 A | 7/1999 | Sanfilippo et al. |
| 5,935,418 A | 8/1999 | Chakrabarty et al. |
| 5,944,048 A | 8/1999 | Bump et al. |
| 5,970,801 A | 10/1999 | Ciobanu et al. |
| 5,975,126 A | 11/1999 | Bump et al. |
| 5,988,211 A | 11/1999 | Cornell |
| 6,015,590 A | 1/2000 | Suntola |
| 6,026,834 A | 2/2000 | Azima |
| 6,026,847 A | 2/2000 | Reinicke et al. |
| 6,062,246 A | 5/2000 | Tanaka et al. |
| 6,062,256 A | 5/2000 | Miller et al. |
| 6,068,016 A | 5/2000 | Manofsky, Jr. et al. |
| 6,074,691 A | 6/2000 | Schmitt et al. |
| 6,080,219 A | 6/2000 | Jha et al. |
| 6,116,269 A | 9/2000 | Maxson |
| 6,119,710 A | 9/2000 | Brown |
| 6,125,869 A | 10/2000 | Horiuchi |
| 6,125,887 A | 10/2000 | Pinto |
| 6,138,708 A | 10/2000 | Waldbusser |
| 6,152,162 A | 11/2000 | Balazy et al. |
| 6,178,995 B1 | 1/2001 | Ohmi et al. |
| 6,269,692 B1 | 8/2001 | Drexel et al. |
| 6,303,501 B1 | 10/2001 | Chen et al. |
| 6,314,991 B1 | 11/2001 | Gill |
| 6,352,001 B1 | 3/2002 | Wickert et al. |
| 6,422,256 B1 | 7/2002 | Balazy et al. |

(56) References Cited

U.S. PATENT DOCUMENTS

| | | | |
|---|---|---|---|
| 6,422,264 B2 | 7/2002 | Ohmi et al. |
| 6,425,281 B1 | 7/2002 | Sheriff et al. |
| 6,443,174 B2 | 9/2002 | Mudd |
| 6,539,968 B1 | 4/2003 | White et al. |
| 6,561,218 B2 | 5/2003 | Mudd |
| 6,564,825 B2 | 5/2003 | Lowery et al. |
| 6,615,874 B2 | 9/2003 | Thurston et al. |
| 6,631,334 B2 | 10/2003 | Grosshart |
| 6,642,281 B1 | 11/2003 | Long et al. |
| 6,655,408 B2 | 12/2003 | Linthorst |
| 6,712,084 B2 | 3/2004 | Shajii et al. |
| 6,752,166 B2 | 6/2004 | Lull et al. |
| 6,799,603 B1 | 10/2004 | Moore |
| 6,832,628 B2 | 12/2004 | Thordarson et al. |
| 6,868,862 B2 | 3/2005 | Shajii et al. |
| 6,881,263 B2 | 4/2005 | Lindfors et al. |
| 6,948,508 B2 | 9/2005 | Shajii et al. |
| 7,037,372 B2 | 5/2006 | Lindfors et al. |
| 7,073,392 B2 | 7/2006 | Lull et al. |
| 7,136,767 B2 | 11/2006 | Shajii et al. |
| 7,216,019 B2 | 5/2007 | Tinsley et al. |
| 7,252,032 B2 | 8/2007 | Scheffel et al. |
| 7,334,602 B2 | 2/2008 | Ahn |
| 7,337,805 B2 | 3/2008 | Brown et al. |
| 7,353,841 B2 | 4/2008 | Kono et al. |
| 7,370,664 B2 | 5/2008 | Glite |
| 7,424,346 B2 | 9/2008 | Shajii et al. |
| 7,431,045 B2 | 10/2008 | Mudd et al. |
| 7,474,968 B2 | 1/2009 | Ding et al. |
| 7,552,015 B2 | 6/2009 | Shajii et al. |
| 7,615,120 B2 | 11/2009 | Shajii et al. |
| 7,628,861 B2 | 12/2009 | Clark |
| 7,662,233 B2 | 2/2010 | Sneh |
| 7,680,399 B2 | 3/2010 | Buchanan et al. |
| 7,682,946 B2 | 3/2010 | Ma et al. |
| 7,693,606 B2 | 4/2010 | Ahmad et al. |
| 7,706,925 B2 | 4/2010 | Ding et al. |
| 7,717,061 B2 | 5/2010 | Ishizaka et al. |
| 7,757,554 B2 | 7/2010 | Ding et al. |
| 7,809,473 B2 | 10/2010 | Shajii et al. |
| 7,826,986 B2 | 11/2010 | McDonald |
| 7,850,779 B2 | 12/2010 | Ma et al. |
| 7,874,208 B2 | 1/2011 | Redemann et al. |
| 7,881,829 B2 | 2/2011 | Yoneda et al. |
| 7,891,228 B2 | 2/2011 | Ding et al. |
| 7,905,139 B2 | 3/2011 | Lull |
| 7,918,238 B2 | 4/2011 | Tanaka et al. |
| 7,922,150 B2 | 4/2011 | Cripps et al. |
| 7,974,544 B2 | 7/2011 | Kobayashi |
| 7,979,165 B2 | 7/2011 | Gotoh et al. |
| 8,019,481 B2 | 9/2011 | Yamaguchi et al. |
| 8,100,382 B2 | 1/2012 | Robertson, III et al. |
| 8,104,323 B2 | 1/2012 | Yasuda |
| 8,109,296 B2 | 2/2012 | Minegishi et al. |
| 8,112,182 B2 | 2/2012 | Tokuhisa et al. |
| 8,165,795 B2 | 4/2012 | Debailleul |
| 8,183,781 B2 | 5/2012 | Sangam |
| 8,201,989 B2 | 6/2012 | Itoh et al. |
| 8,205,629 B2 | 6/2012 | Gregor et al. |
| 8,265,795 B2 | 9/2012 | Takahashi et al. |
| 8,282,992 B2 | 10/2012 | Myo et al. |
| 8,291,857 B2 | 10/2012 | Lam et al. |
| 8,293,015 B2 | 10/2012 | Lam et al. |
| 8,340,827 B2 | 12/2012 | Yun et al. |
| 8,343,258 B2 | 1/2013 | Guan |
| 8,343,279 B2 | 1/2013 | Myo et al. |
| 8,356,623 B2 | 1/2013 | Isobe et al. |
| 8,376,312 B2 | 2/2013 | Mudd et al. |
| 8,382,897 B2 | 2/2013 | Sangam |
| 8,408,245 B2 | 4/2013 | Feldman et al. |
| 8,443,649 B2 | 5/2013 | Yasuda et al. |
| 8,460,753 B2 | 6/2013 | Xiao et al. |
| 8,504,318 B2 | 8/2013 | Mendelson et al. |
| 8,505,478 B2 | 8/2013 | Suekane et al. |
| 8,511,337 B2 | 8/2013 | Nishimura |
| 8,573,247 B2 | 11/2013 | Ushigusa et al. |
| 8,744,784 B2 | 6/2014 | Yasuda et al. |
| 8,746,057 B2 | 6/2014 | Yasuda et al. |
| 8,770,215 B1 | 7/2014 | Mudd et al. |
| 8,789,556 B2 | 7/2014 | Yasuda et al. |
| 8,793,082 B2 | 7/2014 | Ding et al. |
| 8,794,261 B2 | 8/2014 | Watanabe et al. |
| 8,800,589 B2 | 8/2014 | Minami et al. |
| 8,851,105 B2 | 10/2014 | Kashima et al. |
| 8,910,656 B2 | 12/2014 | Yasuda |
| 8,915,262 B2 | 12/2014 | Smirnov |
| 8,950,433 B2 | 2/2015 | Manofsky, Jr. et al. |
| 8,997,686 B2 | 4/2015 | Ding |
| 9,027,585 B2 | 5/2015 | Smirnov |
| 9,058,041 B2 | 6/2015 | Lacouture et al. |
| 9,081,388 B2 | 7/2015 | Tanaka et al. |
| 9,109,736 B2 | 8/2015 | Yada et al. |
| 9,188,989 B1 | 11/2015 | Mudd et al. |
| 9,207,139 B2 | 12/2015 | Jones et al. |
| 9,223,318 B2 | 12/2015 | Takeuchi et al. |
| 9,507,352 B2 | 11/2016 | Dohi et al. |
| 9,690,301 B2 | 6/2017 | Mudd et al. |
| 9,940,004 B2 | 4/2018 | Mayworm |
| 9,958,302 B2 | 5/2018 | Mudd et al. |
| 10,031,531 B2 | 7/2018 | Ding |
| 10,782,710 B2 | 9/2020 | Mudd et al. |
| 10,838,437 B2 * | 11/2020 | Penley ............ G05D 11/13 |
| 2001/0013363 A1 | 8/2001 | Kitayama et al. |
| 2002/0002996 A1 | 1/2002 | Mudd |
| 2002/0014206 A1 | 2/2002 | Mudd |
| 2002/0046612 A1 | 4/2002 | Mudd |
| 2002/0095225 A1 | 7/2002 | Huang et al. |
| 2004/0007180 A1 | 1/2004 | Yamasaki et al. |
| 2004/0011198 A1 | 1/2004 | Keefer et al. |
| 2004/0050325 A1 | 3/2004 | Samoilov et al. |
| 2004/0083807 A1 | 5/2004 | Mudd et al. |
| 2004/0244837 A1 | 12/2004 | Nawata et al. |
| 2005/0016604 A1 | 1/2005 | Steinke et al. |
| 2005/0056211 A1 | 3/2005 | Lindfors et al. |
| 2005/0087299 A1 | 4/2005 | Okabe et al. |
| 2005/0098906 A1 | 5/2005 | Satoh et al. |
| 2006/0005883 A1 | 1/2006 | Mudd et al. |
| 2006/0037644 A1 | 2/2006 | Nishikawa et al. |
| 2006/0060139 A1 | 3/2006 | Meneghini et al. |
| 2006/0060253 A1 | 3/2006 | Yoshida et al. |
| 2006/0124173 A1 | 6/2006 | An |
| 2006/0130755 A1 | 6/2006 | Clark |
| 2006/0185746 A1 | 8/2006 | Doyle |
| 2006/0207503 A1 | 9/2006 | Meneghini et al. |
| 2007/0089789 A1 | 4/2007 | Mudd et al. |
| 2007/0110636 A1 | 5/2007 | Lee et al. |
| 2007/0227659 A1 | 10/2007 | Iizuka |
| 2008/0041481 A1 | 2/2008 | Mudd et al. |
| 2008/0305014 A1 | 12/2008 | Honda |
| 2009/0101217 A1 | 4/2009 | Ushigusa et al. |
| 2010/0005904 A1 | 1/2010 | Igarashi |
| 2010/0110399 A1 | 5/2010 | Lyons |
| 2010/0138051 A1 | 6/2010 | Glime |
| 2010/0154895 A1 | 6/2010 | Igarashi |
| 2010/0163135 A1 | 7/2010 | Safronovs |
| 2010/0224264 A1 | 9/2010 | Homan et al. |
| 2010/0269924 A1 | 10/2010 | Yasuda |
| 2011/0108126 A1 | 5/2011 | Monkowski et al. |
| 2011/0248000 A1 | 10/2011 | Barhorst et al. |
| 2012/0116596 A1 | 5/2012 | Yoneda et al. |
| 2012/0132291 A1 | 5/2012 | Monkowski et al. |
| 2012/0180876 A1 | 7/2012 | Hayashi et al. |
| 2012/0318383 A1 | 12/2012 | Yasuda et al. |
| 2013/0092256 A1 | 4/2013 | Yasuda et al. |
| 2013/0092258 A1 | 4/2013 | Yasuda et al. |
| 2013/0118596 A1 | 5/2013 | Horsky |
| 2013/0186499 A1 | 7/2013 | Yada et al. |
| 2014/0034164 A1 | 2/2014 | Yasuda |
| 2014/0069527 A1 | 3/2014 | Mudd et al. |
| 2014/0083514 A1 | 3/2014 | Ding |
| 2014/0158211 A1 | 6/2014 | Ding et al. |
| 2014/0182692 A1 | 7/2014 | Hirata et al. |
| 2014/0190578 A1 | 7/2014 | Hayashi |
| 2014/0230915 A1 | 8/2014 | Mudd et al. |

(56) References Cited

U.S. PATENT DOCUMENTS

| | | |
|---|---|---|
| 2014/0260963 A1 | 9/2014 | Wang |
| 2015/0007897 A1 | 1/2015 | Valentine et al. |
| 2015/0027558 A1 | 1/2015 | Kehoe et al. |
| 2015/0047738 A1 | 2/2015 | Wilson et al. |
| 2015/0121988 A1 | 5/2015 | Banares et al. |
| 2015/0212524 A1 | 7/2015 | Kehoe et al. |
| 2015/0362391 A1 | 12/2015 | Suzuki et al. |
| 2016/0011604 A1 | 1/2016 | Mudd et al. |
| 2016/0018828 A1 | 1/2016 | Mudd et al. |
| 2016/0041564 A1 | 2/2016 | Mudd et al. |
| 2016/0108523 A1 | 4/2016 | Lee et al. |
| 2016/0124439 A1 | 5/2016 | Yasuda et al. |
| 2016/0327963 A1 | 11/2016 | Hirata et al. |
| 2017/0082076 A1 | 3/2017 | Ge |
| 2019/0072102 A1 | 3/2019 | Zhang et al. |
| 2019/0243393 A1 | 8/2019 | Mudd et al. |
| 2020/0258764 A1 | 8/2020 | Penley et al. |
| 2021/0004027 A1 | 1/2021 | Mudd et al. |

FOREIGN PATENT DOCUMENTS

| | | |
|---|---|---|
| CN | 102096420 A1 | 6/2011 |
| CN | 102354228 | 2/2012 |
| CN | 103838261 | 6/2014 |
| DE | 69535683 | 1/2009 |
| EP | 0468793 | 1/1992 |
| EP | 0671484 | 9/1995 |
| EP | 0689040 | 12/1995 |
| JP | 11119835 | 4/1999 |
| JP | 2000018407 | 1/2000 |
| JP | 2004157719 | 6/2004 |
| JP | 3557087 | 8/2004 |
| JP | 2004302914 | 10/2004 |
| JP | 2007041870 | 2/2007 |
| JP | 4137666 | 8/2008 |
| JP | 4146746 | 9/2008 |
| JP | 2009079667 | 4/2009 |
| JP | 4351495 | 10/2009 |
| JP | 2009300403 | 12/2009 |
| JP | 4572139 | 10/2010 |
| JP | 4589846 | 12/2010 |
| JP | 4705140 | 6/2011 |
| JP | 2011171337 | 9/2011 |
| JP | 4974000 | 7/2012 |
| JP | 5090559 | 12/2012 |
| JP | 5091821 | 12/2012 |
| JP | 2016035462 | 3/2016 |
| TW | 201414990 | 4/2014 |
| WO | WO8700267 | 1/1987 |
| WO | WO2003081361 | 10/2003 |
| WO | WO200401516 | 12/2003 |
| WO | WO2011040409 | 4/2011 |
| WO | WO2014/152755 A2 | 9/2014 |

OTHER PUBLICATIONS

Couturier, Pierre, *Optimising the Control Parameters in a Digital Mass Flow Controller*, LG12P Research Center, Print date Sep. 2, 2016, pp. 1-6.

McDonald, Mike R., Beyond Pressure Transients: Using Pressure-Insentive Mass Flow Controllers to Control Gases in Semiconductor Manufacturing, Semiconductor Manufacturing, vol. 7, Issue 3, Mar. 2006, pp. 1-5.

\* cited by examiner

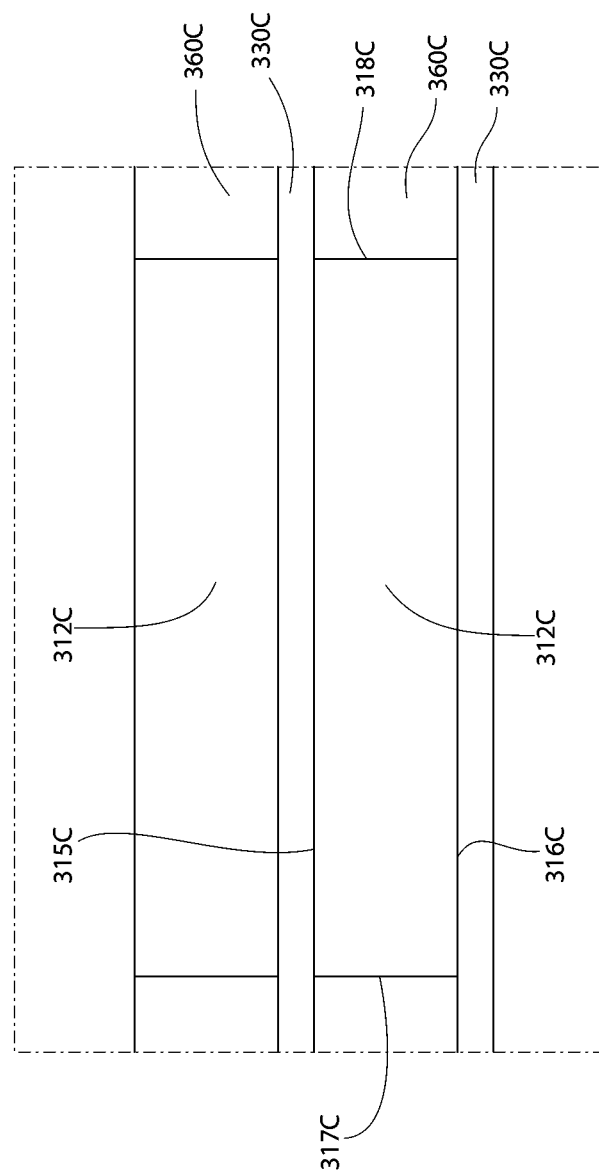

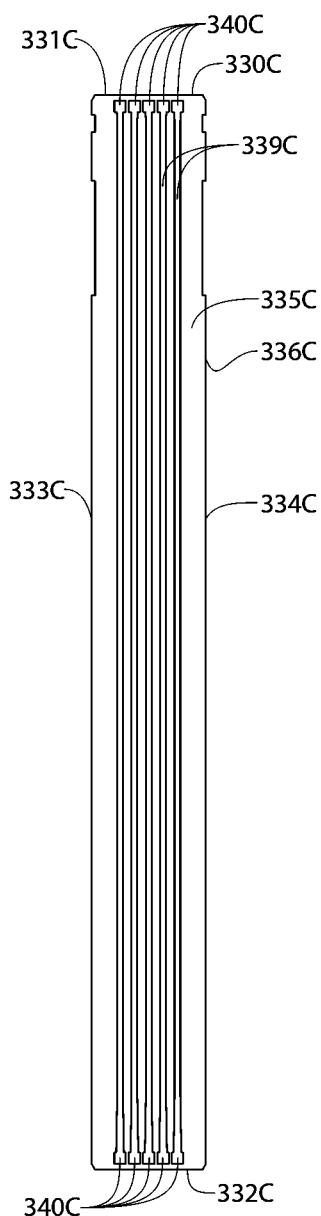
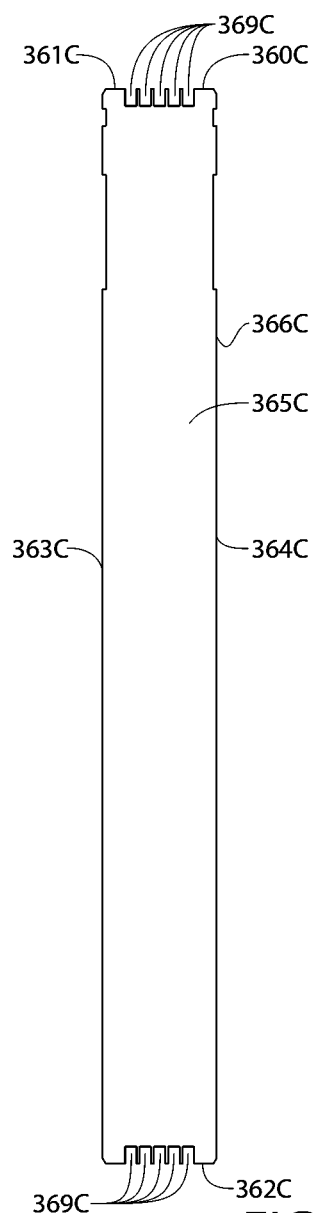
FIG. 55
FIG. 56

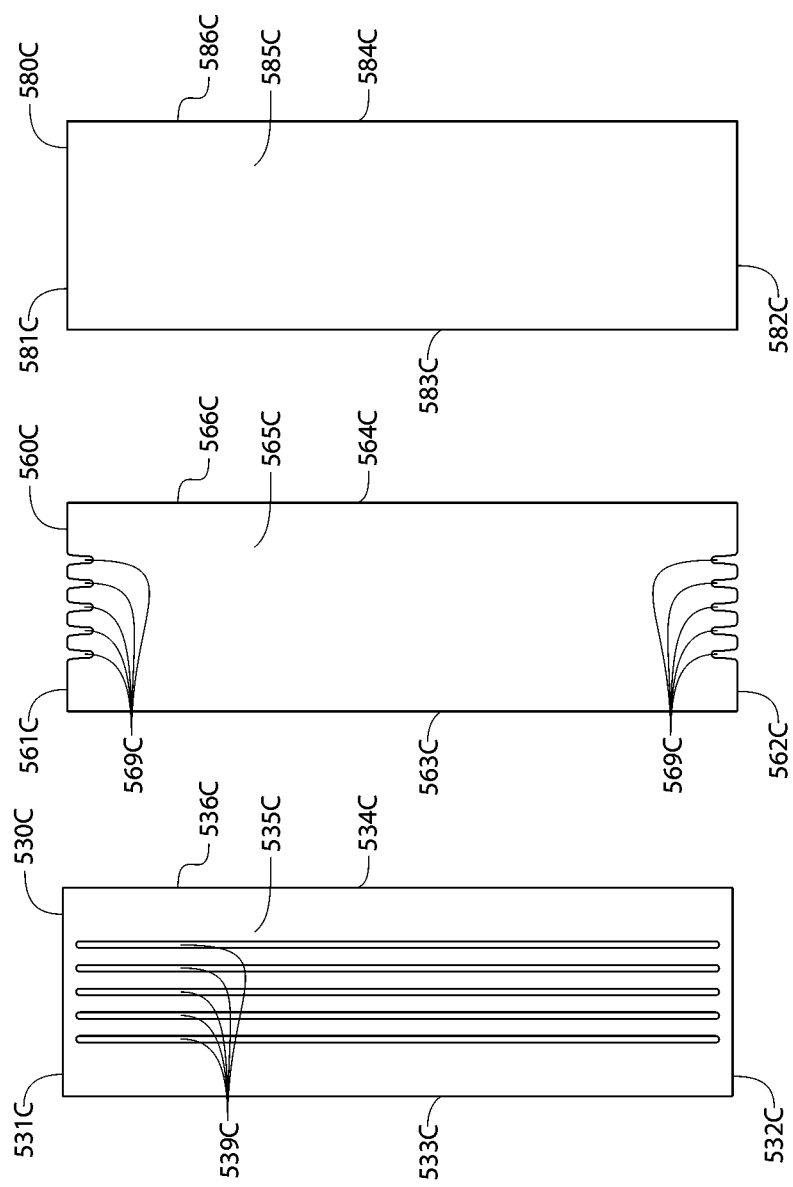

FLOW CONTROL SYSTEM, METHOD, AND APPARATUS

CROSS REFERENCE TO RELATED APPLICATIONS

The present application is a continuation of U.S. patent application Ser. No. 17/027,333, filed Sep. 21, 2020, which is (1) a continuation in part of U.S. patent application Ser. No. 16/383,844, (now U.S. Pat. No. 10,782,710), filed Apr. 15, 2019, which is a continuation of U.S. patent application Ser. No. 15/638,742 (now U.S. Pat. No. 10,303,189), filed Jun. 30, 2017, which in turn claims the benefit of U.S. Provisional Patent Application No. 62/357,113, filed Jun. 30, 2016; (2) a continuation in part of U.S. patent application Ser. No. 16/864,117, filed Apr. 30, 2020, which is a continuation of U.S. patent application Ser. No. 15/717,562 (now U.S. Pat. No. 10,679,880), filed Sep. 27, 2017, which in turn claims the benefit of U.S. Provisional Patent Application No. 62/400,324, filed Sep. 27, 2016; (3) a continuation in part of U.S. patent application Ser. No. 16/282,737, (now U.S. Pat. No. 10,838,437), filed Feb. 22, 2019, which in turn claims the benefit of U.S. Provisional Patent Application No. 62/633,945, filed Feb. 22, 2018; (4) a continuation in part of U.S. patent application Ser. No. 16/985,540, filed Aug. 5, 2020, which in turn claims the benefit of U.S. Provisional Patent Application No. 62/882,794, filed Aug. 5, 2019; and (5) a continuation in part of U.S. patent application Ser. No. 16/985,635, filed Aug. 5, 2020, which in turn claims the benefit of U.S. Provisional Patent Application No. 62/882,814, filed Aug. 5, 2019, the entireties of which are incorporated herein by reference.

BACKGROUND OF THE INVENTION

Mass flow control has been one of the key technologies in semiconductor chip fabrication. Mass flow controllers (MFCs) are important components for delivering process gases for semiconductor fabrication. An MFC is a device used to measure and control the flow of fluids and gases.

As the technology of chip fabrication has improved, so has the demand on the MFC. Semiconductor fabrication processing increasingly requires increased performance, including more accurate measurements, lower equipment costs, greater speed, more consistency in timing in the delivery of gases, and space-saving layouts.

SUMMARY OF THE INVENTION

The present technology is directed to a method of making a plurality of mass flow controllers having different operating characteristics while maintaining a common monolithic base. Thus, different flow components such as cap components, laminar flow components, control valve components, pressure transducer components, volumetric expander components, on/off valve components, and temperature sensor components may be coupled to substantially identical monolithic bases.

The present technology is further directed to a method of improving the transient turn on performance of a pressure based apparatus for controlling flow. This is achieved by pre-pressurizing a volume within the apparatus prior to opening a valve, the valve allowing gas to flow out an outlet of the apparatus.

The present technology is further directed to an apparatus for splitting a flow of process gases into two separate mass flows for use at different locations in a processing chamber.

The present technology is further directed to a laminar flow restrictor for use in a mass flow controller or other gas delivery device. One or more of these gas delivery devices may be used in a wide range of processes such as semiconductor chip fabrication, solar panel fabrication, etc.

The present technology is directed to a seal for a flow restrictor for use in a mass flow controller or other gas delivery device. One or more of these gas delivery devices may be used in a wide range of processes such as semiconductor chip fabrication, solar panel fabrication, etc.

In one implementation, the method of making mass flow controllers comprises providing a plurality of substantially identical monolithic bases, each of the monolithic bases comprising a gas inlet, a gas outlet, and a plurality of flow component mounting regions. The method further comprises coupling a first set of flow components to the flow component mounting regions of a first one of the monolithic bases so that a fluid path is formed from the gas inlet to the gas outlet of the first one of the monolithic bases to which each component of the first set of flow components is in fluid communication, thereby creating a first mass flow controller having a first set of operating characteristics. Finally, a second set of flow components are coupled to the flow component mounting regions of a second one of the monolithic bases so that a fluid path is formed from the gas inlet to the gas outlet of the second one of the monolithic bases to which each component of the second set of flow components is in fluid communication, thereby creating a second mass flow controller having a second set of operating characteristics that are different than the first set of operating characteristics.

In another implementation, the method of making mass flow controllers having different operating characteristics comprises providing a plurality of substantially identical monolithic bases, each of the monolithic bases comprising a gas inlet, a gas outlet, and a plurality of flow component mounting regions. The method further comprises coupling a first set of flow components to the flow component mounting regions of a first one of the monolithic bases, thereby creating a first mass flow controller having a first set of operating characteristics. Finally, a second set of flow components are coupled to the flow component mounting regions of a second one of the monolithic bases, thereby creating a second mass flow controller having a second set of operating characteristics that are different than the first set of operating characteristics.

In yet another implementation, the method comprises providing a plurality of substantially identical monolithic bases, each of the monolithic bases comprising a gas inlet, a gas outlet, and a plurality of flow component mounting regions. A first set of flow components are coupled to the flow component mounting regions of a first one of the monolithic bases. Lastly, a second set of flow components are coupled to the flow component mounting regions of a first one of the monolithic bases, wherein the first and second sets of flow components comprise different types of flow components.

In another implementation, the invention is a mass flow control apparatus having a monolithic base. The monolithic base has a gas inlet, a gas outlet, a first flow component mounting region, a second flow component mounting region, and a third flow component mounting region. The first flow component mounting region has a first inlet port and a first outlet port, the first inlet port being fluidly coupled to the gas inlet of the monolithic base. The second flow component mounting region has a second inlet port, a second outlet port, and a first auxiliary port.

In yet another implementation, the invention is a mass flow control apparatus having a monolithic base. The monolithic base has a gas inlet, a gas outlet, a first flow component mounting region, a second flow component mounting region, and a third flow component mounting region. A first valve is coupled to the first flow component mounting region. A cap component is coupled to one of the second or third flow component mounting regions. The first flow component region has a first inlet port and a first outlet port, the first inlet port being fluidly coupled to the gas inlet of the monolithic base. The second flow component mounting region comprises a second inlet port, a second outlet port, and a first auxiliary port.

In a further implementation, the invention is a mass flow control apparatus having a monolithic base. The monolithic base has a gas inlet, a gas outlet, a first flow component mounting region, a second flow component mounting region, and a third flow component mounting region. A first valve is coupled to the first flow component mounting region. A second valve is coupled to the second flow component mounting region. A third valve is coupled to the third flow component mounting region. The first flow component mounting region has a first inlet port fluidly coupled to the gas inlet of the monolithic base. The second flow component mounting region has a first auxiliary port. The third valve is fluidly coupled to the gas outlet of the monolithic base.

In one embodiment, the invention is a method of delivering a gas at a predetermined flow rate. A gas flow control apparatus is provided, the gas flow control apparatus having a gas flow path extending from a gas inlet to a gas outlet, a proportional valve coupled to the flow path, an on/off valve coupled to the flow path and downstream of the proportional valve, a volume of the gas flow path defined between the proportional valve and the on/off valve. A flow restrictor having a flow impedance is located downstream of the proportional valve. The volume of the apparatus is pressurized with the gas to a target pre-flow pressure by opening the proportional valve while the on/off valve is off, the target pre-flow pressure being selected to achieve the predetermined flow rate. Finally, the on/off valve is opened to deliver the gas to the gas outlet at the predetermined flow rate.

In another embodiment, the invention is a system for delivering a gas at a predetermined flow rate. The system has a gas flow control apparatus having a gas flow path extending from a gas inlet to a gas outlet, a proportional valve coupled to the flow path, an on/off valve coupled to the flow path and downstream of the proportional valve, a volume of the gas flow path defined between the proportional valve and the on/off valve. A flow restrictor having a flow impedance is located downstream of the proportional valve. A controller pressurizes the volume with the gas to a target pre-flow pressure by opening the proportional valve while the on/off valve is off, the target pre-flow pressure being selected to achieve the predetermined flow rate. Finally, the controller opens the on/off valve to deliver the gas to the gas outlet at the predetermined flow rate.

In yet another embodiment, the invention is a method of delivering gas at a predetermined flow rate. A controller generates a gas flow activation signal at a first time, the signal comprising data identifying a second time at which the gas is to be delivered from a gas outlet of a gas flow path at the predetermined flow rate. The first time is prior to the second time and a priming period is defined as the time between the first and second times. Upon receipt of the gas flow activation signal, the controller adjusts one or more components of a gas flow apparatus to achieve a primed condition of the gas in a volume of the gas flow path during the priming period, the priming period selected to achieve the predetermined flow rate. During the priming period, the gas is prohibited from exiting the gas outlet of the gas flow path. Finally, gas is delivered from the volume at the second time via the gas outlet of the gas flow path.

In another embodiment, the invention is a system for delivering a gas at a predetermined flow rate, the system having a gas flow path extending from a gas inlet to a gas outlet, one or more components configured to define a volume of the gas flow path and control flow of the gas through the gas flow path, and a controller. The controller is configured to generate a gas flow activation signal at a first time, the signal identifying a second time at which the gas is to be delivered from the gas outlet, the first time being prior to the second time and a priming period being defined between the first and second times. The controller is also configured to adjust the one or more components to achieve a primed condition of the gas in the volume during the priming period upon receipt of the gas flow activation signal, the primed condition selected to achieve the predetermined flow rate. The gas is prohibited from exiting the gas outlet of the gas flow path during the priming period. Finally, the controller is configured to adjust the one or more components to deliver the gas from the volume at the second time.

In a further embodiment, the invention is a method of delivering gas at a predetermined flow rate. The method involves priming, in a volume of a gas flow path and during a priming period, a gas to a primed condition, the primed condition selected to achieve the predetermined flow rate. The gas is prohibited from exiting a gas outlet of the gas flow path during the priming period. Second, gas is delivered from the volume subsequent to the priming period.

In one embodiment, the invention is a gas flow control system for delivering a plurality of gas flows. The gas flow control system includes a gas flow path extending from a gas inlet to a first gas outlet and a second gas outlet. A first on/off valve is operably coupled to the gas flow path and is located between the gas inlet and the first gas outlet. A second on/off valve is operably coupled to the gas flow path and located between the gas inlet and the second gas outlet. A first flow restrictor having a first flow impedance is operably coupled to the gas flow path and located between the gas inlet and the first gas outlet. A second flow restrictor having a second flow impedance is operably coupled to the gas flow path and located between the gas inlet and the second gas outlet. When both the first and second on/off valves are in a fully open state, a ratio between a first gas flow from the first gas outlet and a second gas flow from the second gas outlet is determined by a ratio of the first flow impedance and the second flow impedance.

In another embodiment, the invention is a gas flow control system for delivering a plurality of gas flows including a gas flow path extending from a gas inlet to a first gas outlet and a second gas outlet. A first valve is operably coupled to the gas flow path and located between the gas inlet and the first gas outlet. A second valve is operably coupled to the gas flow path and located between the gas inlet and the second gas outlet. A first flow restrictor having a first flow impedance is operably coupled to the gas flow path and located between the gas inlet and the first gas outlet. A second flow restrictor having a second flow impedance is operably coupled to the gas flow path and located between the gas inlet and the second gas outlet.

In yet another embodiment, the invention is a method of delivering a process gas. The method includes providing a gas flow apparatus having a gas flow path extending from a gas inlet to a first gas outlet and a second gas outlet, a first valve operably coupled to the gas flow path and located between the gas inlet and the first gas outlet, a second valve operably coupled to the gas flow path and located between the gas inlet and the second gas outlet, a first flow restrictor having a first flow impedance operably coupled to the gas flow path and located between the gas inlet and the first gas outlet, and a second flow restrictor having a second flow impedance operably coupled to the gas flow path and located between the gas inlet and the second gas outlet. The first valve is transitioned to a fully open state and the second valve to a fully closed state to deliver a first controlled flow of process gas to the first gas outlet. Subsequently, the second valve is transitioned to a fully open state and the first valve to a fully closed state to deliver a second controlled flow of process gas to the second gas outlet. Finally, the first valve is transitioned to a fully open state to deliver the first controlled flow of process gas to the first gas outlet simultaneously with delivering the second controlled flow of process gas to the second gas outlet.

In one implementation, the invention is a flow restrictor for restricting the flow of a gas. The flow restrictor has a first end, a second end, and a longitudinal axis extending from the first end to the second end. A plurality of first layers extend from the first end to the second end along the longitudinal axis. A plurality of second layers extend from the first end to the second end along the longitudinal axis. A first aperture at the first end is defined by the plurality of first layers and the plurality of second layers. A second aperture at the second end is defined by the plurality of first layers and the plurality of second layers. A flow passage is defined by the plurality of first layers and the plurality of second layers, the flow passage extending from the first aperture to the second aperture.

In another implementation, the invention is a mass flow control apparatus for delivery of a fluid, the mass flow control apparatus having a valve comprising an inlet passage, an outlet passage, a valve seat, and a closure member. The mass flow control apparatus also has a flow restrictor, the flow restrictor positioned in one of the inlet passage or the outlet passage. The flow restrictor has a first end, a second end, and a longitudinal axis extending from the first end to the second end. A plurality of layers extend substantially parallel to the longitudinal axis. A first aperture is located at the first end and a second aperture is located at the second end. A flow passage is defined by the plurality of layers, the flow passage fluidly coupled to the first aperture and the second aperture.

In yet another implementation, the invention is a method of manufacturing a flow restrictor. First, a plurality of layer blanks are provided, the layer blanks having a first edge, a second edge opposite the first edge, a third edge, a fourth edge opposite the third edge, a front face, and a rear face opposite the front face. A first cavity is formed in the front face of a first one of the plurality of layer blanks. The plurality of layer blanks are stacked. Subsequently, the plurality of layer blanks are bonded to form a resistor stack having a first unfinished end and an opposite second unfinished end. The first unfinished end of the resistor stack is formed by the first edges of the plurality of layer blanks and the second unfinished end of the resistor stack is formed by the second edges of the plurality of layer blanks. Finally, material is removed from the first unfinished end of the layer stack to expose the first cavity and form a first aperture.

In one implementation, the invention is a seal for a gas flow restrictor, the seal having a first end, a second end, and an aperture for receiving the flow restrictor to form a fluid tight connection between the flow restrictor and the seal.

In another implementation, the invention is a valve assembly, the valve assembly having a valve, a flow restrictor, and a seal. The valve has a passage. The flow restrictor has a first end, a second end, a longitudinal axis extending from the first end to the second end, and a sealing portion located between the first end and the second end along the longitudinal axis. The seal is in contact with the sealing portion of the flow restrictor and the passage of the valve.

In yet a further implementation, the invention is a valve assembly, the valve assembly having a valve, the valve having a first passage, a second passage, a first sealing recess, and a second recess. The valve assembly has a base having a third sealing recess and a fourth sealing recess. The valve assembly has a flow restrictor, the flow restrictor having a first end, a second end, a longitudinal axis extending from the first end to the second end, and a surface of the flow restrictor located between the first end and the second end along the longitudinal axis. Finally, the valve assembly has a seal in contact with the surface of the flow restrictor and the first sealing recess of the valve.

In yet another embodiment, the invention is a mass flow control apparatus having a monolithic base, the monolithic base having a gas inlet, a gas outlet, a first flow component mounting region, a second flow component mounting region, and a third flow component mounting region. The first flow component mounting region has a first inlet port and a first outlet port, the first inlet port fluidly coupled to the gas inlet of the monolithic base. The third flow component mounting region has a first sensing port fluidly coupled to the gas outlet of the monolithic base.

In a further embodiment, the invention is a mass flow control apparatus having a monolithic base, the monolithic base comprising a gas inlet, a gas outlet, a first flow component mounting region, a second flow component mounting region, and a third flow component mounting region. A first valve is coupled to the first flow component mounting region. A cap component is coupled to the second flow component mounting region. A second valve is fluidly coupled to the third flow component mounting region. The first flow component mounting region comprises a first inlet port and a first outlet port, the first inlet port fluidly coupled to the gas inlet of the monolithic base.

In another embodiment, the invention is a gas flow control system for delivering a gas a predetermined flow rate, the gas flow control system having a gas flow path extending from a gas inlet to a gas outlet. A proportional valve is operably coupled to the gas flow path. An on/off valve is operably coupled to the gas flow path downstream of the proportional valve, a volume of the gas flow path being defined between the proportional valve and the on/off valve. A flow restrictor having a flow impedance is located downstream of the proportional valve. A bleed valve is operably coupled to the volume of the gas flow path. Finally, a controller is configured to 1) pressurize the volume with the gas to a target pre-flow pressure by opening the proportional valve while the on/off valve is in an off-state, the target pre-flow pressure selected to achieve a predetermined flow rate, 2) open the bleed valve by moving the bleed valve to an on-state and flow the gas at the predetermined flow rate through the bleed valve, and 3) simultaneously open the on/off valve by moving the on/off valve to an on-state and close the bleed valve by moving the bleed valve to an off-state to deliver the gas to the gas outlet at the predetermined flow rate.

In yet another embodiment, the invention is a flow restrictor for restricting the flow of a gas, the flow restrictor having a first end, a second end, and a longitudinal axis extending from the first end to the second end. A plurality of layers extend from the first end to the second end along the longitudinal axis. A first aperture is located at the first end and is defined by the plurality of layers. A second aperture is located at the second end and is defined by the plurality of layers. A flow passage is defined by the plurality of layers, the flow passage extending from the first aperture to the second aperture.

In a further embodiment, the invention is a flow restrictor assembly including a flow restrictor and a seal. The flow restrictor has a first end, a second end, a longitudinal axis extending from the first end to the second end, and a sealing portion located between the first end and the second end along the longitudinal axis. The seal is in contact with the sealing portion of the flow restrictor.

In another embodiment, the invention is a gas flow control system for delivering a plurality of gas flows, the system including a gas flow path extending from a gas inlet to a first gas outlet and a second gas outlet. The system further includes a first proportional valve operably coupled to the gas flow path and a first on/off valve operably coupled to the gas flow path and located between the first proportional valve and the first gas outlet. Furthermore, the system includes a first flow restrictor having a first flow impedance operably coupled to the gas flow path and located between the first proportional valve and the first gas outlet and a second flow restrictor having a second flow impedance operably coupled to the gas flow path and located between the first proportional valve and the second gas outlet. When both the first proportional valve and the first on/off valve are in a fully open state, a ratio between a first gas flow from the first gas outlet and a second gas flow from the second gas outlet is determined by a ratio of the first flow impedance and the second flow impedance.

In yet another embodiment, the invention is a gas flow control system for delivering a plurality of gas flows, the system including a gas flow path extending from a gas inlet to a first gas outlet and a second gas outlet. A first valve is operably coupled to the gas flow path and located between the gas inlet and the first gas outlet. A second valve is operably coupled to the gas flow path and located between the gas inlet and the second gas outlet. A first flow restrictor having a first flow impedance is operably coupled to the gas flow path. A second flow restrictor having a second flow impedance is operably coupled to the gas flow path. When both the first valve and the second valve are in a fully open state, a ratio between a first gas flow from the first gas outlet and a second gas flow from the second gas outlet is determined by a ratio of the first flow impedance and the second flow impedance.

In another embodiment, the invention is a method of delivering a process gas. In a first step, a gas flow apparatus is provided, the gas flow apparatus having a gas flow path extending from a gas inlet to a first gas outlet and a second gas outlet, a first valve operably coupled to the gas flow path and located between the gas inlet and the first gas outlet, a second valve operably coupled to the gas flow path and located between the gas inlet and the second gas outlet, a first flow restrictor having a first flow impedance operably coupled to the gas flow path and located between the gas inlet and the first gas outlet, and a second flow restrictor having a second flow impedance operably coupled to the gas flow path and located between the gas inlet and the second gas outlet. In a second step, the first valve is transitioned to a partially open state and a first controlled flow of process gas is delivered to the first gas outlet. In a third step, the second valve is transitioned to a fully open state and a second controlled flow of process gas is delivered to the second gas outlet.

Further areas of applicability of the present technology will become apparent from the detailed description provided hereinafter. It should be understood that the detailed description and specific examples, while indicating the preferred implementation, are intended for purposes of illustration only and are not intended to limit the scope of the technology.

BRIEF DESCRIPTION OF THE DRAWINGS

The invention of the present disclosure will become more fully understood from the detailed description and the accompanying drawings, wherein:

FIG. 52B is a detail view of the area LIIB of FIG. 52A.

FIG. 55 is a top view a first layer of the flow restrictor of FIG. 50.

FIG. 56 is a top view a second layer of the flow restrictor of FIG. 50.

FIG. 67 is a top view of a first layer of the flow restrictor of FIG. 63.

FIG. 68 is a top view of a second layer of the flow restrictor of FIG. 63.

FIG. 69 is a top view of a third layer of the flow restrictor of FIG. 63.

DETAILED DESCRIPTION

Figure 1:
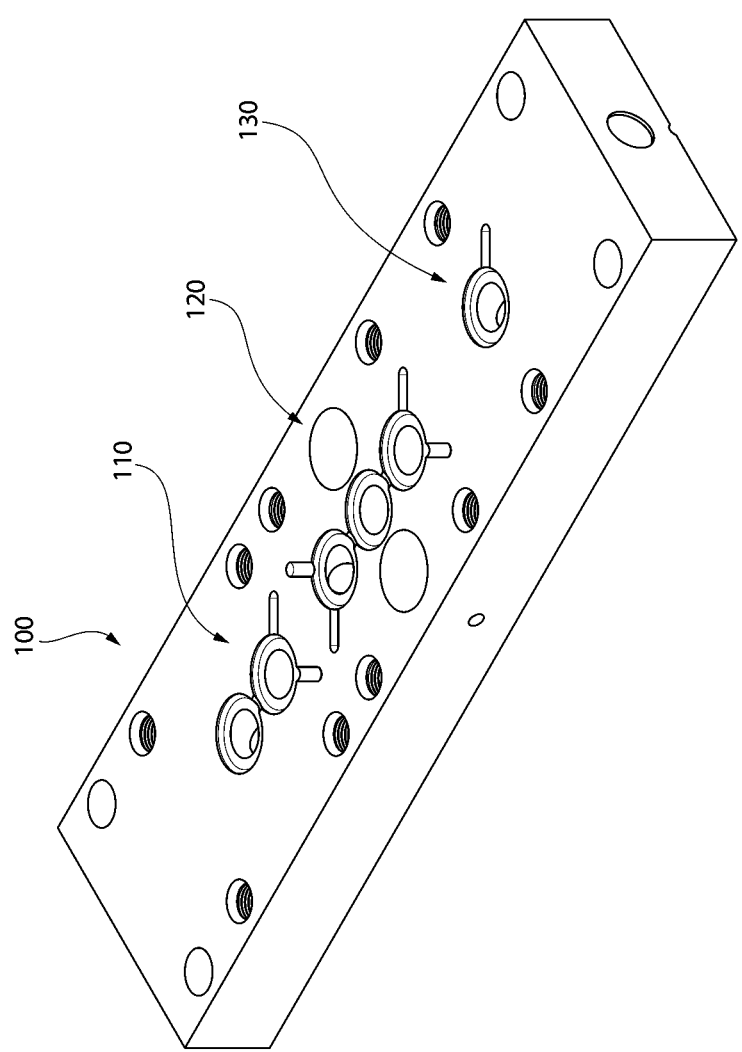
FIG. 1 is a perspective view of a first embodiment of the monolithic base.
Figure 2:
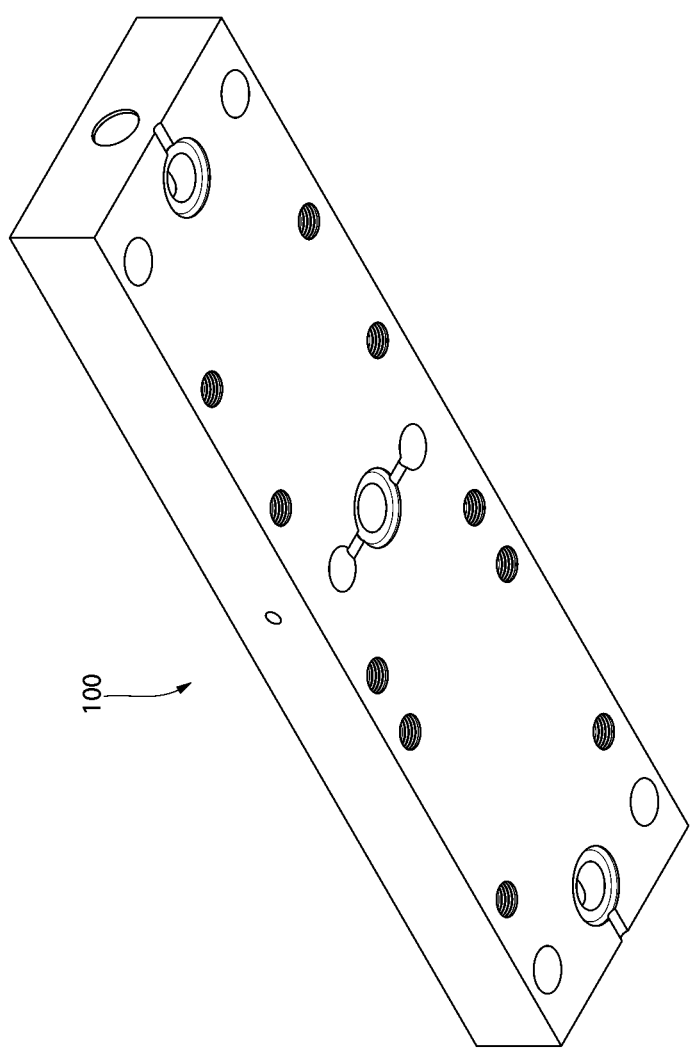
FIG. 2 is a lower perspective view of the monolithic base of FIG. 1.
Figure 3:
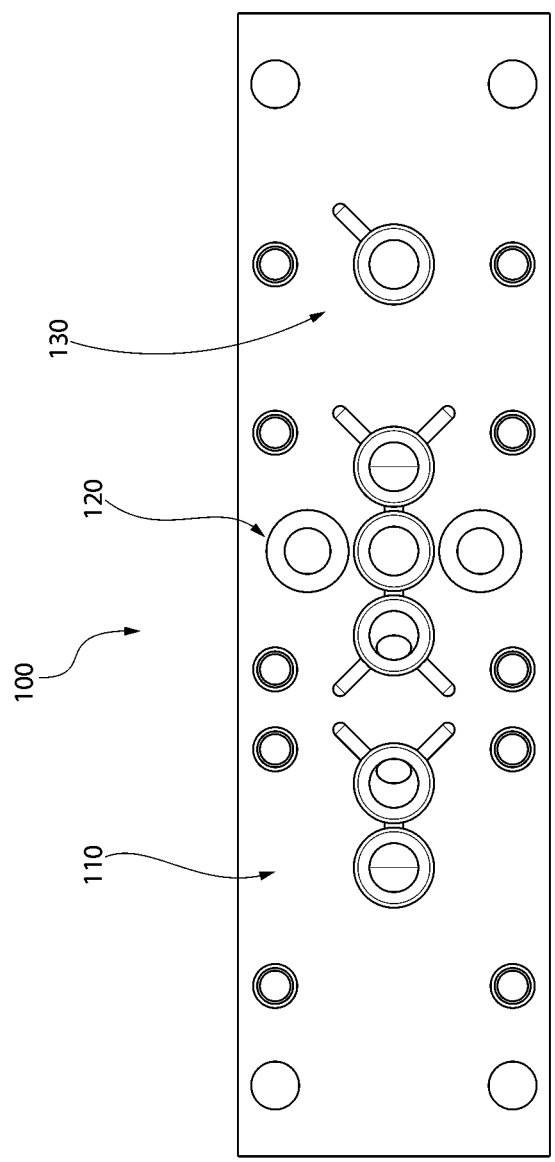
FIG. 3 is a top view of the monolithic base of FIG. 1.
Figure 4:
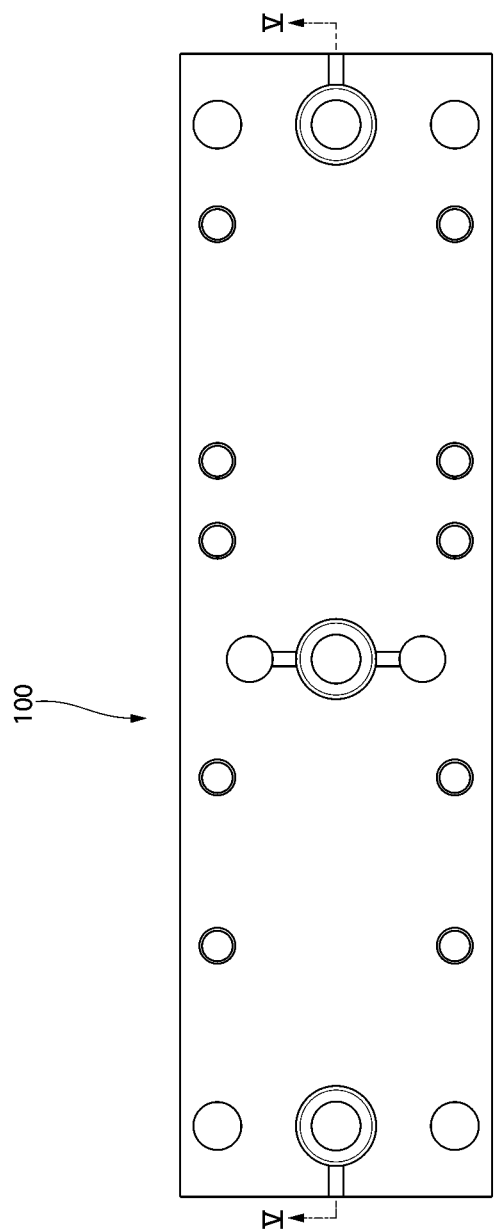
FIG. 4 is a bottom view of the monolithic base of FIG. 1.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combinations of features that may exist alone or in other combinations of features; the scope of the invention being defined by the claims appended hereto.

The disclosure is divided into four sections. Section I discusses a modular method of making mass flow controllers. Section II discusses a method of improving the transient turn on performance of pressure based apparatuses for controlling mass flow. Section III discusses an apparatus for splitting a flow of process gas into two individual flows of process gas having a known ratio. Section IV discusses laminar flow restrictors for use in an apparatus for controlling gas flow. Section V discusses seals for laminar flow restrictors for use in an apparatus for controlling gas flow. Different embodiments disclosed in the respective sections can be used together as part of a gas delivery apparatus, method, or system. To the extent a term, reference number, or symbol is used differently in different sections, context should be taken from the relevant section and not the other sections.

Section I

The present invention is directed to a modular method of making mass flow controllers which reduces total system cost and time to production. Customers require a variety of mass flow controllers within a single semiconductor process to permit them to apply a diverse array of gases in a wide range of mass flow rates. In an effort to accommodate this need, manufacturers of mass flow control equipment have designed mass flow controllers with a variety of component configurations to achieve specific operating characteristics. This often requires different component configurations. Due to the limited space available for mass flow controllers, a custom configuration for the mounting base is typically required. This is often accomplished through a plurality of mounting base components which are assembled to meet particular needs. Alternately, a custom mounting base may be fabricated which is unitary and incorporates all of the necessary ports and passages required for the mass flow controller currently being manufactured. However, due to the wide variation in operating characteristics required in a product line, the mounting bases are customized for the specific application and desired operating characteristics.

FIG. 1 shows a perspective view of a first embodiment of a monolithic base 100 according to the present invention. FIGS. 2-5 show the monolithic base in greater detail. The monolithic base 100 has a plurality of flow component mounting regions where flow components may be mounted. The plurality of flow component mounting regions include a first flow component mounting region 110, a second flow component mounting region 120, and a third flow component mounting region 130. In the present embodiment of the monolithic base 100, the first flow component mounting region 110 and the second flow component mounting region 120 are both capable of being used as multi-function ports which may incorporate a variety of flow components. In contrast, the third flow component mounting region 130 is a sensing port intended to accept a pressure transducer component.

Figure 5:
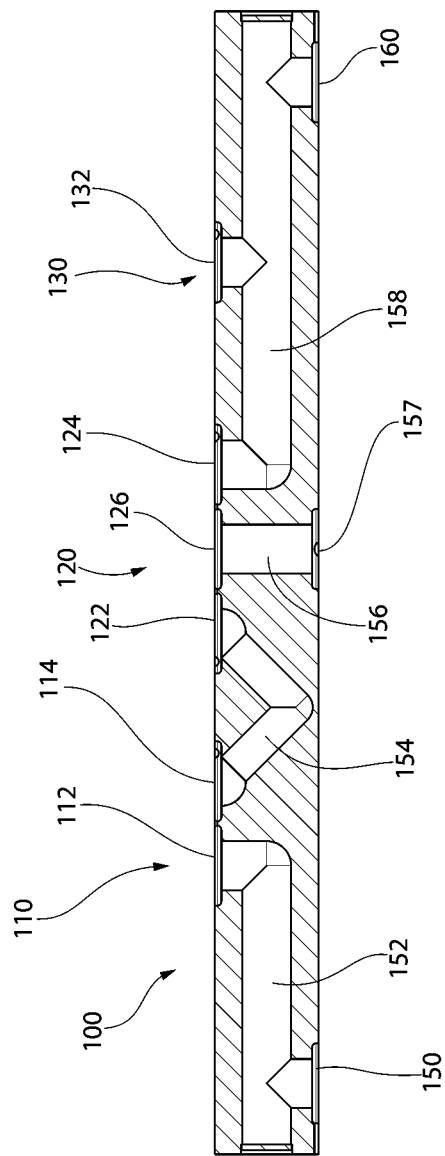
FIG. 5 is a cross sectional view taken along the line V-V of FIG. 4.

Turning to FIG. 5, a cross section of the monolithic base 100 is shown. A gas inlet 150 is located on the lower left side of the monolithic base 100. When the completed mass flow controller is installed in process machinery, process gas is supplied to the gas inlet 150. It then flows downstream to the first flow component mounting region 110. The first flow component mounting region 110 has an inlet port 112 that is directly connected to the gas inlet 150 by a first flow passage 152. The first flow component region 110 also has an outlet port 114 that is not fluidly connected to the inlet port 112.

The outlet port 114 of the first flow component mounting region 110 is fluidly connected to an inlet port 122 of the second flow component mounting region 120 by a second flow passage 154. The second flow component mounting region 120 also contains an outlet port 124 and an auxiliary port 126. The auxiliary port 126 feeds an auxiliary passage 156 which has a gas vent 157 located on the underside of the monolithic base 100. The outlet port 124 of the second flow component mounting region 120 is fluidly connected by a third flow passage 158 to a gas outlet 160 located underneath the right side of the monolithic base 100. The third flow component mounting region 130 also has a sensing port 132 that is also connected to the third flow passage 158 so that a device attached to the third flow component mounting region 130 can sense the pressure within the third flow passage 158.

Figure 6:
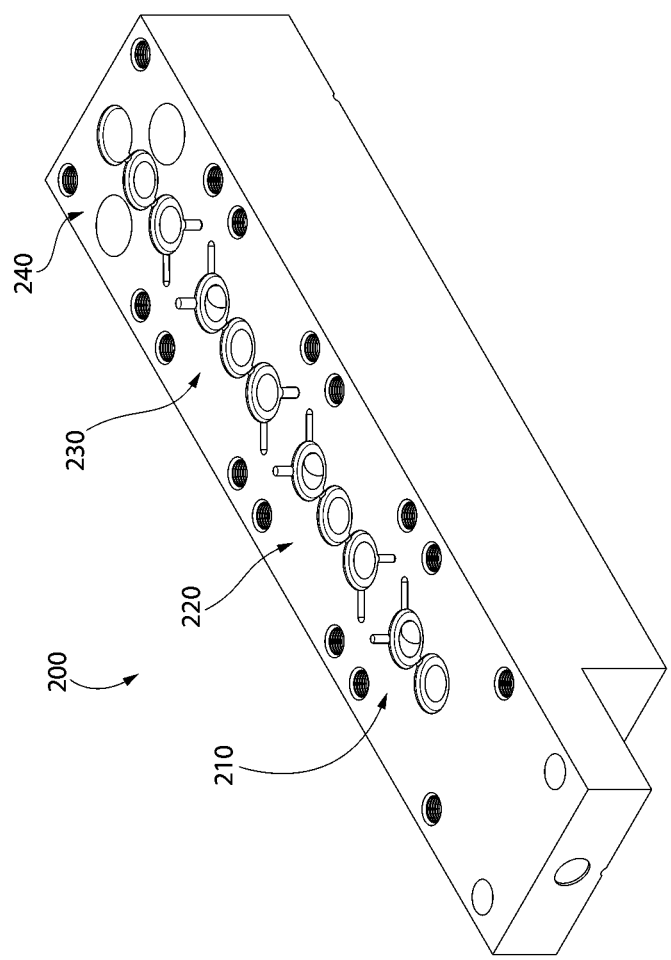
FIG. 6 is a perspective view of a second embodiment of the monolithic base.
Figure 7:
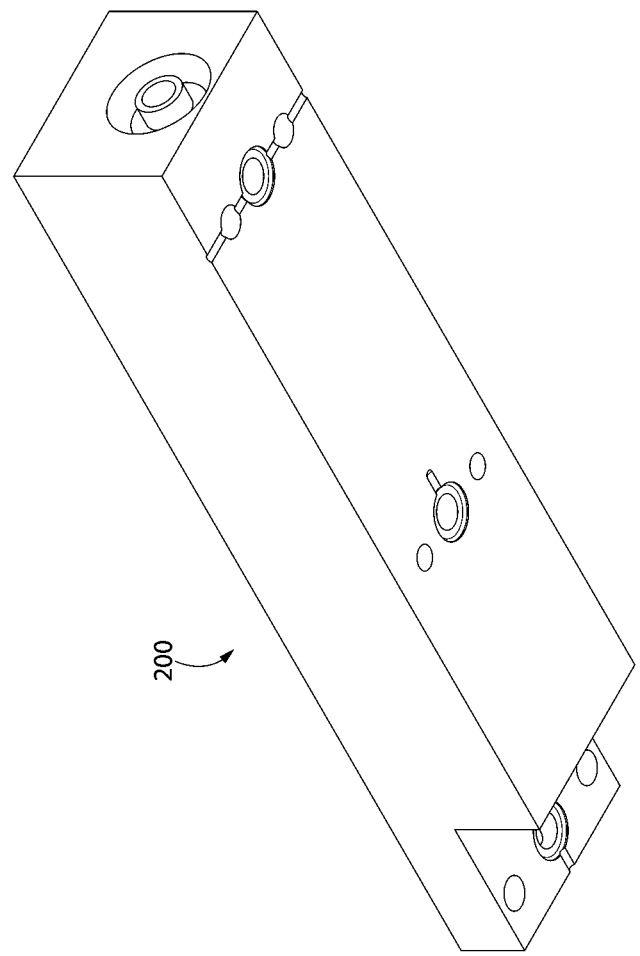
FIG. 7 is a lower perspective view of the monolithic base of FIG. 6.
Figure 8:
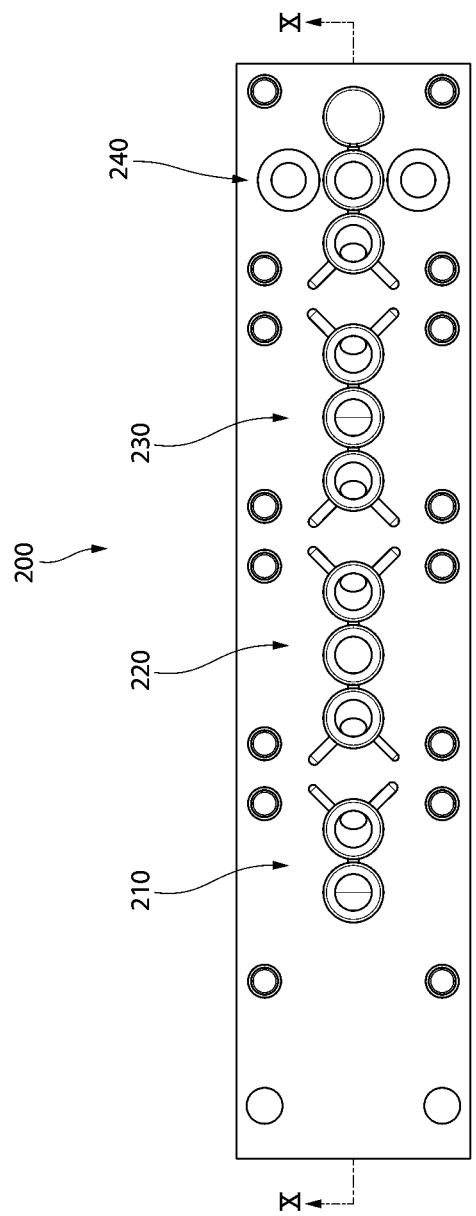
FIG. 8 is a top view of the monolithic base of FIG. 6.
Figure 9:
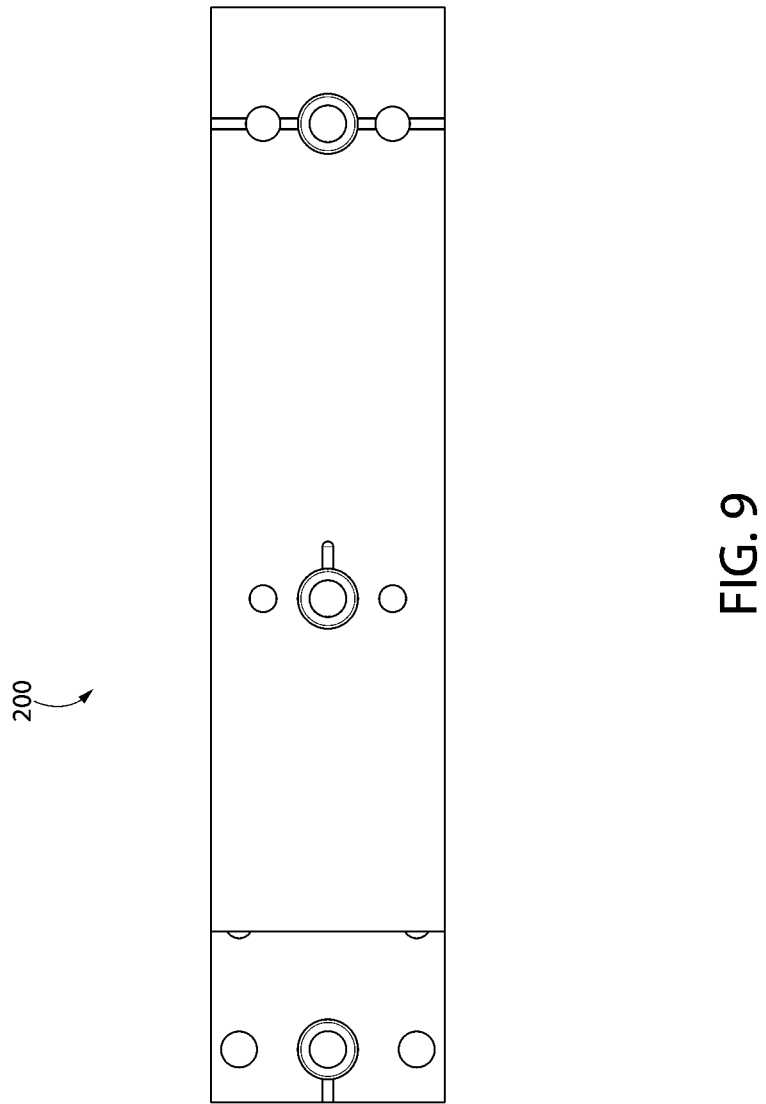
FIG. 9 is a bottom view of the monolithic base of FIG. 6.
Figure 10:
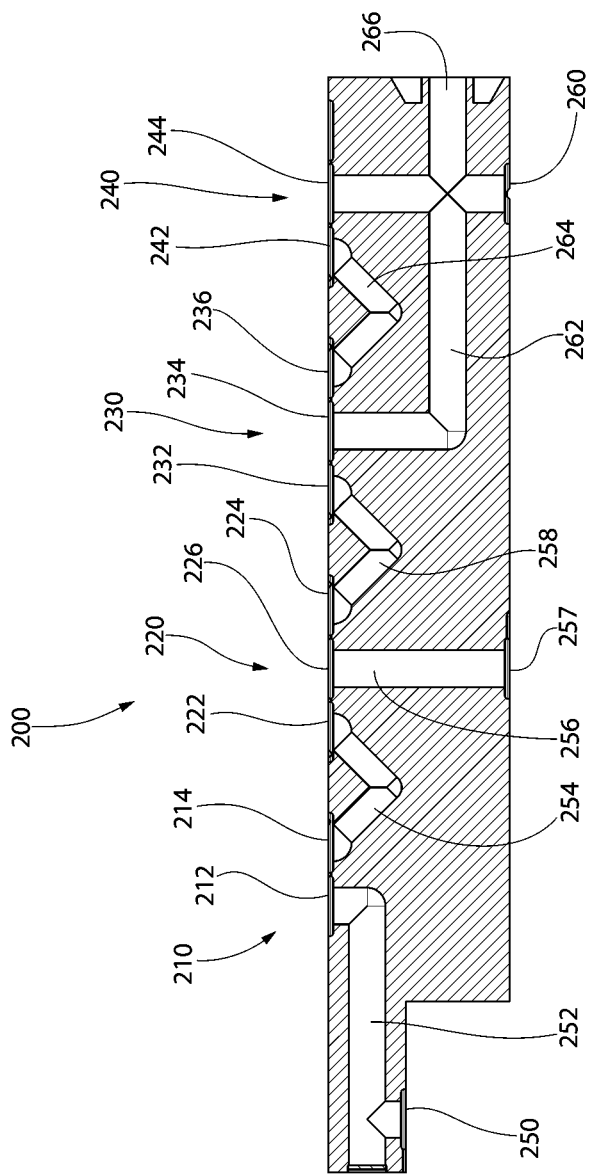
FIG. 10 is a cross sectional view taken along the line X-X of FIG. 8.

FIGS. 6-10 show a second embodiment of the monolithic base 200. This embodiment is formed with a greater thickness so that there is adequate room to provide for additional flow passages and a greater number of flow component mounting regions. As best seen in FIG. 6, the monolithic base 200 has a first flow component mounting region 210, a second flow component mounting region 220, a third flow component mounting region 230, and a fourth flow component mounting region 240. Turning to FIG. 10, a cross section of the monolithic base 200 is provided to better show the internal configuration.

The first flow component mounting region 210 has an inlet port 212 and an outlet port 214. The second flow component mounting region 220 has an inlet port 222, an outlet port 224, and an auxiliary port 226. The third flow component mounting region 230 has an inlet port 232, an outlet port 234, and an auxiliary port 236. The fourth flow component mounting region 240 has an inlet port 242 and an outlet port 244.

Similar to the monolithic base 100 discussed above, process gas is supplied to a mass flow controller at the gas inlet 250 located on the underside of the monolithic base 200. The process gas then flows through a first flow passage 252 to the inlet port 212 of the first flow component mounting region. The outlet port 214 of the first flow component mounting region 210 is connected by a second flow passage 254 to the inlet port 222 of the second flow component mounting region 220. The auxiliary port 226 of the second flow component mounting region 220 also connects to an auxiliary passage 256 which rims between the auxiliary port 226 and a gas vent 257 located on the underside of the monolithic base 200. The outlet port 224 of the second flow component mounting region 220 is connected to the inlet port 232 of the third flow component mounting region 230 by a third flow passage 258.

However, unlike the second flow component mounting region 220, the auxiliary port 236 of the third flow component mounting region 230 is located to the right of the outlet port 234. The outlet port 234 of the third flow component mounting region 230 is connected to a gas outlet 260 located on the underside of the monolithic base 200 by the fourth flow passage 262. The fourth flow passage 262 also connects the outlet port 244 of the fourth flow component mounting region 240 to the gas outlet 260. Finally, the auxiliary port 236 of the third flow component mounting region 230 is connected to the inlet port 242 of the fourth flow component mounting region 240 by a fifth flow passage 264. An accessory port 266 is located at the rightmost end of the monolithic base 200, and may be plugged or welded if the design does not require it. Alternately, the accessory port 266 may be used to attach a pressure transducer component or other flow component.

Figure 11:
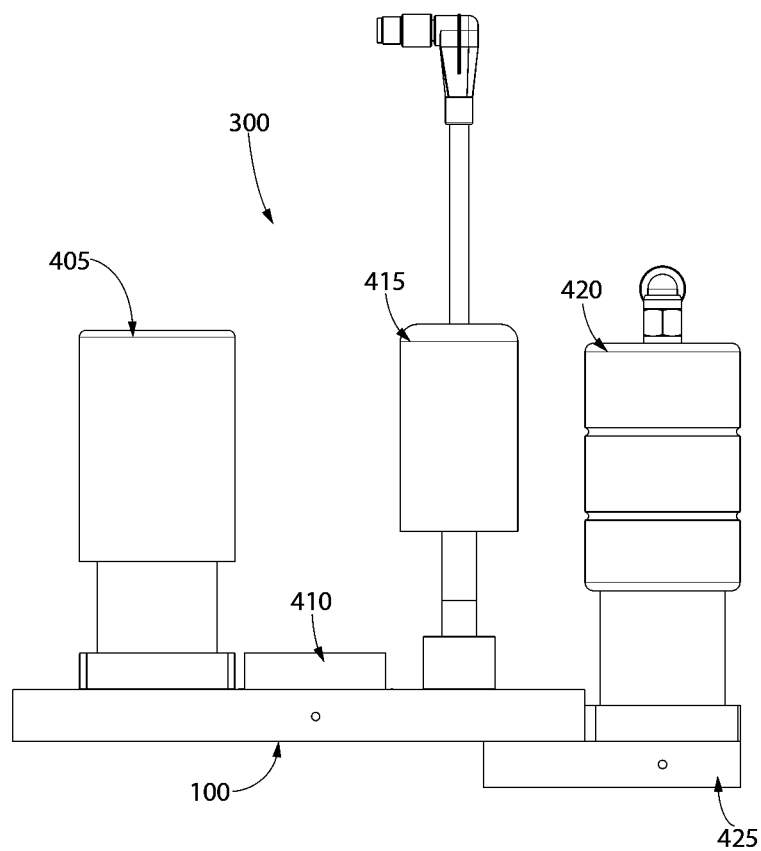
FIG. 11 is a side view of a mass flow controller in accordance with a first embodiment.
Figure 12:
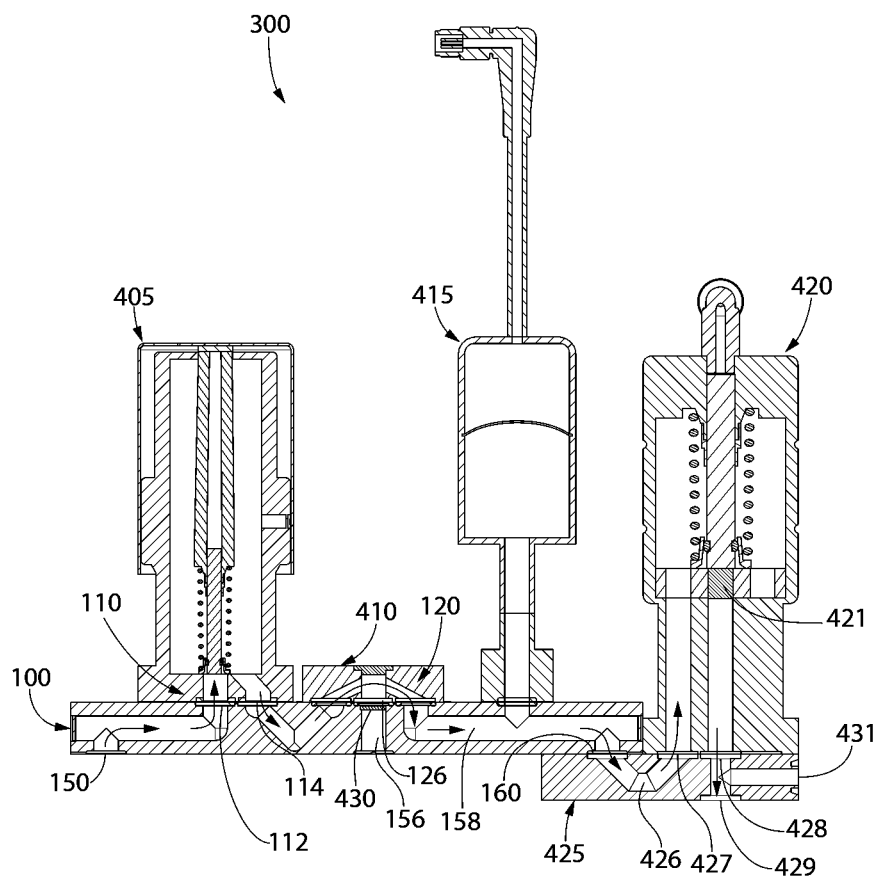
FIG. 12 is a cross sectional view of the mass flow controller of FIG. 11 illustrating the ports and flow passages.

FIGS. 11 and 12 show a first embodiment of a mass flow controller 300 incorporating the monolithic base 100 discussed above. The mass flow controller 300 also comprises a control valve component 405, a cap component 410, a pressure transducer component 415, a laminar flow component 420, and a substrate block 425. In this embodiment, the mass flow controller may be sized to provide a desired flow rate by selecting a laminar flow component 420 having an appropriately sized restrictor 421. The restrictor 421 may be selected so as to change the range of mass flow rates that the mass flow controller 300 may supply. The restrictor 421 may be formed as a porous block, a device having small orifices or channels, or any other means of providing a restriction to process gas flow that is consistent and repeatable across a target dynamic operating range of mass flow rates. The restrictor 421 has a greater resistance to flow than the passages upstream and downstream of the restrictor 421.

The flow path of the process gas is indicated by arrows which illustrate the path that the process gas takes through the mass flow controller 300. The process gas provided at the gas inlet 150 is supplied to the inlet port 112 of the first flow component mounting region 110. The inlet port 112 is fluidly coupled to the control valve component 405. The control valve component 405 meters the amount of process gas which passes to the outlet port 114. The control valve component 405 is capable of providing proportional control of the process gas such that it need not be fully open or closed, but instead may have intermediate states to permit control of the mass flow rate of process gas. After the control valve component 405, process gas passes through the cap component 410. The cap component 410 which has a passage formed therein to permit unrestricted flow of the gas from the inlet port 122 to the outlet port 124 at the second flow component mounting region 120. The auxiliary port 126 is blocked off by a blocking seal 430 which prevents process gas from flowing into the auxiliary passage 156. The cap component 410 also has a port for coupling a pressure transducer component 415 if desired. In the present embodiment, the top port on the cap component 410 is plugged because only one pressure transducer component 415 is required.

Process gas then flows from the outlet port 124 of the second component mounting region 120 through the third flow passage 158 to the gas outlet 160. The pressure transducer component 415 is coupled to the third flow component mounting region 130. The pressure transducer 415 samples the pressure of the process gas in the third flow passage 158. The process gas then flows into the substrate block 425 through a first substrate flow passage 426 to a substrate block inlet port 427. The laminar flow component 420 is coupled to the substrate block 425. The substrate block 425 is typically preinstalled on a customer's process equipment, and generally has a standardized arrangement of ports.

Process gas then flows through the laminar flow component 420, past the restrictor 421, and through the substrate block outlet port 428. The laminar flow component 420 incorporates an on/off valve component integrally within the laminar flow component 420 to permit complete shutoff of process gas flow. The substrate gas outlet 429 is connected to a process manifold external to the mass flow controller 300. The substrate block 425 further comprises an accessory port 431 which may be plugged or welded if not required. Alternately, another pressure transducer component 415 may be attached to the accessory port 431.

Figure 13:
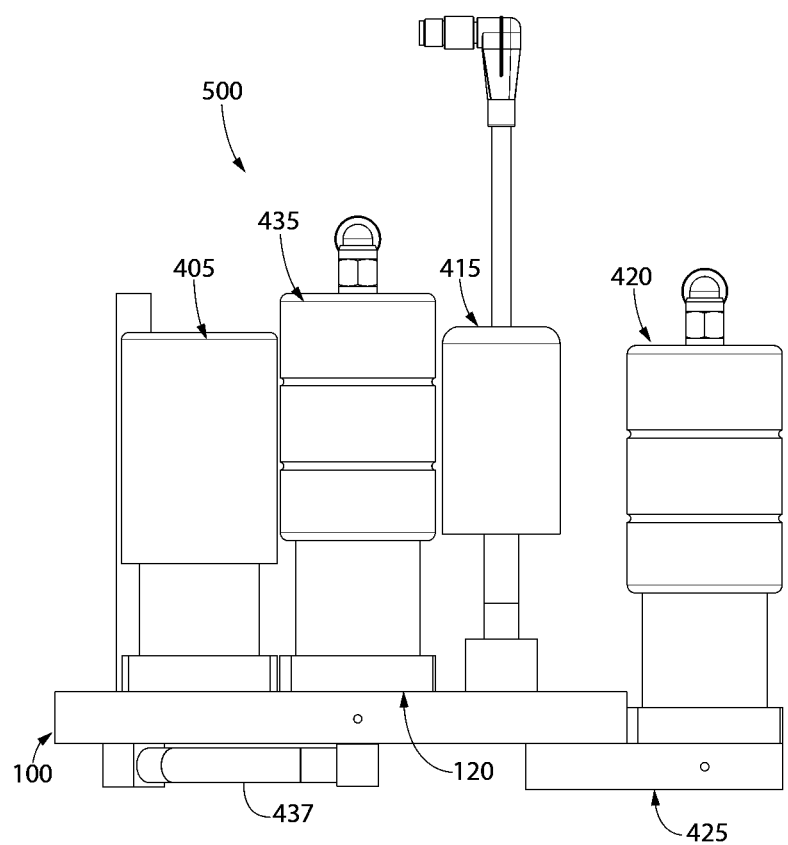
FIG. 13 is a side view of a mass flow controller in accordance with a second embodiment.
Figure 14:
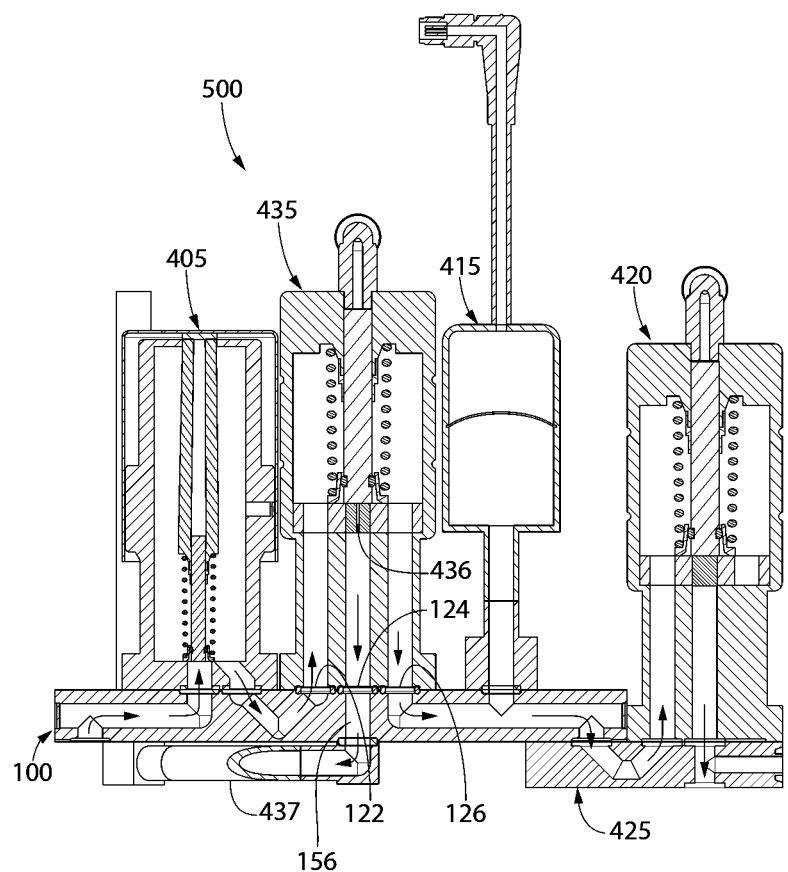
FIG. 14 is a cross sectional view of the mass flow controller of FIG. 13 illustrating the ports and flow passages.

Turning to FIGS. 13 and 14, a second embodiment of a mass flow controller 500 is shown. This mass flow controller is optimized for extremely low mass flow rates, and comprises a monolithic base 100, a control valve component 405, a bleed component 435, a pressure transducer component 415, a laminar flow component 420, and a substrate block 425. The control valve component 405, pressure transducer component 415, the laminar flow component 420, and the substrate block 425 are equivalent to those disclosed in the mass flow controller 300.

The bleed component 435 is mounted in the second component mounting region 120 and is operatively connected to the inlet port 122, outlet port 124, and auxiliary port 126. The bleed component 435 incorporates an orifice 436 which is sized to permit a desired amount of process gas to pass through the orifice 436 and the auxiliary port 126. The bleed component 435 also incorporates an on/off valve component to enable selective activation of the bleed functionality. The orifice 436 may be formed as one or more holes, a porous element, or any other means of providing a calibrated restriction to gas flow. When the bleed component 435 is activated, process gas is bled through the orifice 436 and passes into the auxiliary passage 156 to the bleed conduit 437. The bleed conduit 437 is directed to a process vacuum system for recovering and disposing of process gases. The bleed component 435 allows the mass flow controller 500 to have greatly increased accuracy and control at low mass flow rates where the control valve component 405 is unable to effectively control flow. Instead of exclusively relying on the control valve component 405 to meter process gas, the bleed component 435 allows additional control over the process gas which passes through the mass flow controller 500.

Figure 15:
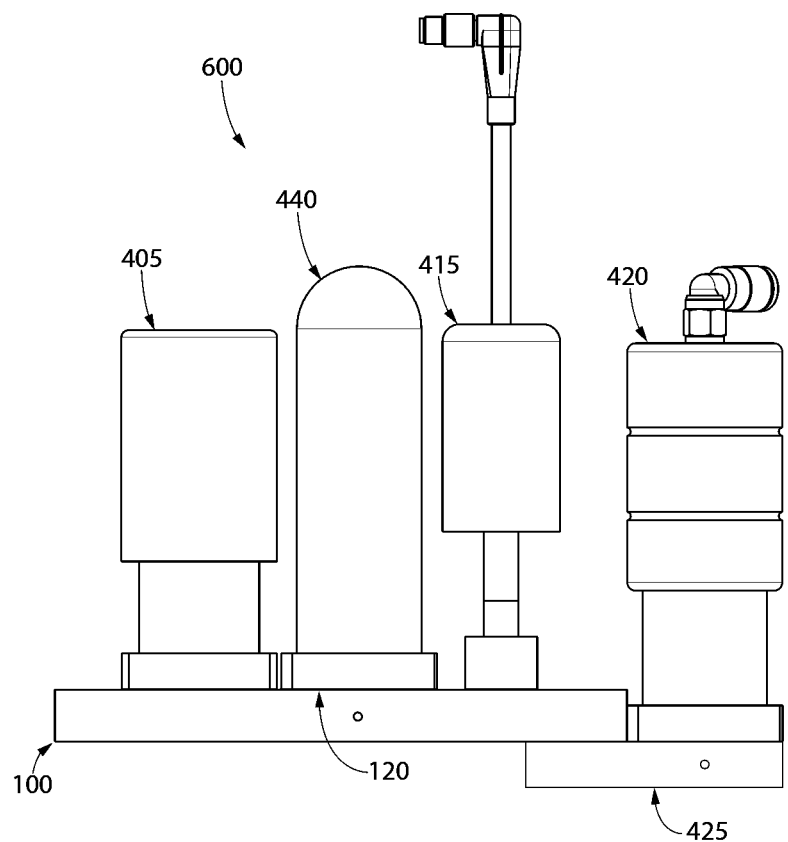
FIG. 15 is a side view of a mass flow controller in accordance with a third embodiment.
Figure 16:
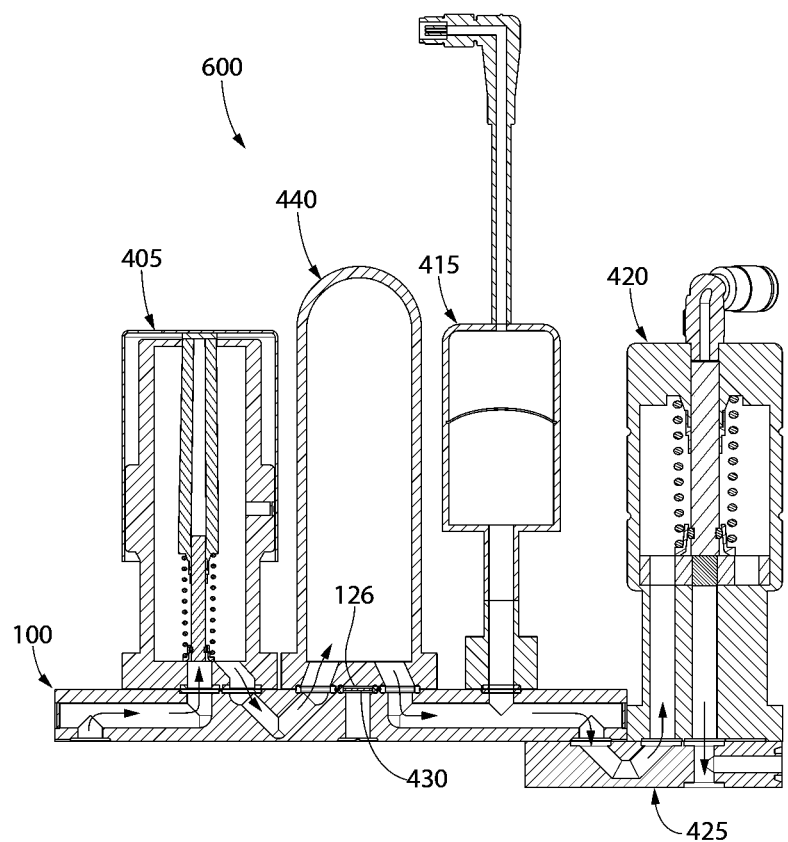
FIG. 16 is a cross sectional view of the mass flow controller of FIG. 15 illustrating the ports and flow passages.

The mass flow controller 600 of FIGS. 15 and 16 is designed to provide an exceptionally stable flow of process gas. This is accomplished by combining a monolithic base 100 with a control valve component 405, a volumetric expander component 440, a pressure transducer 415, a laminar flow component 420, and a substrate block 425. As with the mass flow controllers 300, 500 discussed above, the mass flow controller 600 incorporates the control valve component 405, pressure transducer 415, laminar flow component 420, and substrate block 425 and these components serve the same purpose. However, in place of the bleed component 435, the volumetric expander component 440 is fitted to provide a known volume to dampen pressure pulses in the process gas. The volumetric expander component 440 increases the stability of the mass flow rate. The auxiliary port 126 of the second flow component mounting region 120 is not connected to the volumetric expander component 440. Instead, a blocking seal 430 is provided on the auxiliary port 126 to ensure that no gas flow can occur.

Figure 17:
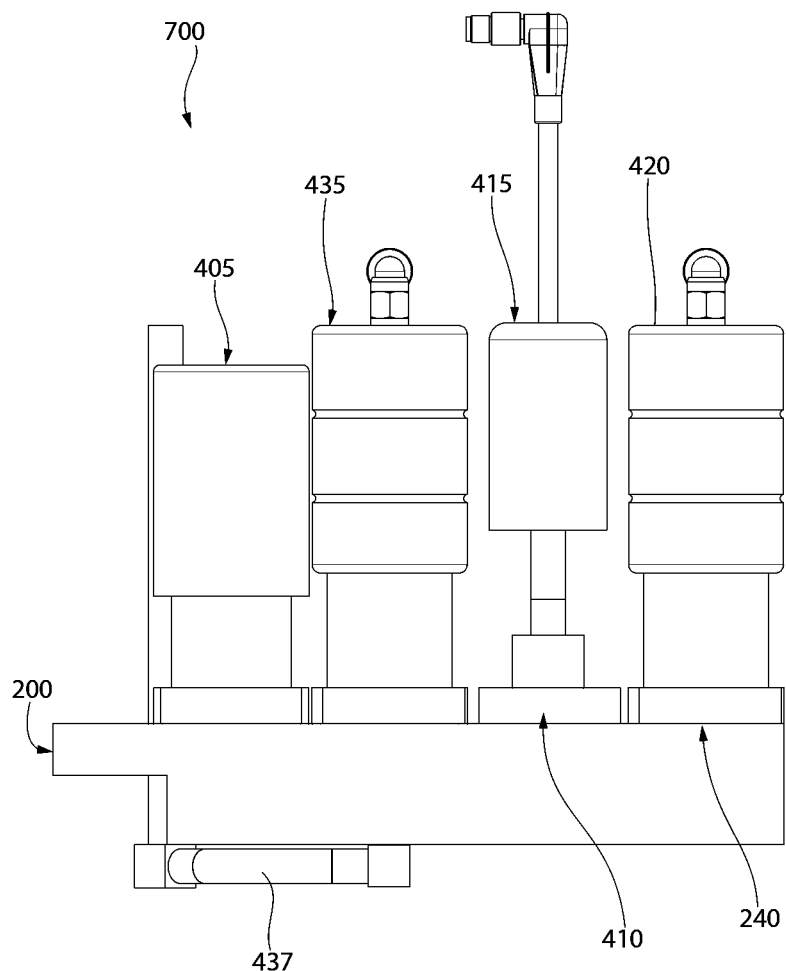
FIG. 17 is a side view of a mass flow controller in accordance with a fourth embodiment.
Figure 18:
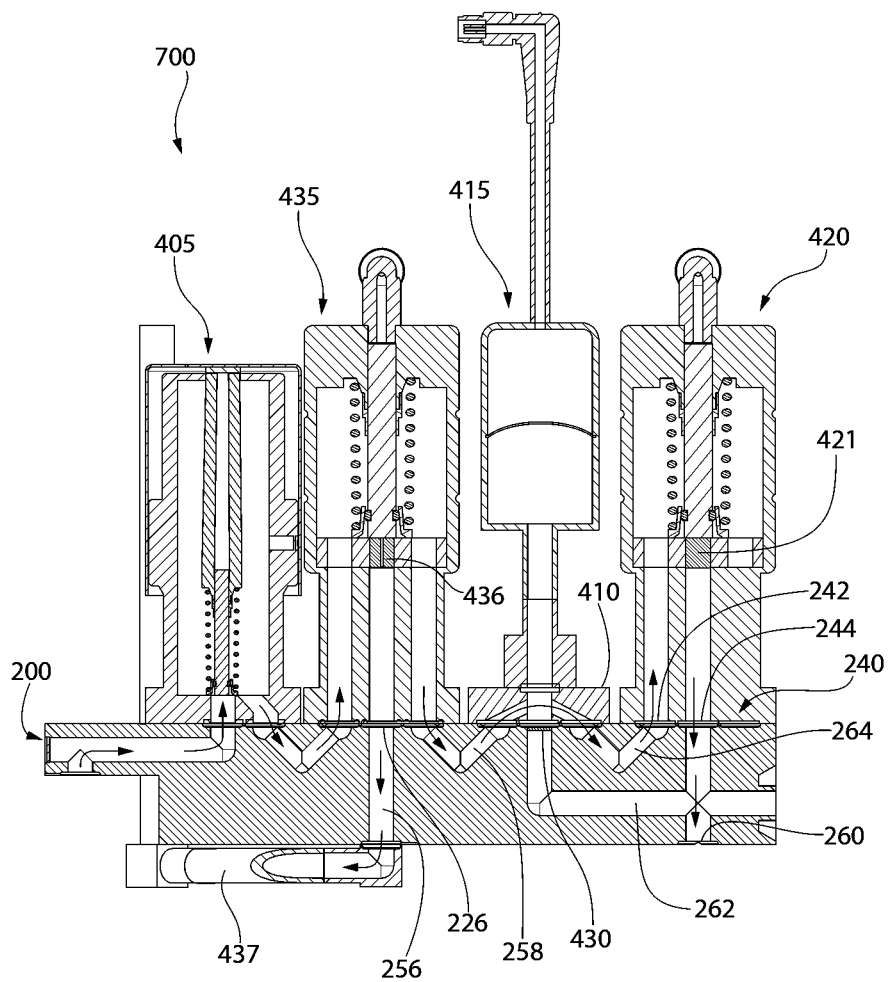
FIG. 18 is a cross sectional view of the mass flow controller of FIG. 17 illustrating the ports and flow passages.

FIGS. 17 and 18 illustrate a fourth embodiment of the mass flow controller 700. The mass flow controller 700 incorporates a monolithic base 200, a control valve component 405, a bleed component 435, a pressure transducer component 415, a cap component 410, and a laminar flow component 420. The mass flow controller 700 is similar to that disclosed in FIGS. 13 and 14, but differs in that the substrate block 425 has been eliminated and its features incorporated into the monolithic base 200. The mass flow controller 700 offers the same advantages in low flow accuracy with a different monolithic base. The process gas flows through the control valve component 405 as before, then passes through the bleed component 435 with a portion of the process gas being allowed to bleed through the orifice 436, through the auxiliary port 226 of the second flow component mounting region 120, and on through the auxiliary passage 156 to the bleed conduit 437.

The remaining process gas passes through the third flow passage 258 to the inlet port 232 of the third flow component mounting region 230. The cap component 410 is coupled to the third flow component mounting region 230 and has a passage which connects inlet port 232 to the auxiliary port 236, allowing unrestricted gas flow from the third flow passage to the fifth flow passage 264. The outlet port 234 is plugged by a blocking seal 430 so that the fourth flow passage 262 is isolated from the third and fifth flow passages 258, 264. The pressure transducer component 415 is mounted to the cap component 410 so that it can measure the pressure of the process gas within the third and fifth flow passages 258, 264.

Downstream of the cap component 410 and the pressure transducer component 415, process gas flows through the laminar flow component 420 coupled to the fourth flow component mounting region 240. Process gas enters the laminar flow component 420 at the inlet port 242, flows through the restrictor 421, and out of the laminar flow component 420 through the outlet port 244. The process gas is then conducted by the fourth flow passage 262 to the gas outlet 260.

Figure 19:
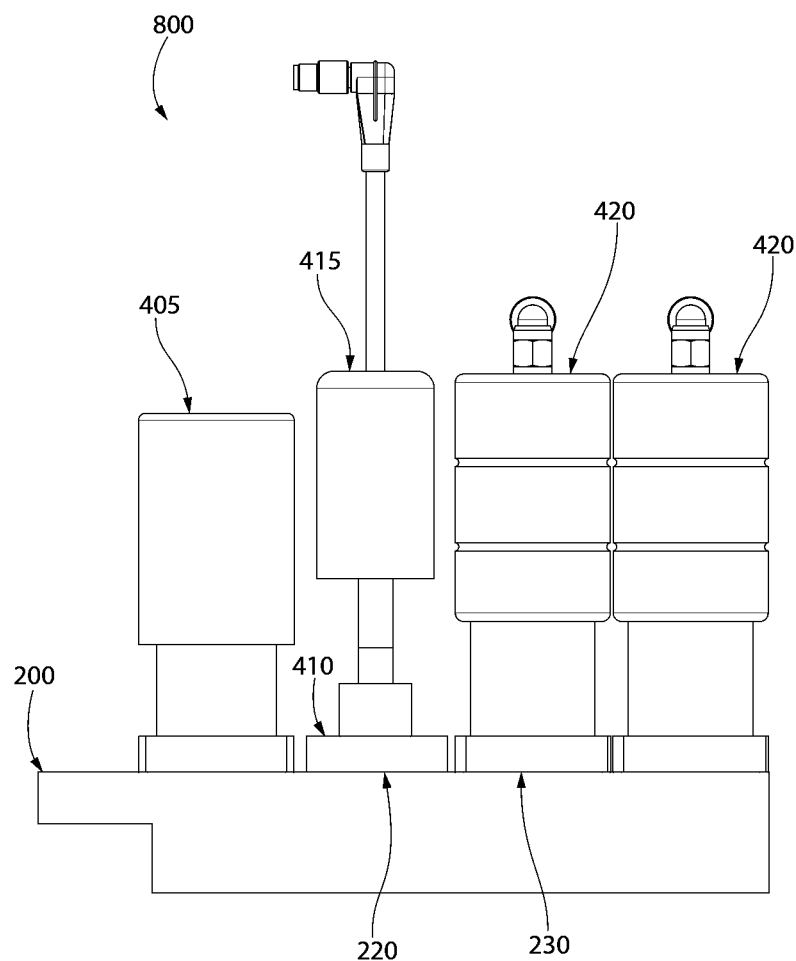
FIG. 19 is a side view of a mass flow controller in accordance with a fifth embodiment.
Figure 20:
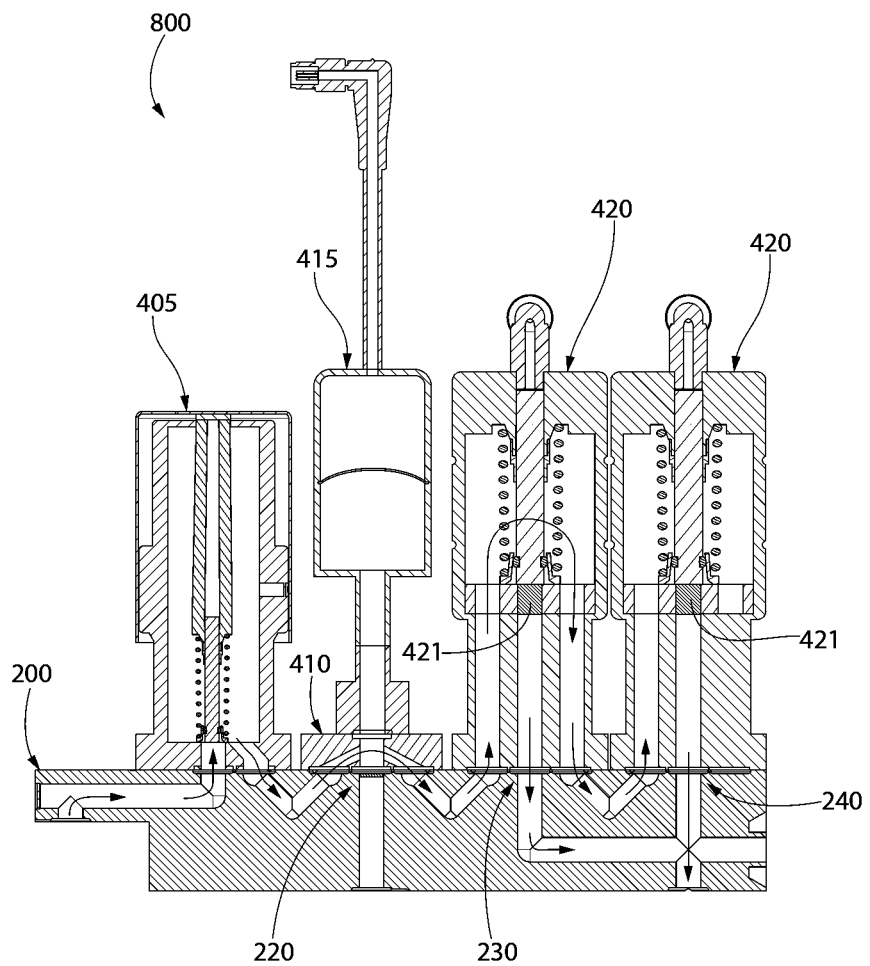
FIG. 20 is a cross sectional view of the mass flow controller of FIG. 19 illustrating the ports and flow passages.

A mass flow controller 800 exhibiting a broad dynamic range of possible mass flow rates is shown in FIGS. 19 and 20. The mass flow controller 800 incorporates a monolithic base 200, a control valve component 405, a pressure transducer component 415, a cap component 410, and two laminar flow components 420. By sizing the restrictors 421 in the laminar flow components 420, a large dynamic range can be achieved. Selectively enabling the laminar flow component 420 having the appropriate restrictor 421 for the desired mass flow rate allows a single mass flow controller to serve in the place of two individual mass flow controllers having different ranges of mass flow rates, achieving a considerable cost savings.

The mass flow controller 800 positions the cap component 410 and the pressure transducer component 415 in the second flow component mounting location 220. The auxiliary port 226 of the second flow component mounting location 220 is blocked by a blocking seal 430 which prevents process gas from exiting through the auxiliary port 226. The first laminar flow component 420 is coupled to the third flow component mounting location 230. The second laminar flow component 420 is coupled to the fourth flow component mounting location 240. Both laminar flow components 420 incorporate internal on/off valve components to permit selective engagement of one or both of the laminar flow components 420. As can be seen, it is possible to reconfigure the component locations to permit the same components to be mounted in different flow component mounting regions as a result of the port and passage configurations. The second, third, and fourth flow component mounting regions 220, 230, 240 are multi-function flow component mounting regions that enable flexible arrangement of the components as shown in the mass flow controller 800. This greatly increases the functionality of the monolithic base 200 and does not require separate customized base designs.

Figure 21:
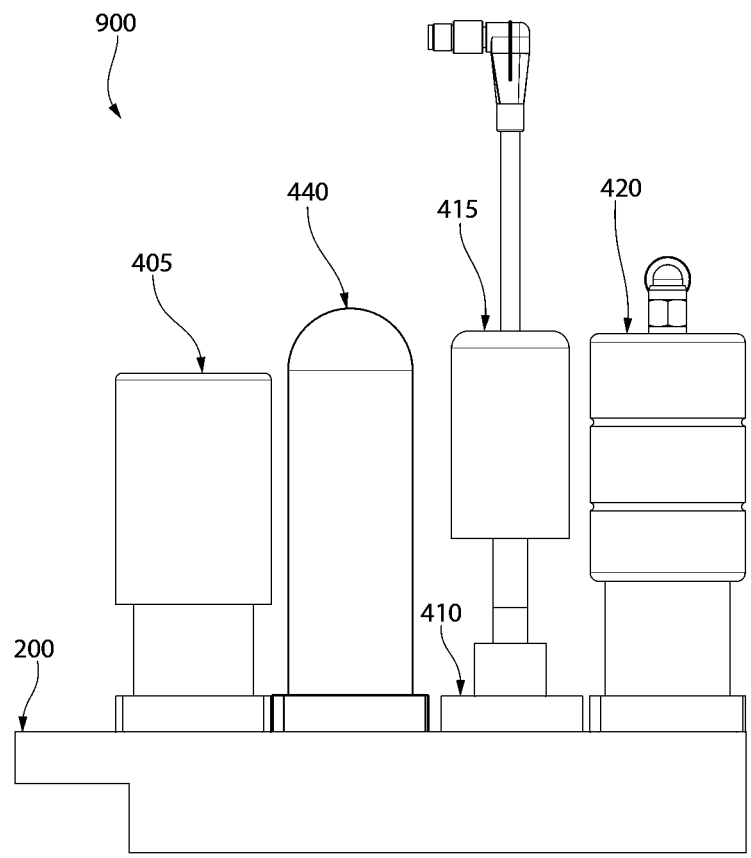
FIG. 21 is a side view of a mass flow controller in accordance with a sixth embodiment.
Figure 22:
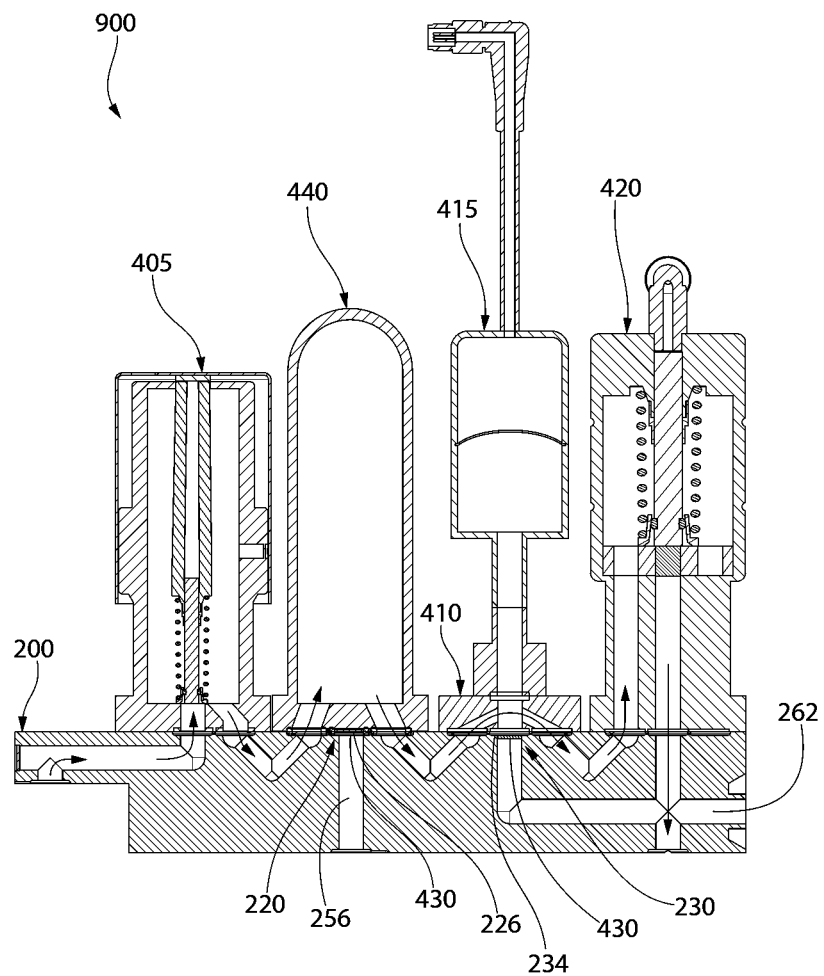
FIG. 22 is a cross sectional view of the mass flow controller of FIG. 21 illustrating the ports and flow passages.

The mass flow controller 900 of FIGS. 21 and 22 is another implementation of the high stability device disclosed in FIGS. 15 and 16. In this embodiment, a control valve component 405, a volumetric expander component 440, a pressure transducer component 415, a cap component 410, and a laminar flow component 420 are coupled to a monolithic base 200. The volumetric expander component 440 is coupled to the second flow component mounting location 220 and the pressure transducer component 415 and cap component 410 are coupled to the third flow component mounting location 230. The auxiliary port 226 of the second flow component mounting location 220 and the outlet port 234 of the third flow component mounting location 230 are blocked with blocking seals 430. Thus, no process gas flows through the auxiliary passage 256. The fourth flow passage 262 is also blocked, except for process gas that flows through the laminar flow component 420.

Figure 23:
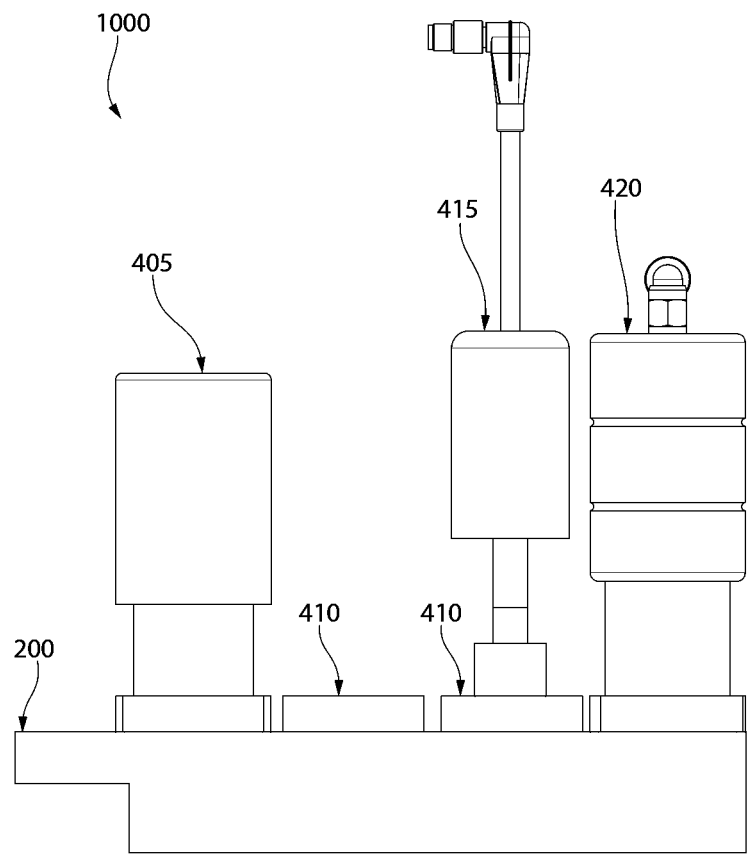
FIG. 23 is a side view of a mass flow controller in accordance with a seventh embodiment.
Figure 24:
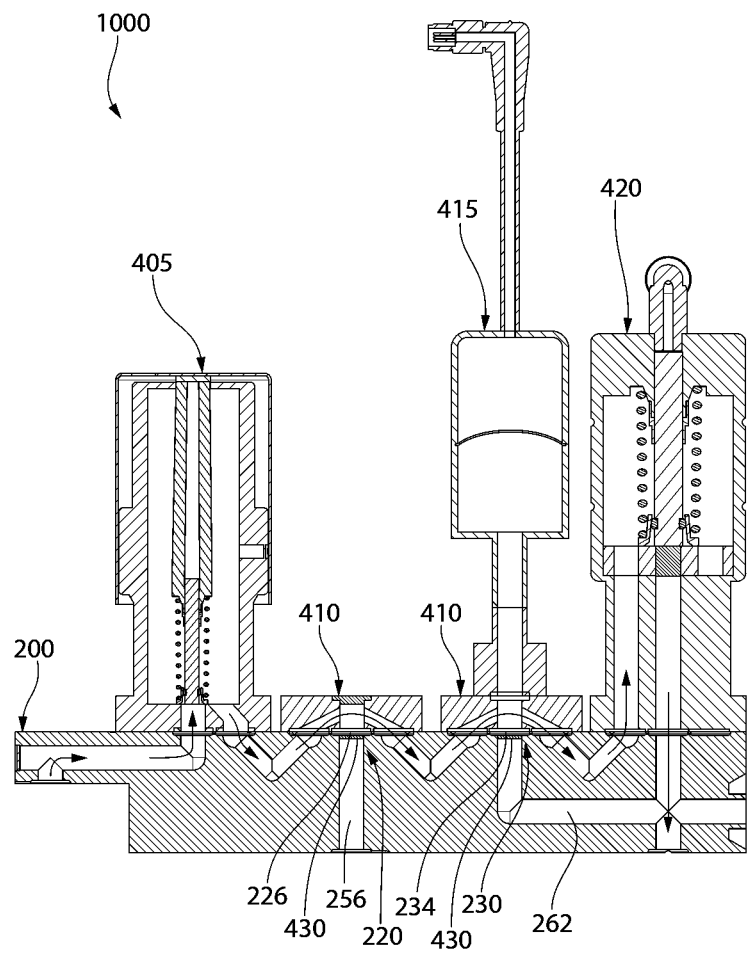
FIG. 24 is a cross sectional view of the mass flow controller of FIG. 23 illustrating the ports and flow passages.

Turning to FIGS. 23 and 24, a seventh embodiment of the mass flow controller 1000 is disclosed. This embodiment is designed to be a standard mass flow controller with no additional special functionality. The mass flow controller 1000 has a monolithic base 200, a control valve component 405, two cap components 410, a pressure transducer component 415, and a laminar flow component 420. The first cap component 410 is coupled to the second flow component mounting region 220 and the upper port on the first cap component 410 is plugged because there is no pressure transducer component 415 installed on the first cap component 410. The auxiliary port 226 of the second flow component mounting region 220 is blocked by a blocking seal 430 to prevent flow into the auxiliary passage 256.

The second cap component 410 is coupled to the third flow component mounting region 230 and the pressure transducer component 415 is attached to the second cap component 410. This enables the pressure transducer component 415 to sample the pressure upstream of the laminar flow component 420. In this embodiment, the outlet port 234 of the third flow component mounting region 230 is blocked by a blocking seal 430 to prevent flow upstream of the laminar flow component 420 from entering the fourth flow passage 262 without first passing through the laminar flow component 420. It is possible that the pressure transducer component 415 could be mounted to the first cap block 410 instead of the second cap block 410 if so desired, as the pressure in the internal passages of each of the first and second cap blocks 410 is equal.

Other mass flow controllers may be assembled with yet further variations in flow components. For example, it is within the scope of the invention to incorporate the features of one or more of the individual components into a single combination component. Specifically, a hybrid control valve component and pressure transducer component may be created which simultaneously controls process gas flow into the mass flow controller while simultaneously measuring the pressure of the gas downstream of the valve. This may free up additional flow component mounting locations for a more compact installation or the inclusion of additional flow components.

The monolithic bases 100, 200 may be used in a variety of installations in a substantially identical configuration. Monolithic bases are considered to be substantially identical even though particular blocks may vary due to minor imperfections, normal manufacturing tolerances, variations in flow component mounting arrangements, etc. Monolithic bases are also considered substantially identical where they have the same port arrangement and flow passage arrangement, even though the exact dimensions of the flow ports may vary. Where the bases have different port and passage variations, they are not deemed to be substantially identical.

Mass flow controller operating characteristics typically include maximum mass flow rate, minimum mass flow rate, mass flow rate supply accuracy, dynamic operating range, startup response time, and shut-off response time. As noted above, a variety of configurations of flow components can achieve different operating characteristics. Though altering the restrictor in a laminar flow component can achieve different ranges of maximum and minimum flow rates, the dynamic operating range is limited when a single laminar flow component is used. Thus, it is often advantageous to add a second laminar flow component having a different restrictor to increase the dynamic operating range. In yet other embodiments, more than two laminar flow components may be added to further enhance the dynamic operating range.

In other embodiments, it may be desirable to change the flow components to incorporate more pressure transducers, different components such as bleed components or volumetric expanders, or yet other flow components. Thus, a wide range of types of flow components may be incorporated into a single mass flow controller. Alternately, the flow components may be differently mounted on the same monolithic base to provide a variety of configurations.

Furthermore, temperature sensor components may be incorporated into the monolithic base, the control valve component, or any of the other components within the system. This enables an electronic control element to compensate for the temperature of the process gas and further enhance system accuracy. The electronic control element operates the valves and measures temperature and pressure to obtain the desired mass flow rates. The electronic control element is also capable of networked communication with other electronic devices in the system, so that it can send and receive data such as pressures in a process manifold downstream from the mass flow controller or instructions to start, stop, or alter the commanded mass flow rate. The electronic control element also stores all system calibration data to ensure that parameters such as the characterization data of the restrictor(s) in the laminar flow components.

Dynamic operating ranges for mass flow controllers having a single laminar flow component may be in the range of 20:1. Dynamic operating ranges for mass flow controllers having two laminar flow components may be as high as 400:1. Dynamic operating ranges for mass flow controllers having three laminar flow components may be as high as 8000:1. Each additional laminar flow component can increase the dynamic operating range by 20 times when the restrictors are selected appropriately.

Furthermore, achieving the desired mass flow rate supply accuracy can require additional flow components. Though a mass flow controller incorporating a single laminar flow component may have a high accuracy within a portion of the dynamic operating range, its accuracy may not be constant throughout the dynamic operating range. Accuracy may be enhanced by incorporating multiple laminar flow components or other flow components. Target mass flow rate supply accuracy may be 1%, 0.9%, or 0.5%.

The startup and shut-off response time of the unit is also affected by the volume between the control valve component and the one or more laminar flow components. Thus, if extremely fast response times are required, it may be necessary to minimize this volume. Alternately, if high stability is desired, a larger volume may be desirable to dampen pulses in the supplied mass flow rate. The volume may be altered to achieve a desired stability. The stability of the mass flow rate may be measured as a peak percent error from the desired mass flow rate. Target stability may be 1%, 0.8%, 0.5%, or even 0.25%.

Finally, the incorporation of bleed components may provide higher accuracy at extremely low flow rates. The bleed component may be constructed similarly to a laminar flow component with a different orifice or restrictor provided, and it may or may not incorporate a valve to control the opening of the orifice or restrictor.

The present invention may also be a process for manufacturing semiconductor devices incorporating a mass flow controller. This process may incorporate any system where a mass flow controller is connected to a gas supply and a controlled mass flow rate of a process gas is delivered to the process. Some representative semiconductor processes may include deposition, removal, patterning, or modification of electrical properties. Deposition processes may include physical vapor deposition, chemical vapor deposition, electrochemical deposition, molecular beam epitaxy, and atomic later deposition. Removal may include wet or dry etching and chemical-mechanical planarization. Patterning includes lithography processes which may incorporate deposition of photoresist and plasma ashing. Modification of electrical properties may include processes for doping by diffusion or ion implantation, or annealing by furnace annealing or rapid thermal annealing. The invention may include equipment for processing semiconductor devices through any process requiring controlled gas flow.

The present invention may also be a process for allowing a customer to specify and construct a mass flow system integrating off the shelf components into the customer's semiconductor manufacturing equipment. Furthermore, additional components may be purchased so as to enable reconfiguration of existing equipment at lower cost, rather than purchasing a new mass flow controller or mass flow control system for a new application. Individual components may be substituted or reconfigured to achieve different control objectives.

Section II

The present invention is directed to a method of improving the transient turn on performance of pressure based apparatuses for controlling mass flow. These apparatuses are used to provide steady state control of gas flows in a variety of industrial applications. In some embodiments, these apparatuses may be mass flow controllers which control the mass flow rate of a gas. Semiconductor fabrication is one industry which demands high performance in control of gas flows. As semiconductor fabrication techniques have advanced, customers have recognized the need for rapid and repeatable transient response in starting a gas flow. The need to reduce process times, minimize wasted process gas, improve yield, and increase factory throughput all drive the need for improved transient responses in apparatuses for controlling flow. In particular, the transient turn on time, or "TTO time," is a key parameter of next generation apparatuses for controlling flow. Lower transient turn on times and settling times help to drive down semiconductor fabrication costs.

Figure 25:
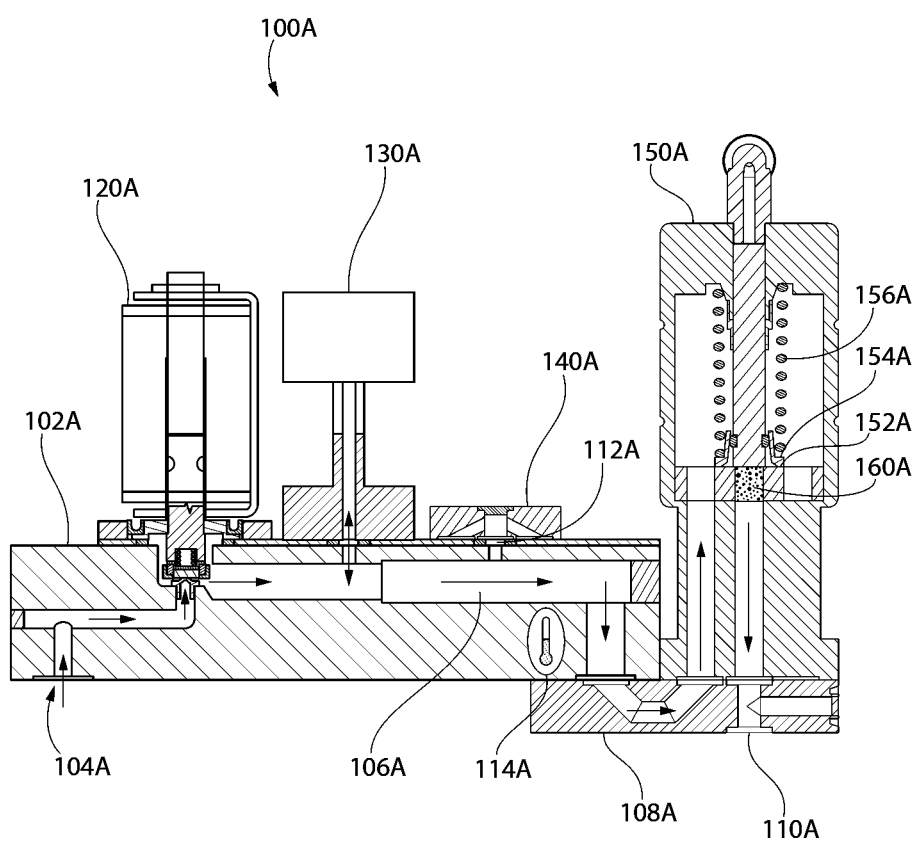
FIG. 25 is a cross sectional view of an apparatus for controlling gas flow.

FIG. 25 shows a cross sectional view of an apparatus for controlling flow 100A. The gas flow path of the process gas is indicated by arrows which illustrate the path that the process gas takes through the apparatus 100A. The apparatus 100A has a base 102A comprising a gas inlet 104A and a gas outlet 110A, the gas flow path extending between the gas inlet 104A and the gas outlet 110A. A supply of process gas is delivered to the gas inlet 104A of the base 102A. The process gas then flows through a proportional valve 120A into a P1 volume 106A within the base 102A. The proportional valve 120A meters the amount of process gas which passes to the P1 volume 106A. The proportional valve 120A is capable of providing proportional control of the process gas such that it need not be fully open or closed, but instead may have intermediate states to permit control of the mass flow rate of process gas. In some embodiments, the proportional valve 120A may have a closure member which can move to a plurality of distinct positions between the fully open and fully closed positions. In some cases, the closure member may be infinitely adjustable. In yet other embodiments, the proportional valve 120A may open and close rapidly to control the amount of gas which flows through the proportional valve 120A. The proportional valve 120A may utilize any method of metering the mas flow rate of process gas into the P1 volume 106A.

A pressure transducer 130A is attached to the base 102A and is fluidly coupled to the P1 volume 106A so that it can sample the pressure within the P1 volume 106A. The base 102A may incorporate one or more additional ports 112A to permit alternate configurations. In the present embodiment, the port 112A is blocked with a cap component 140A. Alternate configurations may incorporate additional components or position the components differently to achieve different mass flow rates, or additional functions to further improve transient performance.

Next, the process gas flows out of the P1 volume 106A into an on/off valve 150A. Internal to the on/off valve 150A is a valve seat 152A and a closure member 154A. When the apparatus 100A is delivering process gas, the on/off valve 150A is in an open state, such that the valve seat 152A and the closure member 154A are not in contact. This permits free flow of the process gas, and provides a negligible restriction to fluid flow. When the apparatus 100A is commanded to stop the flow of the process gas, the closure member 154A and the valve seat 152A are biased into contact by the spring 156A, stopping the flow of process gas through the on/off valve 150A.

Downstream of the valve seat 152A is a characterized flow restrictor 160A which provides a known restriction to fluid flow. This restriction may be described as a flow impedance, a higher flow impedance providing an increased restriction to fluid flow. The characterized flow restrictor 160A may be selected or adjusted to have a range of flow impedances. This allows the same apparatus 100A to be optimized for different ranges of mass flow rates that the apparatus 100A may supply. The characterized flow restrictor 160A may be formed as a porous block, a device having small orifices or channels, or any other means of providing a restriction to process gas flow that is characterized across a target dynamic operating range of mass flow rates. The characterized flow restrictor 160A has a greater flow impedance than the passages upstream and downstream of the characterized flow restrictor 160A. After passing through the characterized flow restrictor 160A, the process gas exits the gas outlet 110A. Generally, the gas outlet 110A of the apparatus 100A is coupled to a manifold, the manifold directing a plurality of process gases to an applicator in the process equipment.

Optionally, temperature sensors may be employed to further enhance the accuracy of the apparatus 100A. A temperature sensor 114A is shown in FIG. 25, located within the base 102A so that it can measure the temperature near the P1 volume 106A. Additional temperature sensors 114A may be employed in a variety of locations, including the proportional valve 120A, the pressure transducer 130A, and the on/off valve 150A. Furthermore, a pressure sensor downstream of the characterized flow restrictor 160A may be utilized to further increase the accuracy of the mass flow delivered by the apparatus 100A.

Figure 26:
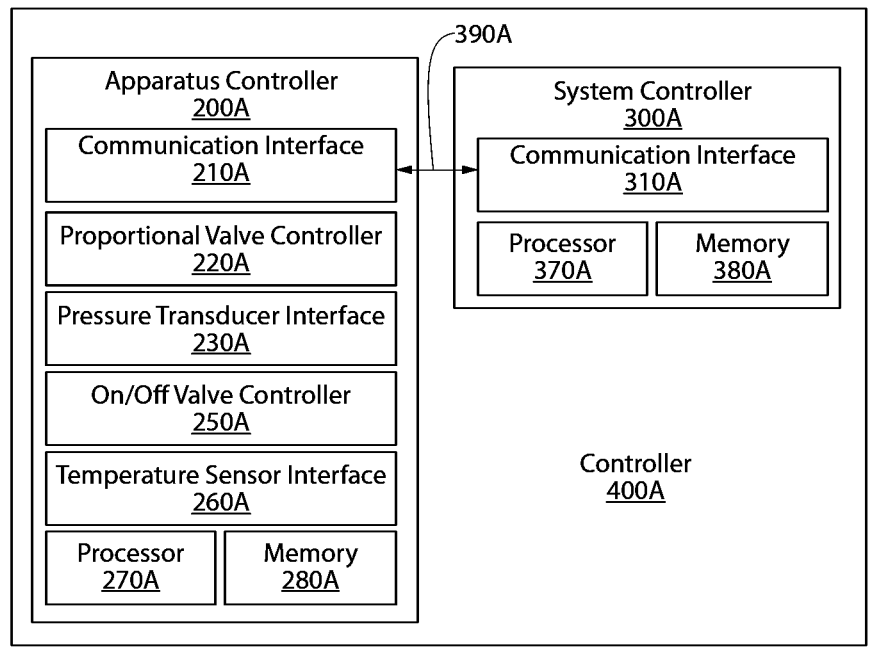
FIG. 26 is a block diagram illustrating the control system for the apparatus of FIG. 25.

Turning to FIG. 26, a block diagram illustrates the control system for the apparatus 100A of FIG. 25. This block diagram shows a controller 400A comprising an apparatus controller 200A and a system controller 300A. In this embodiment, the controller 400A is divided into two parts. The apparatus controller 200A provides all control functions for the apparatus 100A. The apparatus controller 200A has a communication interface 210A, a proportional valve controller 220A, a pressure transducer interface 230A, an on/off valve controller 250A, a temperature sensor interface 260A, a processor 270A, and memory 280A. The communication interface 210A is configured to provide a communications link between the apparatus controller 200A and the system controller 300A. Optionally, the temperature sensor interface 260A may be omitted if the additional accuracy provided by the temperature sensor 114A is not required.

The system controller 300A has a corresponding communication interface 310A, a processor 370A, and memory 380A. The system controller 300A coordinates all high level functions necessary to perform the desired process. The communication interface 310A of the system controller 300A sends and receives commands through a communications bus 390A. The communications bus 390A connects to the communication interface 210A of the control module 210A of the apparatus 100A. The communications bus 390A may connect to a single apparatus controller 200A, or it may connect to a plurality of apparatus controllers 200A, each apparatus controller 200A operating a distinct apparatus 100A. Not all apparatus controllers 200A need control an apparatus 100A for controlling mass flow. Instead, other types of process equipment may also be controlled. Furthermore, there may be a plurality of communications buses 390A to connect all the devices required to perform the desired process.

Internal to the system controller 300A, the processor 370A and the memory 380A operate to carry out the desired process. The processor 370A provides the timing necessary to ensure that the appropriate steps are carried out for the desired duration, and provides instructions to the apparatus controller 200A of the apparatus 100A. The necessary information is transmitted from the system controller 300A to the apparatus controller 200A as a gas flow activation signal. The gas flow activation signal may consist of information such as the desired state of the apparatus 100A (i.e. flowing gas or not flowing gas), a predetermined mass flow rate needed to complete the process, a predetermined mass flow rate required at a future time, and the future time at which the predetermined mass flow rate is required. In other embodiments, the gas flow activation signal may provide information that instructs the apparatus controller 200A to begin flowing gas upon receipt of a trigger signal.

A time stamp or other synchronization method may be provided in the instructions to ensure that the system controller 300A and the apparatus controller 200A are synchronized. This ensures that process events occur at the desired time. Other methods may be used to ensure that the apparatus begins flowing gas at the desired time. In addition, other signals may be transmitted between the system controller 300A and the apparatus controller 200A. For instance, an acknowledgement message or current status message may be issued from the apparatus controller 200A to the system controller 300A to provide the current state or confirm the receipt of instructions. Status messages may be provided automatically, in response to an input, or in response to a polling message from the system controller 300A. Where a trigger signal is used instead of a future turn-on time, the apparatus controller 200A will begin priming the apparatus 100A and will wait for the trigger signal to open the on/off valve 150A.

Similarly, the processor 270A and memory 280A of the apparatus controller 200A operate to maintain timing, send and receive messages through the communication interface 210A, and operate the functions of the apparatus 100A. The processor 270A of the apparatus 100A implements a closed loop feedback system. When the apparatus controller 200A is instructed to deliver process gas, the apparatus controller 200A monitors the pressure in the P1 volume 106A using the measurements taken from the pressure transducer 130A. The pressure transducer interface 230A takes readings from the pressure transducer 130A. This information, in combination with the known flow impedance provided by the characterized flow restrictor 160A, is used to calculate the mass flow rate of the process gas through the apparatus 100A. A temperature value determined from the temperature sensor 114A may also be used to further enhance the accuracy of the calculation. The value of the flow impedance is stored in the memory 280A along with other constants and calibration data to enable accurate calculation of the various process parameters.

The processor 270A then compares the current mass flow rate through the apparatus 100A against the predetermined mass flow rate provided by the system controller 300A. The proportional valve controller 220A commands the proportional valve 120A to increase or decrease the flow rate of process gas into the P1 volume 106A to achieve a target pressure in the P1 volume 106A that will result in the predetermined mass flow rate. This process is continually repeated until the apparatus controller 200A is commanded to stop delivering process gas. At this time, the proportional valve 120A is closed. The on/off valve controller 250A also commands the on/off valve 150A to close, halting flow of the process gas through the outlet 110A. The on/off valve 150A remains closed until the apparatus controller 200A is instructed to deliver process gas. At that time, the on/off valve 150A is opened and the apparatus 100A resumes operation.

In yet other embodiments, the controller 400A may incorporate the functionality of both the apparatus controller 200A and the system controller 300A into a single device which need not be connected by a communications bus 390A. Instead, the proportional valve 120A, on/off valve 150A, and other elements are interfaced directly by a single controller which generates a gas flow activation signal internally to the controller 400A. A single controller may interface more than one device. This configuration has the advantage of elimination of redundant hardware, but requires greater controller complexity.

In operation, the apparatus controller 200A is instructed to begin delivering flow at a future time when the gas flow activation signal is provided. This generally occurs when the apparatus 100A is shut off and no gas is being delivered to the gas outlet 110A. The gas flow activation signal is generated by the system controller 300A and received by the apparatus controller 200A. The gas flow activation signal includes information which instructs the apparatus controller 200A to change from zero flow to a predetermined flow rate having a non-zero positive value. The receipt of the gas flow activation signal by the apparatus controller 200A begins a priming period. Upon receipt of the gas flow activation signal, the apparatus 100A prepares to deliver gas at the predetermined flow rate. In this instance, "upon" means at any time concurrent or subsequent to the event. Thus, the apparatus 100A may prepare to deliver gas at any time concurrent or subsequent to the receipt of the gas flow activation signal by the apparatus controller 200A.

When the apparatus 100A is shut off, both the proportional valve 120A and the on/off valve 150A are closed. In order to prime the apparatus prior to beginning the flow of gas, the proportional valve controller 220A of the apparatus controller 200A commands the proportional valve 120A to open to achieve a target pre-flow pressure in the P1 volume 106A. The target pre-flow pressure is calculated to achieve the predetermined flow rate based on the flow impedance of the flow restrictor 160A, subsequent to the opening of the on/off valve 150A. At the occurrence of the turn on time $t_2$ at which the gas flow activation signal commands the gas flow to begin, the on/off valve 150A is moved from an off state where the on/off valve 150A is closed to an on state where the on/off valve 150A is open. This ends the priming period for the apparatus 100A. The gas then begins to flow out of the P1 volume 106A, past the on/off valve 150A and the flow restrictor 160A, and out of the gas outlet 110A. The apparatus 100A then drives the delivered flow rate to the predetermined flow rate using its normal control system.

This system typically operates on a PID feedback loop to ensure that a delivered flow rate is substantially identical to the predetermined flow rate.

The transient turn on time of the apparatus 100A is measured from the time that the on/off valve 150A is commanded to open until the delivered flow rate delivered by the apparatus 100A has stabilized within a certain range. In many instances, the delivered flow rate must be within plus or minus 2% of the predetermined mass flow rate. However, stability windows of plus or minus 5%, 1%, 0.8%, 0.5%, 0.25%, or 0.1% may also be specified, depending on the process requirements.

Figure 27:
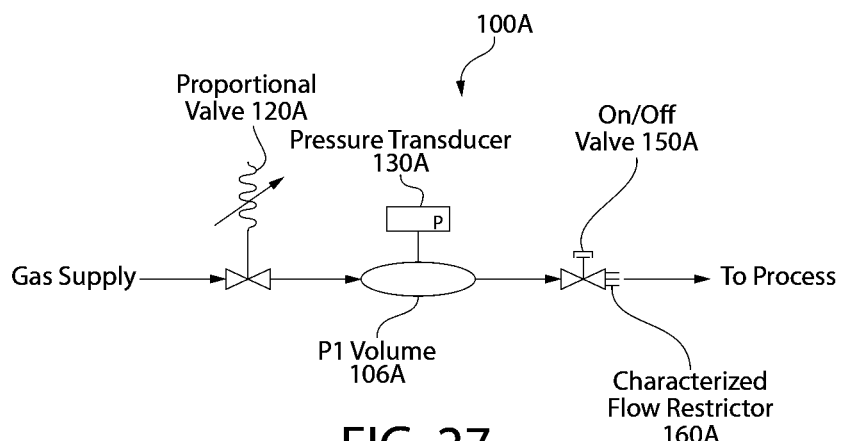
FIG. 27 is a schematic diagram of the apparatus of FIG. 25.

Turning to FIG. 27, a schematic diagram of the apparatus 100A discussed above is provided. When the apparatus 100A is instructed to deliver process gas, the process gas flows through the proportional valve 120A. The proportional valve 120A meters the process gas into the P1 volume 106A. Process gas then passes through the on/off valve 150A and the characterized flow restrictor 160A. Thus, a known mass flow of process gas is delivered to the process. When the apparatus 100A is instructed to cease delivery of process gas, the proportional valve 120A and the on/off valve 150A are closed, stopping flow of process gas.

Typical commercially available apparatuses for flow control provide a transient turn on time in the range of 500 to 1000 milliseconds with an accuracy of plus or minus 2%. The semiconductor industry typically uses a range of plus or minus 2% of the set point as the window for measuring the transient turn on time. The transient turn on time is determined by the earliest time that the delivered mass flow rate enters and remains within the 2% window. Although other percentages may be used, many semiconductor manufacturers adhere to the 2% specification.

The transient turn on time is dictated by inherent limitations in flow sensing and the speed that the proportional valve 120A can respond to commands. Flow sensing limitations are controlled by the frequency at which the pressure transducer 130A reading is taken and the speed at which the pressure transducer 130A can respond to changes in pressure in the P1 volume. The proportional valve 120A also has limitations on how fast it can modulate its opening position or otherwise control the metered flow rate into the P1 volume 106A. Furthermore, the size of the P1 volume 106A also affect the transient turn on time, the transient turn off time, and the stability of the resulting mass flow. Faster transient turn on and turn off times may be achieved by minimizing the size of the P1 volume 106A, but there are limitations to this approach. For instance, stability may be adversely affected by minimizing the size of the P1 volume 106A.

Thus, commercially available apparatuses are unable to significantly reduce their transient turn on times below 500 milliseconds due to the inherent system limitations of pressure based apparatuses. These apparatuses accept instructions from the system controller 300A that essentially consist of a command to change the predetermined mass flow rate from zero to a given value, with no advance notice of the predetermined mass flow rate. Accordingly, the transient turn on time is merely the time to achieve the predetermined mass flow rate in a single instantaneous step. Current commercially available apparatuses receive no advance notice of the turn on command.

The present approach does not rely on the use of extremely fast proportional valves, on/off valves, or pressure transducers to achieve substantial reductions in transient turn on times. For instance, commercially available on/off valves may have response times in the range of 3 to 80 milliseconds. On/off valves having a response time of 50 milliseconds are commonly available at reasonable prices. Faster valves can be used, but generally incur additional cost. For the sake of discussion, a response time of 50 milliseconds is assumed.

In order to achieve improved transient turn on times, the gas flow activation signal issued by the system controller 300A includes information about both the predetermined mass flow rate required by the process and a future turn on time $t_2$ that that apparatus 100A should open the on/off valve 150A to begin supplying process gas. The apparatus controller 200A receives the gas flow activation signal at a first time $t_1$. Providing the gas flow activation signal in advance of the turn on time $t_2$ allows the apparatus 100A to pre-pressurize the P1 volume 106A during the priming period and overcomes limitations related to valve and pressure transducer response times. The turn on time $t_2$ is also known as a second time. In alternate embodiments, the gas flow activation signal includes information instructing the apparatus controller 200A to wait for a trigger signal to open the on/off valve 150A rather than a specific time for beginning gas flow.

Figure 28:
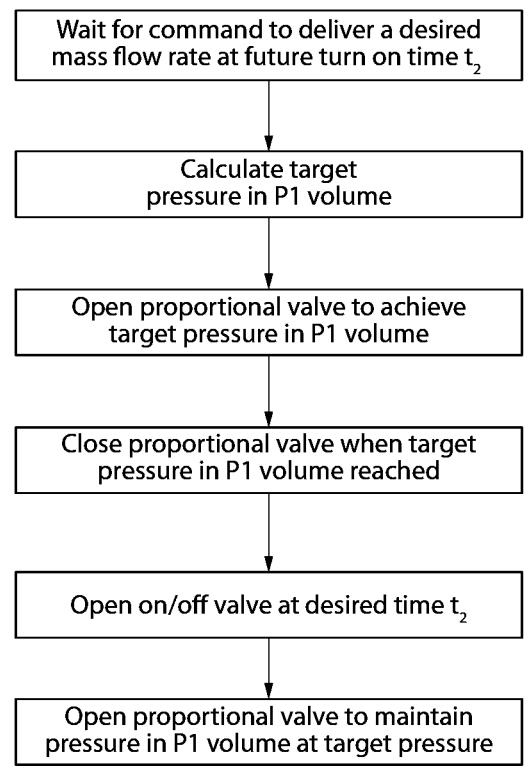
FIG. 28 is a flow chart illustrating a first method of improving transient turn on performance.

In the first method, shown in FIG. 28, the apparatus controller 200A of the apparatus 100A waits for the gas flow activation signal instructing it to deliver a predetermined mass flow rate at future turn on time $t_2$. During the time prior to the receipt of the command, the apparatus 100A is generally off. However, it is possible that the same method may be used to alter the predetermined flow rate from one non-zero mass flow rate to another non-zero mass flow rate. Upon receipt of the gas flow activation signal, the apparatus controller 200A computes a target pre-flow pressure in the P1 volume 106A to achieve the predetermined mass flow rate. The proportional valve 120A is then opened under proportional integral derivative ("PID") control to achieve the target pre-flow pressure in the P1 volume 106A. Once the target pre-flow pressure in the P1 volume 106A is reached, the proportional valve 120A is closed to prevent the pressure in the P1 volume 106A from overshooting the target pressure. At the turn on time $t_2$, the on/off valve 150A is opened and the apparatus 100A begins delivering process gas. The proportional valve 120A is then opened to maintain the pressure in the P1 volume 106A.

Depending on the duration of the priming period and the speed at which the proportional valve 120A is able to reach the target pre-flow pressure in the P1 volume 106A, the proportional valve 120A may not close before the turn on time $t_2$ is reached. In this case, it is likely that the proportional valve 120A will meter less process gas into the P1 volume 106A than needed to achieve the target pre-flow pressure. The apparatus 100A is now in a primed condition which is selected to achieve the predetermined flow rate. In the ideal implementation, adequate priming period is provided so that the proportional valve 120A is able to pre-pressurize the P1 volume 106A prior to the turn on time $t_2$. In some other embodiments, the turn on time $t_2$ may occur prior to achievement of the target pre-flow pressure or immediately upon achievement of the pre-flow pressure. It is not necessary that the proportional valve 120A close prior to the turn on time $t_2$. It is conceived that it remains open, achieving the target pre-flow pressure in the P1 volume 106A exactly at the turn on time $t_2$.

In order to achieve the target pre-flow pressure in the P1 volume 106A, the proportional valve 120A may open fully, or may only open partially. The opening position and the pressurization profile of the pressure in the P1 volume 106A may be adjusted in any manner necessary to achieve the target pressure. The pressurization profile may be controlled so that pressure rises linearly. Or in other embodiments, the pressurization profile may be controlled so that the P1 volume 106A reaches the target pre-flow pressure as soon as possible without overshoot.

In some embodiments, the estimated time to achieve the primed condition may be calculated, and the proportional valve 120A may be opened earlier or later to alter the time required to prime the P1 volume 106A. In some instances, the slope may vary depending on the predetermined flow rate, the pressure of the supplied process gas at the gas inlet 104A, the priming period, or other factors.

The present method offers the advantage of eliminating the need to pressurize the P1 volume 106A subsequent to the turn on time $t_2$. This reduces the transient turn on time, particularly for low flow rates. The apparatus 100A may be arranged such that the on/off valve 150A is upstream or downstream of the calibrated flow restrictor 160A. In the event that the calibrated flow restrictor 160A is upstream of the on/off valve 150A, a pulse of high pressure process gas is delivered before the flow stabilizes. This undesirably wastes process gas, but the pulse will not meaningfully impact the transient turn on time, as it occurs much more rapidly than the flow rate can stabilize within the target boundaries. In the event that the calibrated flow restrictor 160A is downstream of the on/off valve 150A, no pulse occurs, but the process gas must flow through the flow restrictor 160A. Furthermore, there is a small additional unpressurized volume downstream of the on/off valve 150A that results in a slight pressure drop. In practice, this additional volume causes a negligible change in pressure in the P1 volume 106A as long as the flow restrictor 160A is located near the valve seat 152A. In some embodiments, the flow restrictor 160A is located adjacent the valve seat 152A, with 1 cc or less volume between the flow restrictor 160A and the valve seat 152A. A volume of 0.5, 0.2, 0.1, or 0.02 cc is preferred.

The present method operates most effectively where the predetermined mass flow rate is low as compared with the mass of process gas in the P1 volume 106A. In contrast to other methods of improving response time, this method offers the dual advantages of improving stability and reducing transient turn on times. This is because the P1 volume 106A need not be reduced in size to the utmost degree, lessening the burden on the proportional valve 120A and the apparatus controller 200A. However, for larger mass flow rates as compared with the mass in the P1 volume 106A, the mass flow rate dips undesirably as the process gas flows out of the P1 volume 106A. The P1 volume 106A is generally of insufficient size to act as a cushion when the on/off valve 150A is opened. Then, the proportional valve 120A is commanded to open rapidly. Both the apparatus controller 200A and the proportional valve 120A have speed limitations which undesirably lengthen the time before the target pressure in the P1 volume is restored. Though the present method still offers advantages over commercially available apparatuses, this method does not provide similar stability and transient turn on performance over the entire operating range.

Having a larger P1 volume 106A to mass flow rate results in an improved damping effect, preventing the pressure in the P1 volume 106A from dropping rapidly after the turn on time $t_2$. Increasing mass flow rates increase the burden on the apparatus 100A. As noted previously, the proportional valve 120A generally closes prior to the turn on time $t_2$ as a result of the need to avoid overshooting the target pressure in the P1 volume 106A. Once the turn on time $t_2$ passes, the proportional valve 120A is instantaneously commanded to open to counteract the rapid change in pressure in the P1 volume 106A resulting from the opening of the on/off valve 150A. Thus, the ability of the apparatus 100A to maintain the predetermined mass flow rate becomes increasingly dependent on the response time of the proportional valve 120A and the control loop implemented in the apparatus controller 200A as the predetermined mass flow rate increases.

Figure 29:
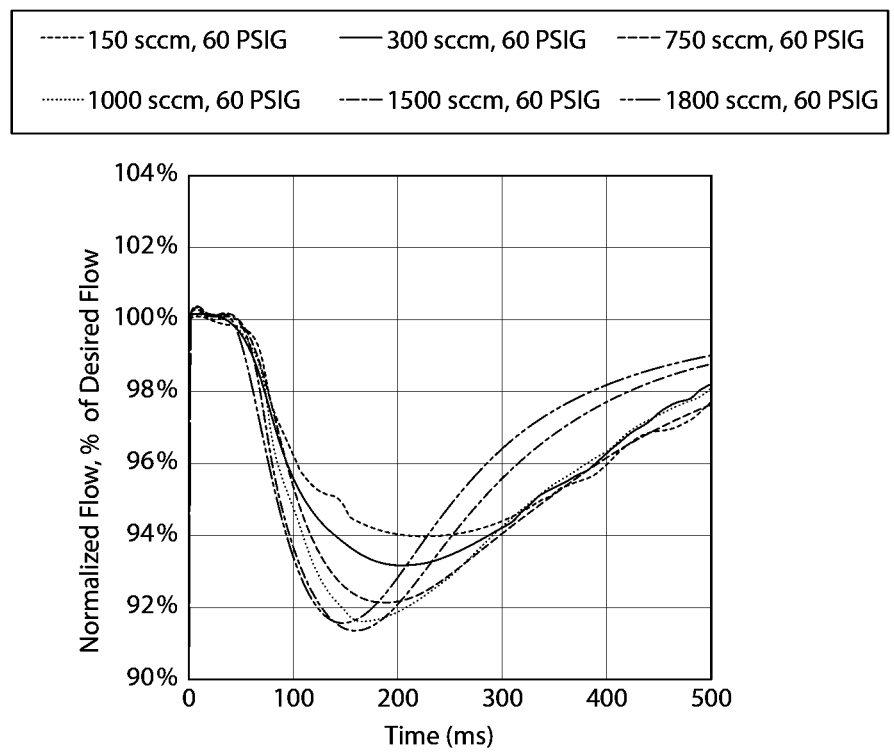
FIG. 29 is a graph illustrating normalized mass flow rates resulting from implementation of the method of FIG. 28.

FIG. 29 shows the test results of the method of FIG. 28 for a range of predetermined mass flow rates. Mass flow rates of 150, 300, 750, 1000, 1500, and 1800 standard cubic centimeters per minute ("sccm") were tested at a process gas supply pressure of 515 kpa (60 psig). The mass flow rates were graphed from the turn on time $t_2$ to 500 milliseconds and normalized so that the predetermined mass flow rate was equal to 100%. As the predetermined mass flow rates increased, the delivered flow rate drops to a lower percentage of the predetermined mass flow rate, with the 1000 sccm, 1500 sccm, and 1800 sccm mass flow rates falling below 92% of the desired rate. Furthermore, the time to reach 2% of the predetermined mass flow rate was approximately 500 milliseconds for the highest flow rates.

Figure 30A:
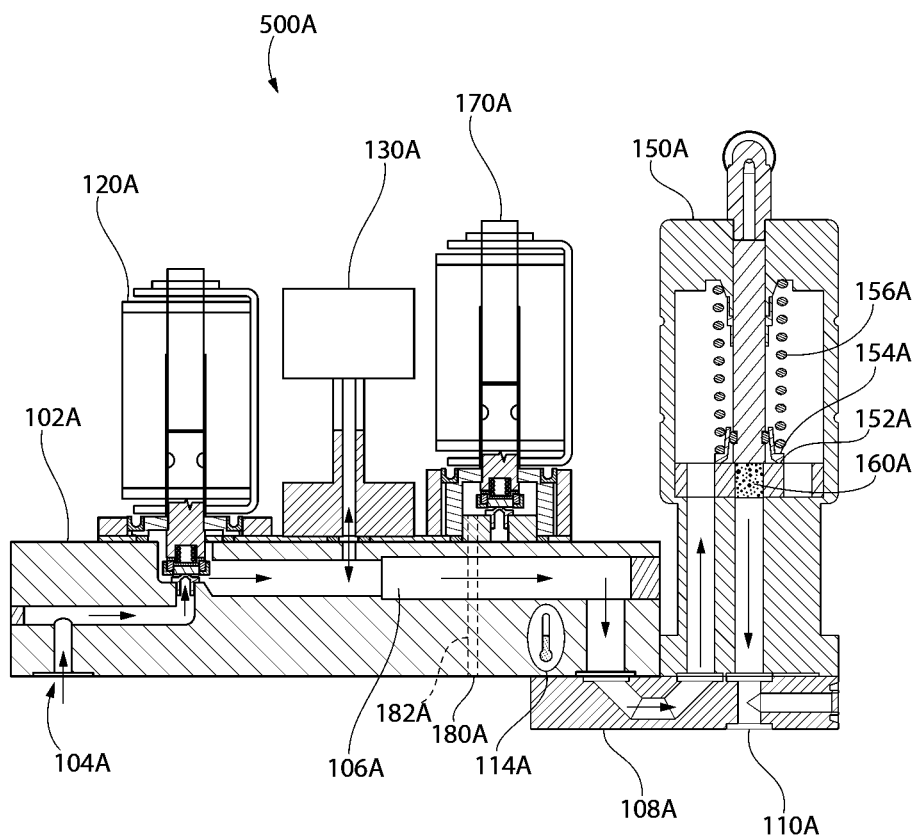
FIG. 30A is a cross sectional view of another embodiment of an apparatus for controlling gas flow.
Figure 30B:
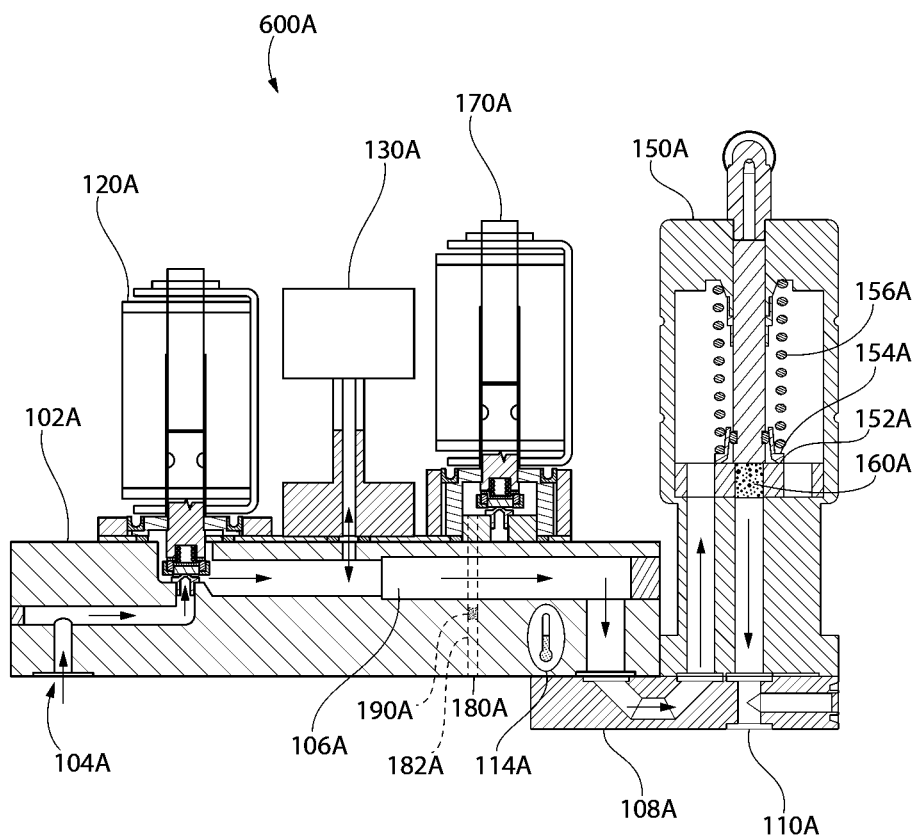
FIG. 30B is a cross sectional view of another embodiment of an apparatus for controlling gas flow.

In yet further embodiments, a bleed valve may be used, such as that shown in the apparatus 500A of FIG. 30A. The bleed valve 170A is capable of bleeding gas from the P1 volume 106A into a non-process location through a bleed passage 182A to a bleed outlet 180A, the bleed outlet 180A being isolated from the gas outlet 110A. The bleed valve 170A may be a proportional valve similar to the proportional valve 120A. This allows the pressure in the P1 volume 106A to be controlled by the bleed valve 170A while simultaneously controlling the flow of gas through the proportional valve 120A into the P1 volume 106A. This modification provides greater control over the resulting pre-flow pressure and the flow rate through the proportional valve 120A. The bleed valve 170A may be controlled in any manner desired to achieve the desired pre-flow pressure, including simultaneous opening with the proportional valve 120A, subsequent opening, or even opening prior to the opening of the proportional valve 120A. The bleed valve 170A may be opened with a variety of profiles and ramp rates to control the pressure in the P1 volume 106A including linear, exponential, or other profiles. It is also contemplated that the opening of the proportional valve 120A may be held constant while the bleed valve 170A controls the pressure in the P1 volume 106A. In other embodiments, such as the one shown in FIG. 30B, the bleed valve 170A may be an on/off valve similar to the on/off valve 150A. The bleed valve 170A is used in combination with a second characterized restrictor 190A located within the bleed passage 182A. This allows a known flow rate of gas to be metered out of the P1 volume 106A to the bleed outlet 180A and the non-process location. Alternately, the second characterized restrictor 190A may be located between the bleed valve 170A and the P1 volume 106A.

Figure 31:
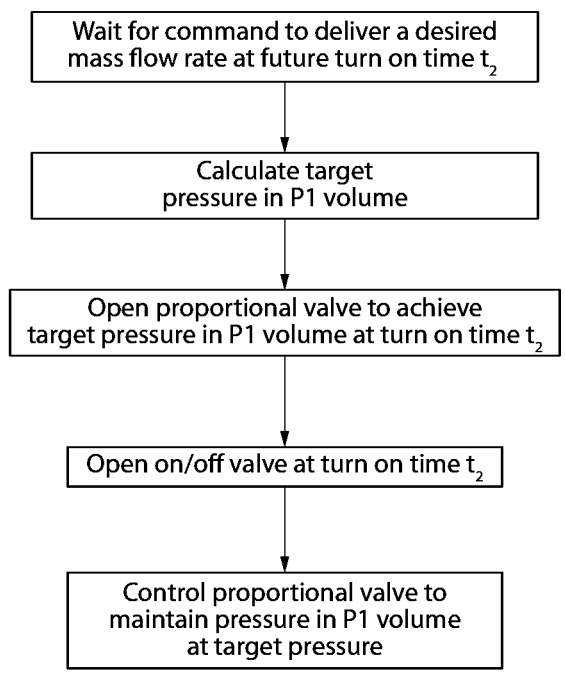
FIG. 31 is a flow chart illustrating a second method of improving transient turn on performance.

FIG. 31 illustrates a second method of improving transient turn on time for the apparatus 100A. Initially the apparatus 100A is off, such that it delivers no process gas. The apparatus controller 200A of the apparatus 100A waits for the gas flow activation signal instructing it to deliver a predetermined mass flow rate of gas at the future turn on time $t_2$. Once the signal is received, the priming period begins. The apparatus controller 200A calculates the target pre-flow pressure in the P1 volume 106A required to achieve the predetermined mass flow rate. The proportional valve 120A is then opened under PID control, with the goal of achieving the target pre-flow pressure in the P1 volume 106A at the turn on time $t_2$. Thus, two boundary conditions are specified. Not only is the pressure driven to the target pre-flow pressure by the proportional valve 120A, but the target pre-flow pressure is reached at the time that the on/off valve 150A is scheduled to open. Then the on/off valve 150A is opened at the turn on time $t_2$. Finally, the proportional valve 120A is controlled so that the pressure in the P1 volume 106A is maintained at the target pressure. This causes the delivered flow rate of the apparatus 100A to quickly settle at the predetermined mass flow rate. As mentioned above, an apparatus incorporating the bleed valve FIG. 32 discloses a third method of improving transient turn on time for the apparatus 100A. In this method, the proportional valve 120A is driven such that the target pre-flow pressure is achieved in the P1 volume 106A at the turn on time $t_2$ as with the second method disclosed above. Simultaneously, the mass flow rate across the proportional valve 120A is also driven to the predetermined mass flow rate at the turn on time $t_2$. This offers a further improvement because three boundary conditions are met simultaneously. By controlling the mass flow rate across the proportional valve 120A at the turn on time $t_2$, the delivered mass flow rate through the apparatus 100A will settle to very near the predetermined mass flow rate. Furthermore, the proportional valve 120A will not need to move significantly to maintain the pressure in the P1 volume at the target pressure.

Thus, this method has the goal of priming the P1 volume 106A to the target pre-flow pressure, but it also has the goal of having the proportional valve 120A open and flowing approximately the predetermined mass flow rate into the P1 volume 106A at the turn on time $t_2$. This has the benefit of minimizing the necessary movement of the proportional valve 120A upon the opening of the on/off valve 150A. Therefore, the corrective action commanded by the proportional valve 120A PID loop is reduced such that the delivered flow through the characterized flow restrictor 160A does not drop out of the target range. Furthermore, the performance of the apparatus 100A is nearly identical for a wide range of predetermined mass flow rates. The present method is able to settle far faster than the method of FIG. 28 at all mass flow rates.

The mass flow into the P1 volume 106A can be calculated during the priming period. During this period, the on/off valve 150A is closed. The volume of the P1 volume 106A is measured and stored in the memory 280A of the apparatus controller 200A. The mass flow into the P1 volume 106A is calculated using the measured pressure from the pressure transducer 130A and the current temperature combined with the time based derivative of the Ideal Gas law. Thus, the calculation of mass flow into the P1 volume 106A is:

$$\text{Massflow(sccm)} = dP\text{(atm)}/dt\text{(min)} * V\text{(cc)} * \text{Temp}_{reference}(\deg K)/\text{Temp}_{current}(\deg K)$$

Thus, the mass flow in sccm is equal to the change in pressure in atm per time in minutes multiplied by the volume of the P1 volume 106A times the reference temperature in degrees Kelvin divided by the current temperature in degrees Kelvin. In the semiconductor industry, the reference temperature is defined to be 273.15° Kelvin (0° C.). The change in pressure is the pressure drop from the gas source to the P1 volume 106A, as regulated by the proportional valve 120A. The apparatus controller 200A can then adjust the rate of increase of pressure in the P1 volume 106A to achieve the three boundary conditions of target pressure and mass flow rate into the P1 volume 106A at the turn on time $t_2$. By controlling the mass flow rate into the P1 volume 106A, the position of the proportional valve 120A is controlled. This is because the mass flow rate across the proportional valve 120A is determined by the position of the closure member of the proportional valve 120A. In yet other embodiments, the apparatus controller 200A only drives the mass flow rate into the P1 volume 106A at the turn on time $t_2$ without achieving the pre-flow pressure at the turn on time $t_2$. This can allow even faster transient turn on time performance at the expense of some overshoot during initial opening of the on/off valve 150A.

The exact method of reaching the boundary conditions may vary. For instance, the pressurization profile may have a linear ramp of pressure in the P1 volume 106A during the priming period. Alternately, a non-linear profile, a plurality of linear ramps, or other profiles may be used. In yet other embodiments, the target pressure may be sculpted to achieve the predetermined mass flow rate into the P1 volume 106A through the use of a variety of profiles. This may include combinations of several different curves to achieve the desired pressurization profile. Depending on the commanded mass flow rate and the amount of time available, a wide range of profiles may be employed. In some embodiments, the pressurization profile or the time to complete the pressurization profile may be constant regardless of the predetermined flow rate. In yet other embodiments, the pressurization profile or the time to complete the pressurization profile may vary based on the predetermined flow rate or the time available before the turn on time $t_2$.

In one very simple pressurization profile, it is conceived that the proportional valve 120A is opened to flow a constant mass flow rate equal to the predetermined mass flow rate through the apparatus 100A. Thus, the P1 volume 106A is simply filled at a constant mass flow rate and the pressure in the P1 volume 106A is represented by the area under the mass flow rate profile. The proportional valve 120A must then be opened at a calculated time in advance of the turn on time $t_2$ in order to reach the desired pressure in the P1 volume. For greater predetermined mass flow rates, this advance time must decrease. Thus, this algorithm requires significant advance notice of the turn on time $t_2$ in order to operate effectively for all predetermined mass flow rates. Furthermore, decreasing the mass flow rates used to fill the P1 volume 106A during the priming period further increases the amount of time required prior to the turn on time $t_2$.

In alternate profiles, it is conceived that the proportional valve 120A may be opened such that the mass flow rate into the P1 volume 106A progressively increases in advance of the turn on time $t_2$. For small predetermined mass flow rates, the proportional valve 120A may be commanded to open such that the mass flow rate across the proportional valve 120A increases as the turn on time $t_2$ approaches. The slope of the pressurization profile may increase for greater predetermined mass flow rates because the P1 volume 106A pressurizes more quickly at greater predetermined mass flow rates. It is not necessary that the mass flow rate across the proportional valve 120A be limited to constant or increasing slope. Instead, it is conceived that for some predetermined mass flow rates, the proportional valve 120A is commanded to deliver a mass flow rate greater than that required to achieve the predetermined mass flow rate. This will pressurize the P1 volume 106A even more quickly than a constant slope pressurization profile. Then, the mass flow rate across the proportional valve 120A can be gradually reduced. The mass flow rate across the proportional valve 120A can end at the predetermined mass flow rate when the turn on time $t_2$ elapses.

As can be seen, the flow rate across the proportional valve 120A may be linear, exponential, or any other profile required to achieve the desired boundary conditions. Furthermore, the pressure in the P1 volume 106A is always equal to the area under the mass flow rate profile used to pressurize the P1 volume 106A. Thus, although the target pre-flow pressure in the P1 volume 106A may be achieved by opening the proportional valve 120A to enable a slow bleed, this would not position the proportional valve 120A such that it delivers the predetermined mass flow rate after the opening of the on/off valve 150A. Accordingly, a significant correction of the proportional valve 120A position would be required, lengthening transient turn on time and adversely affecting stability of the delivered mass flow rate through the apparatus.

A plurality of profiles may be employed to optimize the transient turn on time. In yet other embodiments, a plurality of different pressurization profiles may be employed for a range of different predetermined mass flow rates. This can minimize the required priming period before the transient turn on time $t_2$. Thus, the behavior of the apparatus 100A may be optimized for a wide range of process requirements. The accuracy of the delivered flow, the transient turn on time, and the minimum priming period may all be tuned using customized pressurization profiles.

Figure 32:
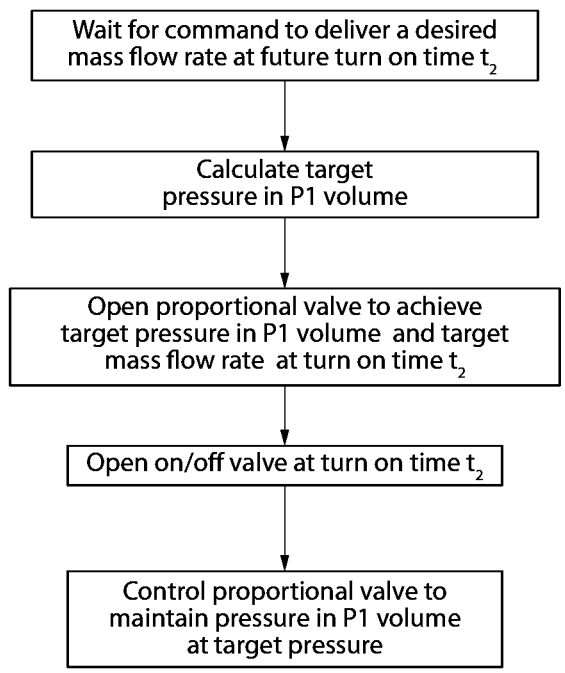
FIG. 32 is a flow chart illustrating a third method of improving transient turn on performance.
Figure 33:
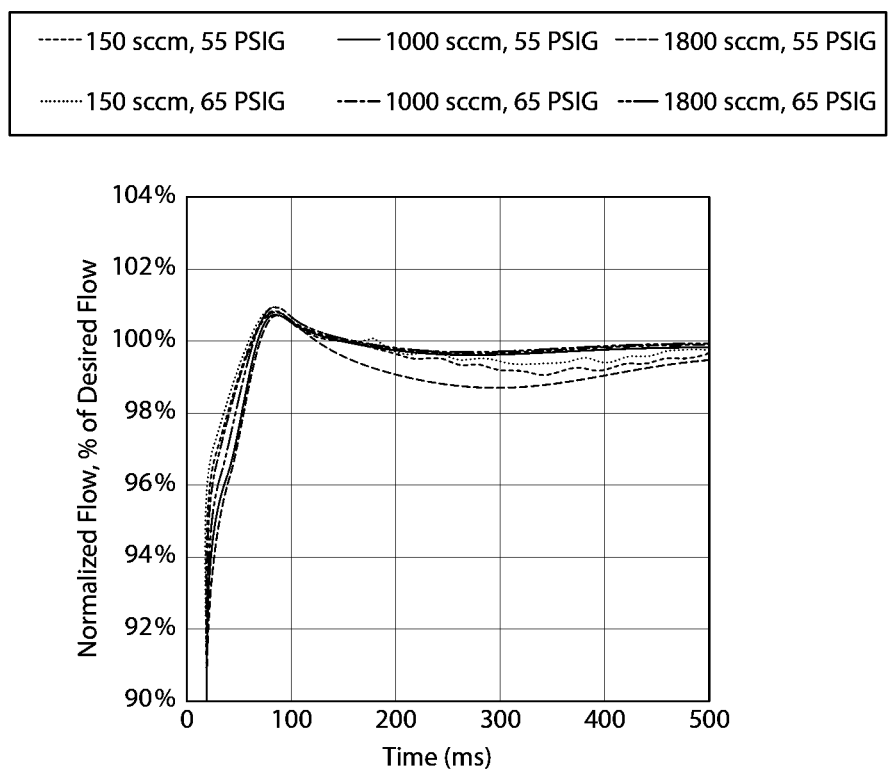
FIG. 33 is a graph illustrating normalized mass flow rates resulting from implementation of the method of FIG. 32.

Test results for the apparatus 100A implementing one embodiment of the method of FIG. 32 are shown in FIG. 33. This method employs a linear ramp of the mass flow rate across the proportional valve 120A to reach the predetermined mass flow rate through the proportional valve 120A at the turn on time $t_2$. This method delivers greatly improved transient turn on performance as compared with commercially available apparatuses. Predetermined mass flow rates of 150 sccm, 1000 sccm, and 1800 sccm were tested on an apparatus 100 rated at 1500 sccm. Process gas supply pressures of 480 kpa (55 psig) and 549 kpa (65 psig) were tested for all predetermined mass flow rates. As can be seen, the delivered mass flow rate rises rapidly to the predetermined mass flow rate for all tested flow rates and supply pressures. It overshoots the predetermined flow rate, then falls slightly before settling out. The worst droop occurs with the 1800 sccm, 55 psi test. However, this drops only approximately 1% of the predetermined flow rate, and all of the transient turn on times are significantly less than 100 milliseconds for a stability window of plus or minus 2%. Settling times are also greatly improved, regardless of process gas supply pressure. The method of FIG. 32 delivers transient turn on time which far exceeds that of commercially available apparatuses.

Figure 34:
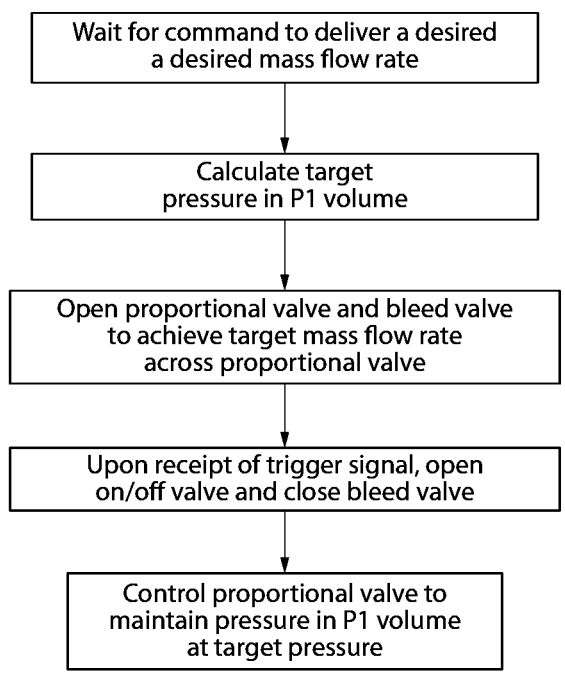
FIG. 34 is a flow chart illustrating a fourth method of improving transient turn on performance.

FIG. 34 discloses a fourth method of improving transient turn on time. This method utilizes one of the apparatuses 500A, 600A shown in FIGS. 30A and 30B. In these methods, the proportional valve 120A is driven such that the target pre-flow pressure is achieved in the P1 volume 106A in response to the gas flow activation signal. Simultaneously, the mass flow rate across the proportional valve 120A is also driven to the predetermined mass flow rate and the bleed valve 170A is opened. Optionally, the pressurization profile may be adjusted to account for the bleed of gas from the volume. The bleed valve 170A is driven to maintain the target pre-flow pressure in the P1 volume 106A. Upon receipt of a trigger signal, the on/off valve 150A is opened and the bleed valve 170A is closed. This allows the apparatus to quickly deliver gas at the predetermined flow rate without requiring exact timing for the turn on time $t_2$.

Thus, it is possible to bleed excess gas to maintain the target pre-flow pressure in the P1 volume 106A while simultaneously maintaining the proportional valve 120A at the predetermined flow rate. In the embodiments where a fixed characterized restrictor and on/off valve are used, such as the embodiment shown in FIG. 30B, it is possible to maintain the target pre-flow pressure in the P1 volume 106A by varying the mass flow rate across the proportional valve 120A. Although this does not guarantee that the proportional valve 120A delivers the desired flow rate at the turn on time $t_2$ when the turn on time is not known, it ensures that the closure member of the proportional valve 120A is close to the desired position. The same technique can be applied to a gas flow activation signal including the turn on time $t_2$ with similar benefits in reduced transient turn on times. Improved performance can be obtained when the turn on time $t_2$ is known, but this is not strictly necessary. Greatly reduced transient turn on times can still be achieved without known turn on times $t_2$ as compared with current commercially available devices.

This offers a further improvement because three boundary conditions are met simultaneously. By controlling the mass flow rate across the proportional valve 120A at the turn on time $t_2$, the delivered mass flow rate through the apparatus 100A will settle to very near the predetermined mass flow rate. Furthermore, the proportional valve 120A will not need to move significantly to maintain the pressure in the P1 volume at the target pressure.

In further enhancements, the performance of the apparatus may be characterized such that offsets such as the response time of the on/off valve 150A may be quantified. The on/off valve 150A may be opened some additional time in advance of the turn on time $t_2$ to further improve system response. For instance, if the response time of the on/off valve 150A is 50 milliseconds, the on/off valve 150A may be opened at the opening time $t_2$ minus 50 milliseconds to ensure that flow begins at exactly turn on time $t_2$. The proportional valve 120A mass flow rate would then be adjusted accordingly, such that the mass flow rate into the P1 volume 106A equals the predetermined mass flow rate at the time the on/off valve 150A is opened. Other response times such as the dead time for the PID control loop may also be characterized to optimize system response. The necessary offsets may be incorporated for the control loop or other delays in the apparatus controller 200A. In some cases, it is conceived that the system response may vary depending on the mass flow rate, so a map of advance opening times may be stored in the memory 280A of the apparatus controller 200A. The advance opening times may be applied depending on the predetermined flow rate to achieve optimum system response.

In yet other embodiments, the mass flow rate across the proportional valve 120A may be adjusted to further optimize the resulting mass flow rate and transient turn on time. It is conceivable that the mass flow rate across the proportional valve 120A may reach the predetermined mass flow rate at some time in between the opening of the on/off valve 150A and the turn on time $t_2$. Thus, the mass flow rate across the proportional valve 120A may remain constant until the turn on time $t_2$. This ensures that the closure member of the proportional valve 120A is already in position at the turn on time $t_2$. Thus, momentum of the closure member of the proportional valve 120A is minimized. The proportional valve 120A can respond to needed changes to maintain the delivered flow rate at the predetermined flow rate as fast as possible, regardless of whether the flow should be increased or decreased to maintain the delivered flow rate at the predetermined flow rate.

Section III

The present invention is directed to an apparatus for splitting a flow of process gas into two individual flows of process gas having a known ratio. In some embodiments, the apparatus may also function as a mass flow controller to deliver a known mass flow of gas to a semiconductor or similar process. Semiconductor fabrication is one industry which demands high performance in control of gas flows. As semiconductor fabrication techniques have advanced, customers have recognized the need for splitting a gas flow into two or more separate flows having known ratios. Modern semiconductor processes require that the mass of the gas flow is tightly controlled, the response time minimized, and the ratio between the gas flows is highly accurate. The present invention delivers improved dynamic performance while maintaining exceptional accuracy in the flows delivered. Furthermore, mixtures of a variety of gases may be split with no loss of accuracy in the delivered ratio of flows.

Figure 35:
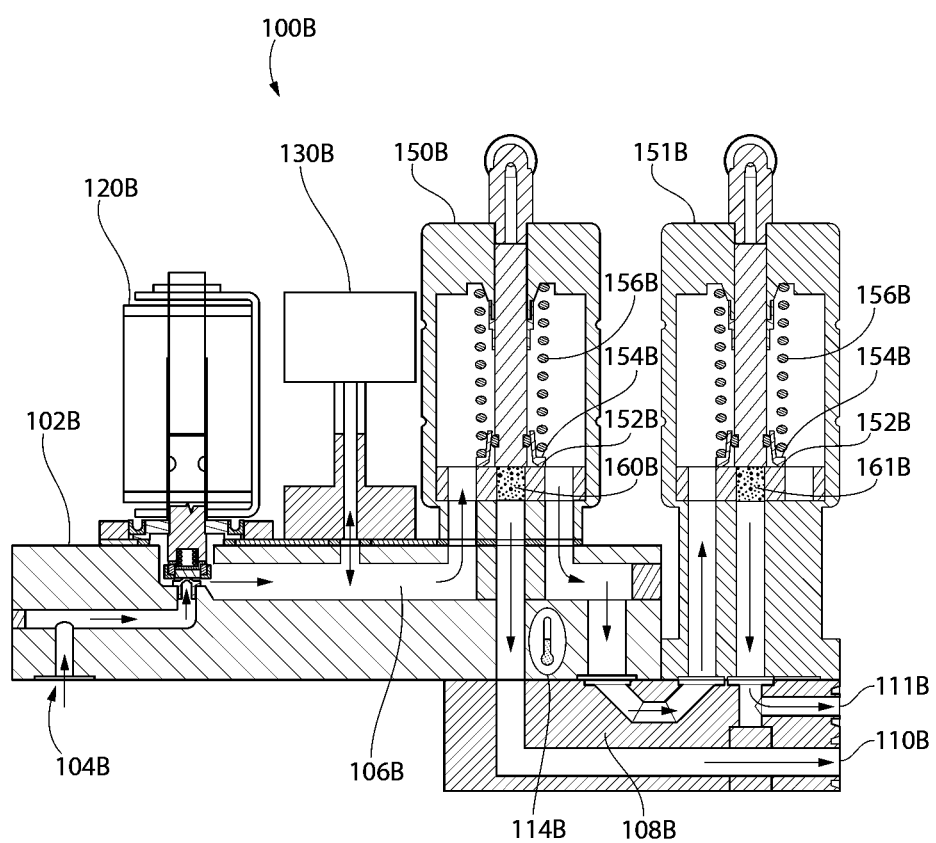
FIG. 35 is a schematic view of an apparatus for controlling gas flow showing the flow path of the process gases through the apparatus.

FIG. 35 shows a schematic view of an apparatus for controlling flow 100B. The flow path of the process gas is indicated by arrows which illustrate the path that the process gas takes through the apparatus 100B. The apparatus 100B has a base 102B comprising an inlet 104B and an outlet 110B. A supply of process gas is delivered to the inlet 104B of the base 102B. The process gas then flows through a proportional valve 120B into a P1 volume 106B within the base 102B. The proportional valve 120B meters the mass flow of process gas which passes to the P1 volume 106B. The proportional valve 120B is capable of providing proportional control of the process gas such that it need not be fully open or closed, but instead may have intermediate states to permit control of the mass flow rate of process gas.

A P1 pressure transducer 130B is fluidly coupled to the P1 volume 106B so that the P1 pressure transducer 130B can sample the pressure within the P1 volume 106B. In some embodiments, the P1 pressure transducer 130B is physically coupled to the base 102B, while in others it is remotely mounted and coupled via a tube, hose, or another component such as the proportional valve 120B. Next, the process gas flows out of the P1 volume 106B into a first on/off valve 150B. Internal to the first on/off valve 150B is a valve seat 152B and a closure member 154B. When the apparatus 100B is delivering process gas, the first on/off valve 150B is in an open state, such that the valve seat 152B and the closure member 154B are not in contact. This permits flow of the process gas, and provides a negligible restriction to fluid flow. When the first on/off valve 150B is in a closed state the closure member 154B and the valve seat 152B are biased into contact by the spring 156B, stopping the flow of process gas through the first on/off valve 150B.

Downstream of the valve seat 152B, a first flow restrictor 160B is introduced into the flow path to meter flow. The first flow restrictor 160B provides a restriction to fluid flow, or flow impedance. In some embodiments, the flow impedance is known. However, it is also conceived that the flow impedance of the first flow restrictor 160B may not be known. In yet other embodiments, the first flow restrictor 160B may be located upstream of the first on/off valve 150B. The first flow restrictor 160B may be selected to have a specific flow impedance so as to achieve a desired range of gas flow rates. The flow impedance does not need to be characterized across the entire range of anticipated gas flows. Instead, it may merely be selected to have an approximate flow impedance.

The first flow restrictor 160B may be formed as a porous block, a device having small orifices or channels, or any other means of providing a restriction to process gas flow that is consistent and repeatable across a target dynamic operating range of mass flow rates. The first flow restrictor 160B has a greater resistance to flow than the passages upstream and downstream of the first flow restrictor 160B. After passing through the flow restrictor 160B, the process gas exits through the first outlet 110B. Generally, the first outlet 110B of the apparatus 100B is coupled to a first process header, the first process header directing a plurality of process gases to a first applicator in the processing chamber, the processing chamber being the part of the process equipment where articles are processed.

The P1 volume 106B is also fluidly coupled to a second on/off valve 151B, the second on/off valve also having a valve seat 152B and a closure member 154B, similar to the first on/off valve 150B. When in the open state, the second on/off valve 151B allows gas to flow from the P1 volume 106B, through a second flow restrictor 161B, to a second outlet 111B. The second flow restrictor 161B may have the same or different construction as the first flow restrictor 160B. Like the first flow restrictor 160B, the second flow restrictor 161B may be located either upstream or downstream of the valve seat 152B of the on/off valve 151B. In all cases, the second flow restrictor 161B has a greater resistance to flow than the passages upstream and downstream of the second flow restrictor 161B. In some embodiments, the second flow restrictor 161B has the same resistance to flow as the first flow restrictor 160B. In other embodiments, the second flow restrictor 161B has a greater or lesser resistance to flow as compared with the first flow restrictor 160B. The second outlet 111B is connected to a second process header which directs a plurality of process gases to a second applicator in the processing chamber. In yet other embodiments, the first and second on/off valves 151B, 152B may be replaced with a plurality of similar valves. In yet other embodiments, the first and second on/off valves 151B, 152B may be substituted for proportional valves.

In some embodiments, the proportional valve 120B, pressure transducer 130B, and first and second on/off valves 150B, 151B are all directly mounted to the base 102B while the first and second flow restrictors 160B, 161B are mounted to the first and second on/off valves 150B, 151B. Thus, the first and second flow restrictors 160B, 161B are indirectly coupled to the base while the proportional valve 120B, pressure transducer 130B, and first and second on/off valves 150B, 151B are all directly coupled to the base. In yet other embodiments, each of the proportional valve 120B, pressure transducer 130B, first and second on/off valves 150B, 151B, and first and second flow restrictors 160B, 161B are directly coupled to the base 102B. In yet other embodiments, it is possible to remotely mount one or more of the proportional valve 120B, pressure transducer 130B, first and second on/off valves 150B, 151B, and first and second flow restrictors 160B, 161B such that they are operably coupled but neither directly nor indirectly mounted to the base 102B. In yet other embodiments, the base 102B may be omitted.

Optionally, the apparatus 100B comprises one or more P2 pressure transducers downstream of the flow restrictors 160B, 161B and the on/off valves 150B, 151B. The P2 pressure transducer is used to measure the pressure differential across the flow restrictors 160B, 161B. In some embodiments, the pressure downstream of only one of the two flow restrictors 160B, 161B is measured. In other embodiments, the pressure downstream of both of the flow restrictors 160B, 161B is measured. In yet other embodiments, the P2 pressure downstream of either or both flow restrictors 160B, 161B may be obtained from another apparatus 100B connected to the first or second process header, with the readings communicated to the first apparatus 100B.

Optionally, temperature sensors may be employed to further enhance the accuracy of the apparatus 100B. A temperature sensor 114B is shown in FIG. 35, located within the base 102B so that it can measure the temperature near the P1 volume 106B. Additional temperature sensors 114B may be employed in a variety of locations, including the proportional valve 120B, the pressure transducer 130B, and the first and second on/off valves 150B, 151B.

In yet a further embodiment, the apparatus 100B may omit the proportional valve 120B and the P1 pressure transducer. In this embodiment, the process gas is supplied to the gas inlet 104B at a known pressure. The pressure of the process gas may be varied external to the apparatus 100B and may change over time.

Figure 36:
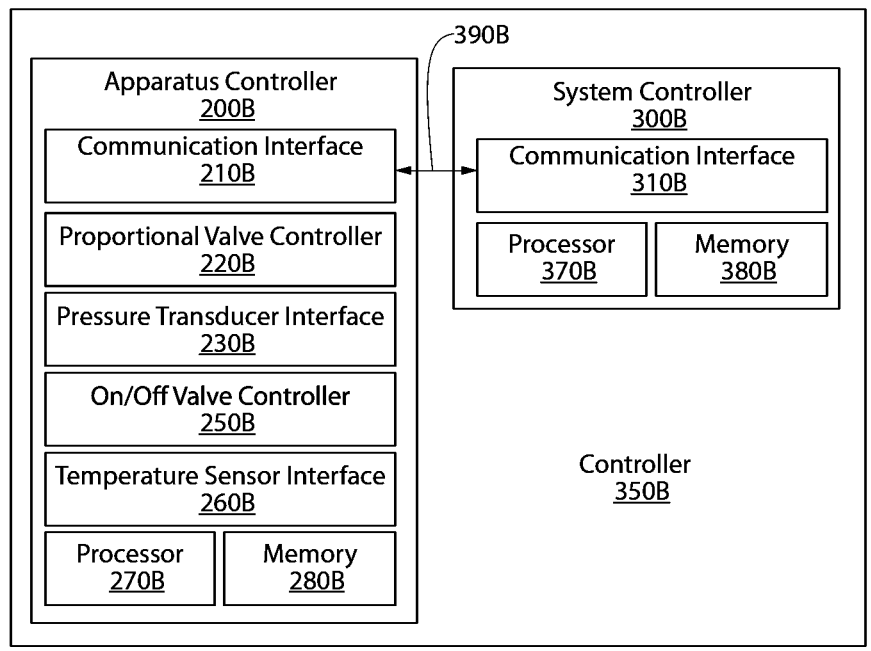
FIG. 36 is a block diagram illustrating the control system for the apparatus of FIG. 35.
Figure 37:
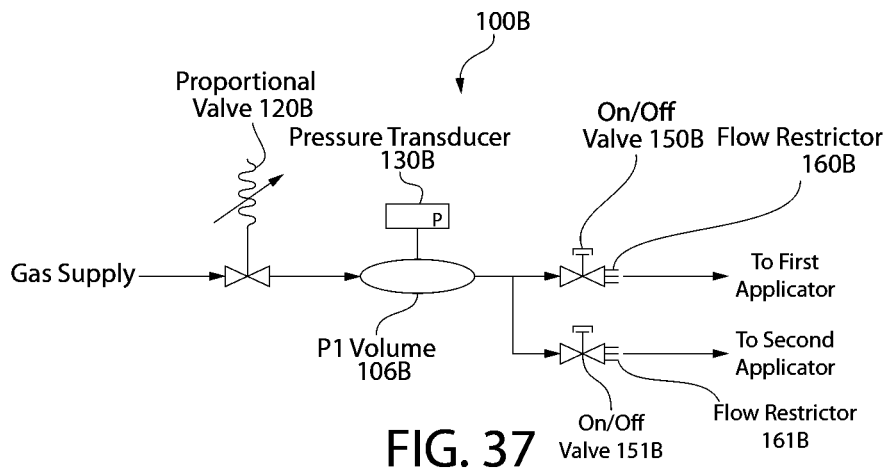
FIG. 37 is a schematic diagram of the apparatus of FIG. 35.

Turning to FIG. 36, a block diagram illustrates the control system for the apparatus 100B of FIG. 35. This block diagram shows a controller 350B which comprises an apparatus controller 200B and a system controller 300B. The apparatus controller 200B provides all control functions for the apparatus 100B. The apparatus controller 200B has a communication interface 210B, a proportional valve controller 220B, a pressure transducer interface 230B, an on/off valve controller 250B, a temperature sensor interface 260B, a processor 270B, and memory 280B. The communication interface 210B is configured to provide a communications link between the apparatus controller 200B and the system controller 300B. Optionally, the temperature sensor interface 260B may be omitted if the additional accuracy provided by the temperature sensor 114B is not required.

The system controller 300B has a corresponding communication interface 310B, a processor 370B, and memory 380B. The system controller 300B coordinates all high-level functions necessary to perform the desired process. The communication interface 310B of the system controller 300B sends and receives commands through a communications bus 390B. The communications bus 390B connects to the communication interface 210B of the apparatus controller 210B of the apparatus 100B. The communications bus 390B may connect to a single apparatus controller 200B, or it may connect to a plurality of apparatus controllers 200B, each apparatus controller 200B operating a distinct device. Not all apparatus controllers 200B need control an apparatus for controlling gas flow 100B. Instead, other types of process equipment may also be controlled. Furthermore, there may be a plurality of communications buses 390B to connect all the devices required to perform the desired process.

The apparatus 100B according to the present invention is capable of serving several roles in a system for processing articles. In one configuration, the apparatus 100B is used with a process gas having a known composition. In this configuration, either one of the first and second on/off valves 150B, 151B may be operated to deliver a known mass flow rate of the process gas to either one of the first or second process headers. In this way, a single apparatus 100B can serve as a mass flow controller for two separate applicators. Full control over a wide range of mass flow rates can be achieved for both applicators. However, this configuration requires that the memory 280B of the apparatus controller 200B store a gas map containing information permitting precise calculation of the pressure drop across one or more of the flow restrictors 160B, 161B required to achieve a predetermined mass flow rate at the respective outlet 110B, 111B. The gas map must be calibrated for the process gas utilized and corresponds to the flow impedance of the flow restrictors 160B, 161B across the operating range of the apparatus 100B.

In a second configuration, the apparatus 100B is used to simultaneously deliver process gas at a known ratio to the outlets 110B, 111B. The ratio is determined by the ratio of the flow impedances of the first and second flow restrictors 160B, 161B. Thus, it is possible to simultaneously deliver two flows of process gas to the first and second outlets 110B, 111B at a fixed ratio. In this configuration, the composition of the process gas does not need to be known, and may vary with time. This is because the ratio of the flow rates is determined by the ratio of the resistances to flow of the flow restrictors 160B, 161B and remains constant regardless of the gas mixture. There is no need to store a gas map for the process gas in the memory 280B of the apparatus controller 200B in this configuration.

In the second configuration, it is also possible to accurately control a mass flow rate of one of the two flows delivered to the outlets 110B, 111B while simultaneously providing a known ratio between the flow flows. This requires a known composition of gas and an appropriately calibrated gas map, but permits the user to split the flow of process gas into two separate flows while simultaneously controlling the mass flow rate at one of the two outlets.

By controlling the ratio between the flow impedances for each of the flow restrictors 160B, 161B, an accuracy of 99% or greater can be achieved for the splitting of the flow of process gas, even where the mixture of process gas is unknown. In some embodiments, it is also possible to extend the apparatus 100B to include more than two on/off valves 150B, 151B to split the process gas into three or more different flows of known ratios. It is also possible to provide two or more proportional valves 120B in the same device, with each proportional valve 120B directly connected to a single on/off valve, enabling separate control of the pressure differential across each of the flow restrictors 160B, 161B. This enables variable control over the flow ratio between the outlets.

The present invention also minimizes flow spikes and reduces the transient turn-on and turn-off times for the flows of process gas. By locating the flow restrictors 160B, 161B in the respective on/off valves 150B, 151B, the volume that must be charged or bled during turn-on and turn-off is minimized. The time required to start and stop flow is largely driven by the speed at which the on/off valves 150B, 151B can open and close, and pressure and flow pulses are also minimized Typical turn-on times for the on/off valves 150B, 151B are between 50 and 100 milliseconds, permitting exceptionally fast control over the delivery of process gas to the respective applicators in the processing chamber. Furthermore, the pressure of the process gas supplied to the apparatus 100B is unimportant because the ratio between the mass flow rates remains constant regardless of the supplied pressure.

Figure 38:
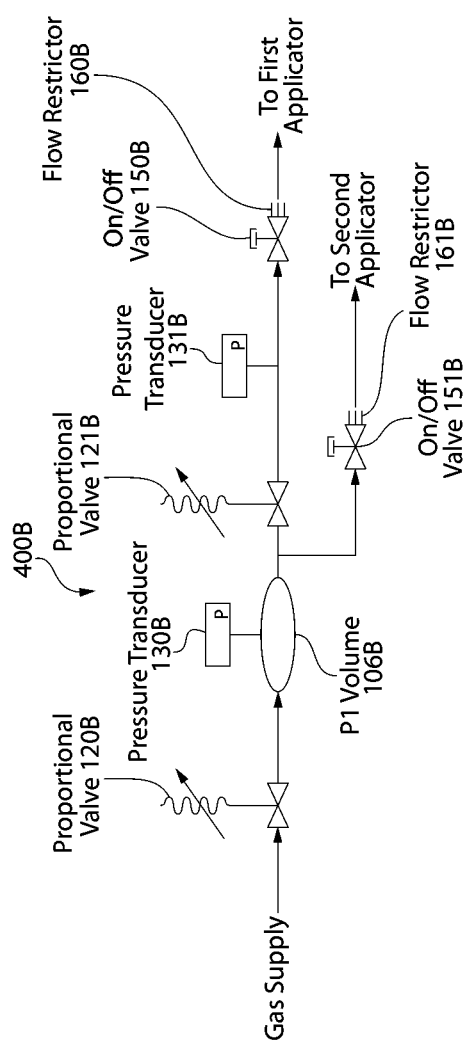
FIG. 38 is a schematic diagram of another embodiment of the invention having an additional proportional valve.

In yet another embodiment shown schematically in FIG. 38, an apparatus 400B has a second proportional valve 121B and a second pressure transducer 131B are incorporated in the gas flow path between the P1 pressure transducer and the first on/off valve 150B. A second pressure transducer 131B monitors the pressure between the proportional valve 121B and the flow restrictor 160B. This variation enables independent control of gas flows delivered to both the first and second applicators. It is possible to deliver gas flows which deviate from the ratio of the flow impedance between the first and second flow restrictors 160B, 161B by separately controlling the pressure of the gas in the P1 volume 106B and the pressure between the proportional valve 121B and the first flow restrictor 160B. In some embodiments, the second pressure transducer 131B may be omitted.

Figure 39:
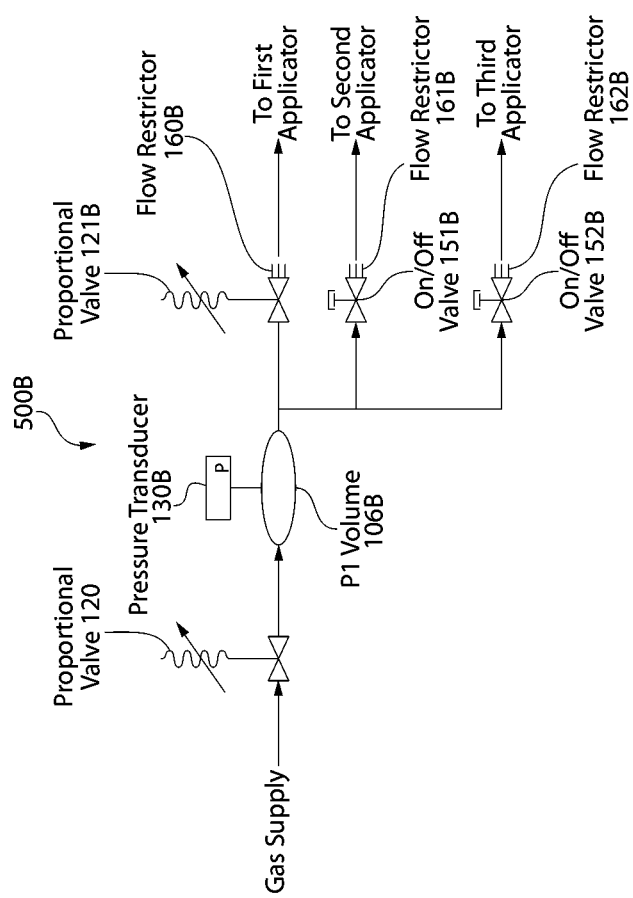
FIG. 39 is a schematic diagram of another embodiment of the invention having three gas outlets.

In the embodiment shown schematically in FIG. 39, three separate gas outlets are shown in an apparatus 500B. The three gas outlets may be directed to first, second, and third applicators, or may be combined or divided further downstream as desired for a particular process. The apparatus substitutes the first on/off valve 150B for a second proportional valve 121B. This allows three separate gas flows to be delivered at known ratios determined by the combination of the first, second, and third flow restrictors 160B, 161B, 162B when the proportional valve 121B, the second on/off valve 151B, and the third on/off valve 152B are all in the fully open state. Furthermore, the valves 121B, 151B, 152B may be selectively closed to deliver specific mass flows to one gas outlet at a time, or the gas may be split into two flows by closing only one of the three valves 121B, 151B, 152B. Furthermore, the substitution of the proportional valve 121B for the first on/off valve 150B enables further control of the gas flow delivered to the first gas outlet. This arrangement is similar to that of FIG. 38. It will be noted that the second pressure transducer 131B of FIG. 38 is not required in all embodiments.

Figure 40:
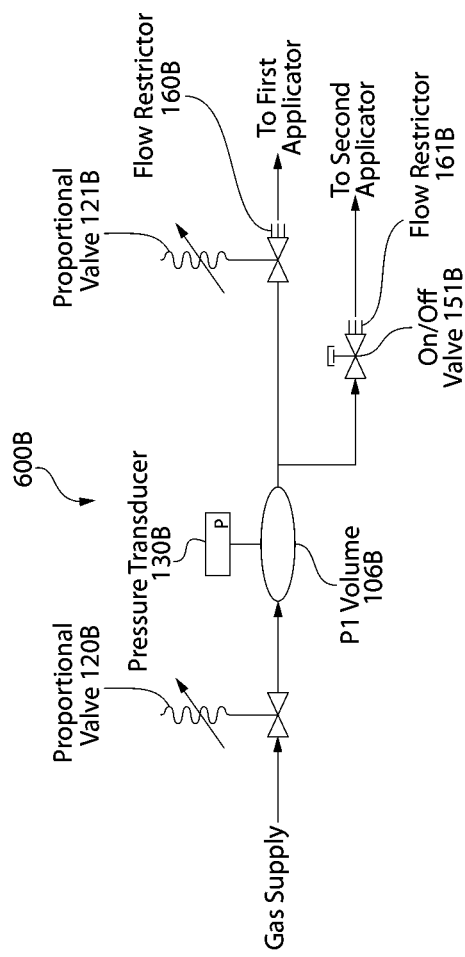
FIG. 40 is a schematic diagram of another embodiment of the invention utilizing two proportional valves and a single on/off valve.

In the embodiment of FIG. 40, an apparatus 600B has a proportional valve 121B in lieu of a first on/off valve. This enables identical function to the apparatus 100B with the added capability of further varying the gas flow rates through the gas outlets as discussed above. Nearly total control over the flow rates can be achieved with this configuration without the need for two separate mass flow controllers. Furthermore, approximate flow splitting can be achieved even when the exact composition of the gas is not known.

In a first method of operating the apparatuses, a process gas having a known composition is supplied to the inlet 104B. The system controller 300B transmits a command to the apparatus controller 200B to flow gas from the first outlet 110B at a predetermined mass flow rate. In response, the proportional valve 120B is opened to permit the process gas to flow into the P1 volume 106B. The first on/off valve 150B is opened while the second on/off valve 151B is closed. The apparatus controller 200B causes the proportional valve 120B to adjust its position to adjust the pressure in the P1 volume 106B based on feedback from the P1 pressure transducer 130B. This causes a known mass flow rate to be delivered through the first on/off valve 150B and the first flow restrictor 160B, and out of the first outlet 110B. Subsequently, the apparatus controller 200B receives a command to flow gas through the second outlet 111B at a predetermined mass flow rate. The first on/off valve 150B is closed and the second on/off valve 151B is opened. The proportional valve 120B adjusts its position to drive the pressure in the P1 volume 106B to the pressure required to deliver the predetermined flow rate. In this method, a gas map which is accurately calibrated to the process gas being used is loaded into the memory 280B of the apparatus controller 200B, which ensures that the correct mass flow rate is delivered to the appropriate outlet. Furthermore, the flow impedance for each of the flow restrictors 160B, 161B is known with a high degree of accuracy. In some embodiments, there may be one gas map for each of the flow restrictors 160B, 161B to ensure even greater accuracy.

In a second method, a process gas having known or unknown composition is supplied to the inlet 104B. The system controller 300B transmits a command to flow gas to both of the outlets 110B, 111B. In response, the proportional valve 120B and the on/off valves 150B, 151B open and the process gas flows out of both outlets 110B, 111B. The flow rate may be adjusted by altering the position of the proportional valve 120B. In the event that the process gas is known, one of the outlets 110B, 111B may be driven to a specific mass flow rate based on a calibrated gas map. In the event that the process gas is unknown, an estimated gas map may be used to drive the mass flow rate through one of the outlets 110B, 111B. The flows from the outlets 110B, 111B may be halted by closing one or more of the on/off valves 150B, 151B.

In a third method, a process gas of known or unknown composition is supplied to the inlet 104B. The system controller 300B transmits a command to transition the first on/off valve 150B to the fully open state and the second on/off valve 151B to the fully closed state. A controlled flow of process gas is delivered to the first gas outlet 110B and no gas is delivered to the second gas outlet 111B. Subsequently, the system controller 300B transmits a command to transition the first on/off valve 150B to the fully closed state and the second on/off valve 151B to the fully open state. This results in the delivery of a controlled flow of process gas to the second gas outlet 111B while no gas is delivered to the first gas outlet 110B. Subsequently, the system controller 300B transmits a command to transition both the first and second on/off valves 150B, 151B to the fully open state. First and second controlled flows of process gas are delivered to the first and second gas outlets 110B, 111B. In other embodiments of this method, the sequence is altered such that the second on/off valve 151B is opened before the first on/off valve 150B or the first or second on/off valves 150B, 151B are closed to transition from delivering process gas to the first and second gas outlets 110B, 111B to delivering process gas to only one of the first and second gas outlets 110B, 111B. In yet other embodiments, a proportional valve 121B may be substituted for one or both of the first and second on/off valves 150B, 151B and may be operated at a state intermediate between the fully open and fully closed states. In yet other embodiments, a second proportional valve 121B may be introduced upstream of either one of the first and second flow restrictors 160B, 161B.

Section IV

The present invention is directed to a laminar flow restrictor for use in an apparatus for controlling gas flow. In some embodiments, the apparatus may function as a mass flow controller to deliver a known mass flow of gas to a semiconductor or similar process. Semiconductor fabrication is one industry which demands high performance in control of gas flows. As semiconductor fabrication techniques have advanced, customers have recognized the need for flow control devices with increased accuracy and repeatability in the mass of the delivered gas flows. Modern semiconductor processes require that the mass of the gas flow is tightly controlled, the response time minimized, and the gas flow is highly accurate. The present invention delivers improved accuracy and repeatability in the delivered flows.

Figure 41:
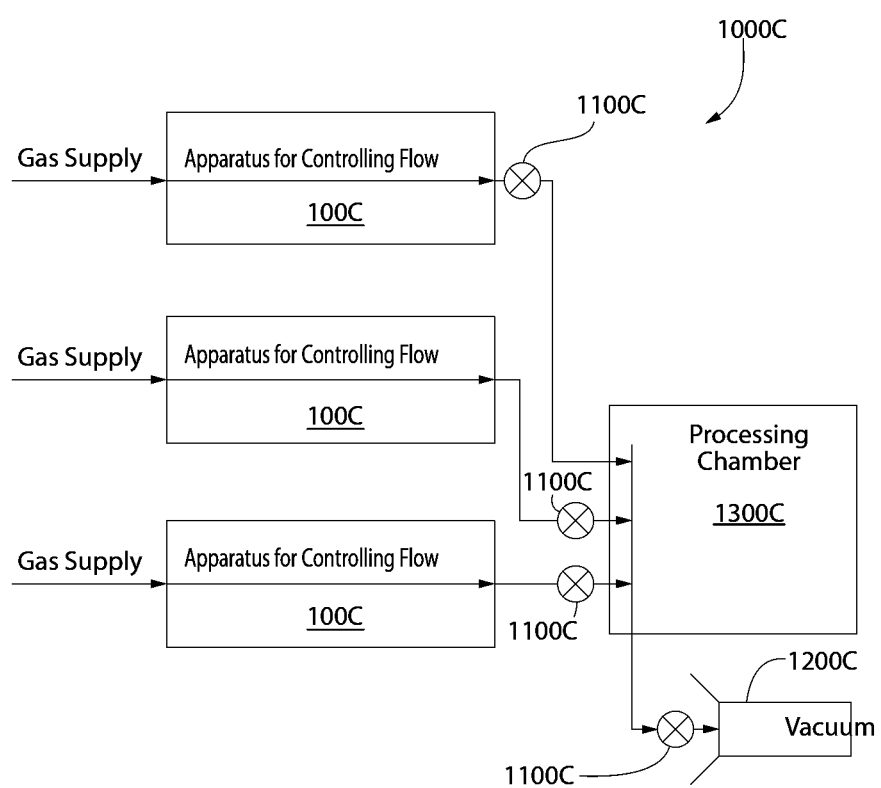
FIG. 41 is a schematic of a process utilizing one or more laminar flow restrictors.

FIG. 41 shows a schematic of an exemplary processing system 1000C utilizing one or more laminar flow restrictors. The processing system 1000C may utilize a plurality of apparatus for controlling flow 100C fluidly coupled to a processing chamber 1300C. The plurality of apparatus for controlling flow 100C are used to supply one or more different process gases to the processing chamber 1300C. Articles such as semiconductors may be processed within the processing chamber 1300C. Valves 1100C isolate each of the apparatus for controlling flow 100C from the processing chamber 1300C, enabling each of the apparatus for controlling flow 100C to be selectively connected or isolated from the processing chamber 1300C, facilitating a wide variety of different processing steps. The processing chamber 1300C may contain an applicator to apply process gases delivered by the plurality of apparatus for controlling flow 100C, enabling selective or diffuse distribution of the gas supplied by the plurality of apparatus for controlling flow 100C. In addition, the processing system 1000C may further comprise a vacuum source 1200C which is isolated from the processing chamber 1300C by a valve 1100C to enable evacuation of process gases or facilitate purging one or more of the apparatus for controlling flow 100C to enable switching between process gases in the same apparatus for controlling flow 100C. Optionally, the apparatus for controlling flow 100C may be mass flow controllers, flow splitters, or any other device which controls the flow of a process gas in a processing system. Furthermore, the valves 1100C may be integrated into the apparatus for controlling flow 100C if so desired.

Processes that may be performed in the processing system 1000C may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 42:
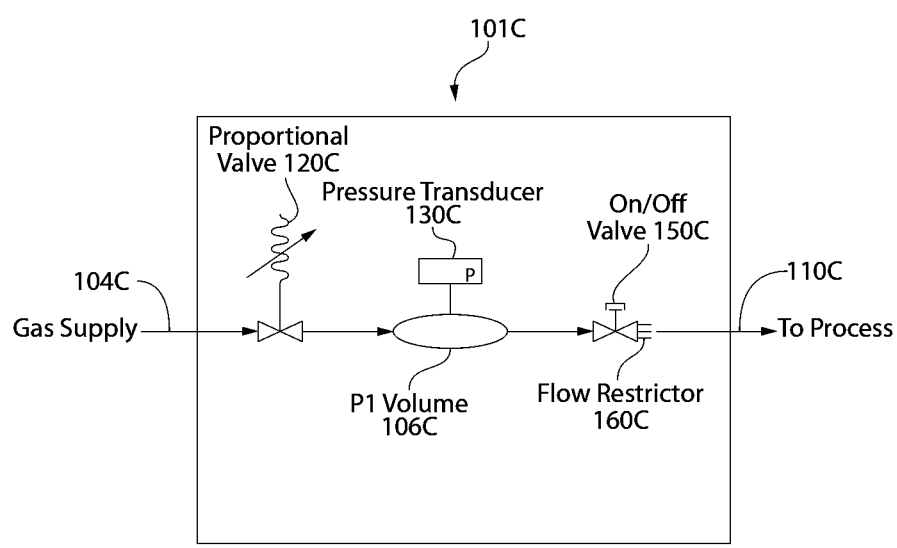
FIG. 42 is a schematic of a mass flow controller as may be utilized in the process of FIG. 41.

FIG. 42 shows a schematic of an exemplary mass flow controller 101C, which is one type of apparatus for controlling flow 100C that may be utilized in the processing system 1000C. The mass flow controller 101C has a gas supply of a process gas fluidly coupled to an inlet 104C. The inlet is fluidly coupled to a proportional valve 120C which is capable of varying the volume of process gas flowing through the proportional valve 120C. The proportional valve 120C meters the mass flow of process gas which passes to the P1 volume 106C. The proportional valve 120C is capable of providing proportional control of the process gas such that it need not be fully open or closed, but instead may have intermediate states to permit control of the mass flow rate of process gas.

A P1 volume 106C is fluidly coupled to the proportional valve 120C, the P1 volume 106C being the sum of all the volume within the mass flow controller 101C between the proportional valve 120C and a flow restrictor 160C. A pressure transducer 130C is fluidly coupled to the P1 volume 106C to enable measurement of the pressure within the P1 volume 106C. An on/off valve 150C is located between the flow restrictor 160C and the proportional valve 120C and may be used to completely halt flow of the process gas out of the P1 volume 106C. Optionally, the flow restrictor 160C may be located between the on/off valve 150C and the proportional valve 120C in an alternate configuration. Finally, the flow restrictor 160C is fluidly coupled to an outlet 110C of the mass flow controller 101C. In the processing system, the outlet 110C is fluidly coupled to a valve 1100C or directly to the processing chamber 1300C.

Internal to the first on/off valve 150C is a valve seat and a closure member. When the apparatus 100C is delivering process gas, the first on/off valve 150C is in an open state, such that the valve seat and the closure member are not in contact. This permits flow of the process gas, and provides a negligible restriction to fluid flow. When the first on/off valve 150C is in a closed state the closure member and the valve seat are biased into contact by a spring, stopping the flow of process gas through the first on/off valve 150C.

The flow restrictor 160C is used, in combination with the proportional valve 120C, to meter flow of the process gas. In most embodiments, the flow restrictor 160C provides a known restriction to fluid flow. The first characterized flow restrictor 160C may be selected to have a specific flow impedance so as to deliver a desired range of mass flow rates of a given process gas. The flow restrictor 160C has a greater resistance to flow than the passages upstream and downstream of the flow restrictor 160C.

Optionally, the mass flow controller 101C comprises one or more P2 pressure transducers downstream of the flow restrictor 160C and the on/off valve 150C. The P2 pressure transducer is used to measure the pressure differential across the flow restrictor 160C. In some embodiments, the P2 pressure downstream of the flow restrictor 160C may be obtained from another apparatus 100C connected to the processing chamber, with the readings communicated to the mass flow controller 101C.

Optionally, temperature sensors may be employed to further enhance the accuracy of the mass flow controller 101C. They may be mounted in the base of the mass flow controller 101C near the P1 volume 106C. Additional temperature sensors may be employed in a variety of locations, including the proportional valve 120C, the pressure transducer 130C, and the on/off valve 150C.

Figure 43:
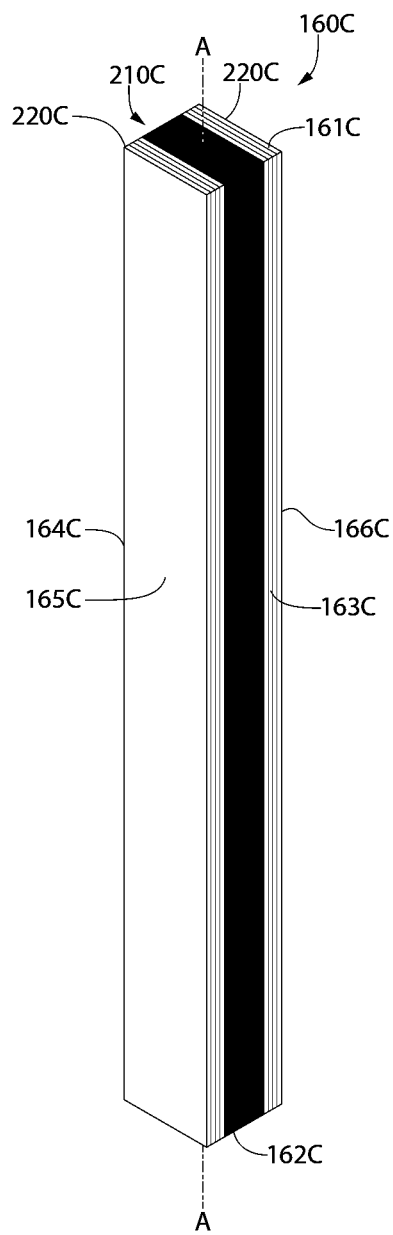
FIG. 43 is a perspective view of a first embodiment of a laminar flow restrictor as may be utilized in the mass flow controller of FIG. 42.
Figure 44:
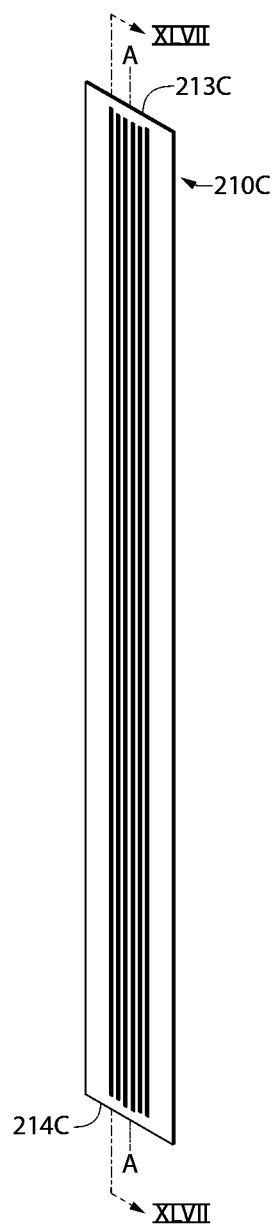
FIG. 44 is a perspective view illustrating a portion of the layers forming the flow restrictor of FIG. 43.

Turning to FIGS. 43-49, a first embodiment of the flow restrictor 160C is shown in greater detail. The flow restrictor 160C is constructed as a plurality of layers forming a restrictor stack 170C. The restrictor stack 170C may take the form of an elongated rectangular shape as shown in FIG. 43. The flow restrictor 160C extends from a first end 161C to a second end 162C along a longitudinal axis A-A. A plurality of layers 210C comprising flow passages are sandwiched between a plurality of outer layers 220C which do not comprise flow passages. The flow restrictor 160C has a first side 163C formed of the pluralities of layers 210C, 220C and an opposite second side 164C. The flow restrictor 160C further comprises a front face 165C and an opposite rear face 166C. The outer layers 220C enclose the flow passages on opposite sides of the layers 210C comprising flow passages. The outer layers 220C may or may not have the same thickness as the layers 210C comprising flow passages. A selection of the layers 210C is shown in FIG. 44, which illustrates portions of the flow passages and the configuration of the layers 210C. Each of the layers 210C extend from a first end 213C to a second end 214C. Portions of the plurality of flow passages can be seen in FIG. 44. The details of the flow passages will be discussed in greater detail below.

Figure 45A:
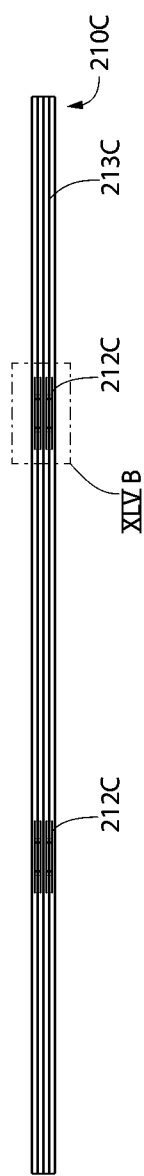
FIG. 45A is an end view of the portion of the flow restrictor of FIG. 44.
Figure 45B:
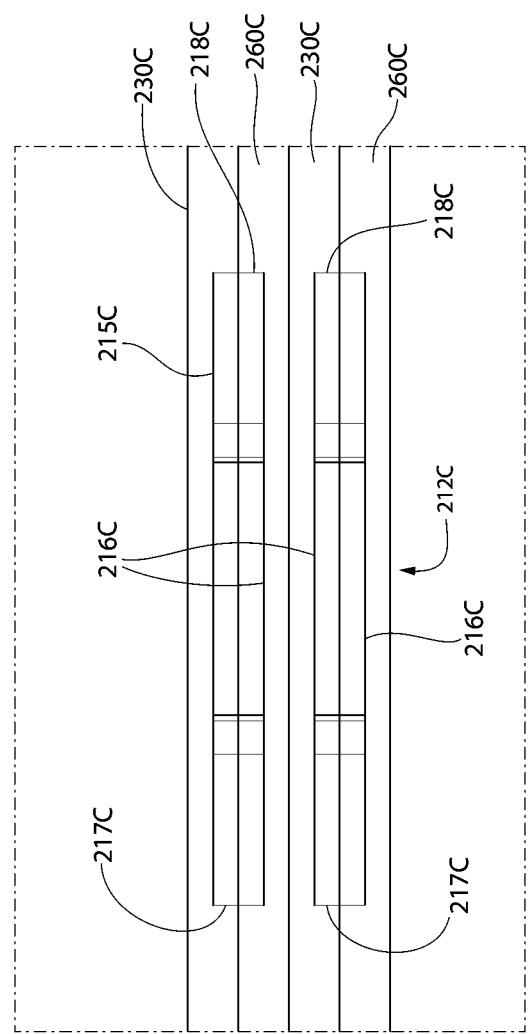
FIG. 45B is a detail view of the area XLVB of FIG. 45A.

Turning to FIGS. 45A and 45B, the layers 210C comprise a plurality of apertures 212C formed at opposite ends 213C, 214C of the layers 210C. This enables gas to flow along the layers 210C from the first end 213C to the second end 214C along the longitudinal axis A-A. In alternate embodiments, the apertures 212C need not be on opposite ends and may instead be formed on adjacent sides or may be formed exclusively on a single end. The apertures 212C may also be formed so that gas flows across the shorter direction of the rectangular layers 210C, perpendicular to the longitudinal axis A-A. The layers 210C also need not be rectangular and may be square or any other desired shape. It is further contemplated that an aperture may be formed into the plane of the layers 210C, permitting gas to flow perpendicular to the planes of the layers 210C, then turn a corner and flow in the plane of the layers 210C. The specific arrangement of the apertures 212C, the shape of the layers 210C, and the shape of the resulting flow restrictor 160C may be adapted as desired depending on the shape of the flow passage which receives the resulting flow restrictor 160C. It is even contemplated that the flow restrictor 160C may have an annular configuration, with apertures 212C formed into a circumference of the flow restrictor 160C and/or apertures 212C formed so that gas flows perpendicular to the planes of some or all of the layers 210C.

Figure 46:
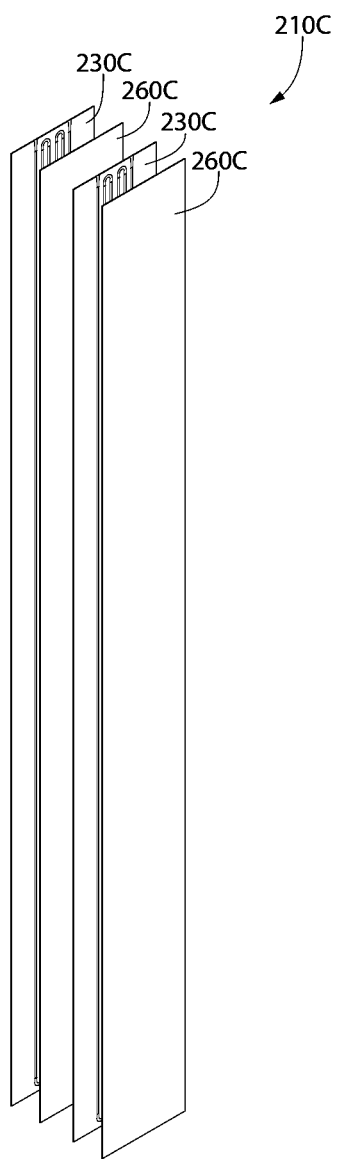
FIG. 46 is an exploded perspective view of the portion of the flow restrictor of FIG. 44.
Figure 47:
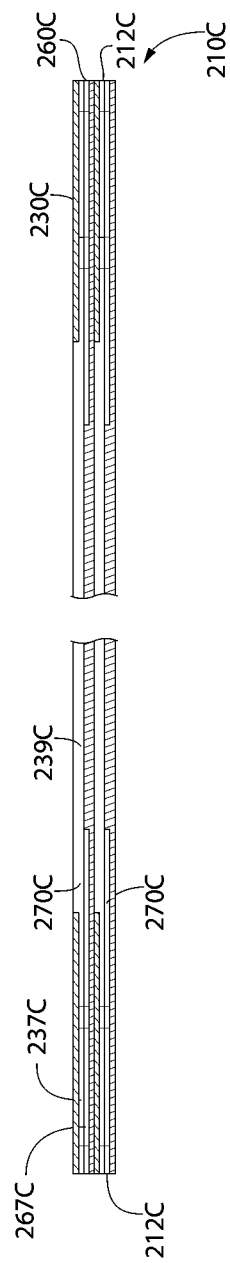
FIG. 47 is a cross-sectional view of the portion of the flow restrictor of FIG. 44, taken along line XLVII-XLVII.
Figure 48:
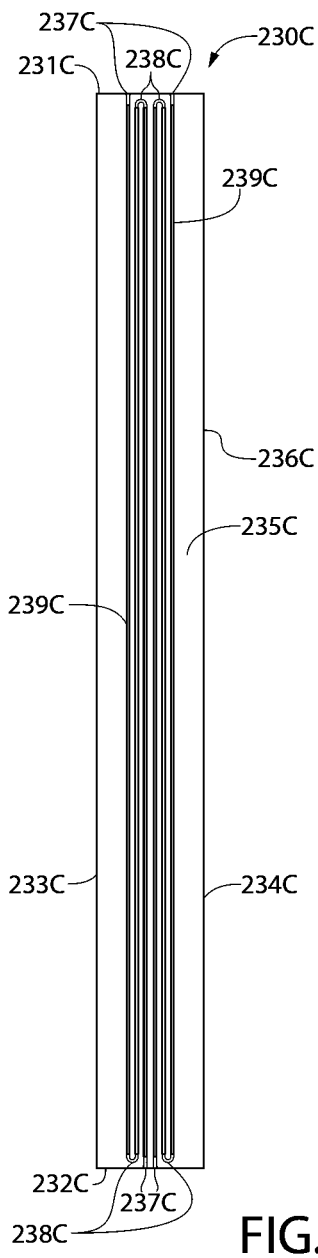
FIG. 48 is a top view of a first layer of the flow restrictor of FIG. 43.
Figure 49:
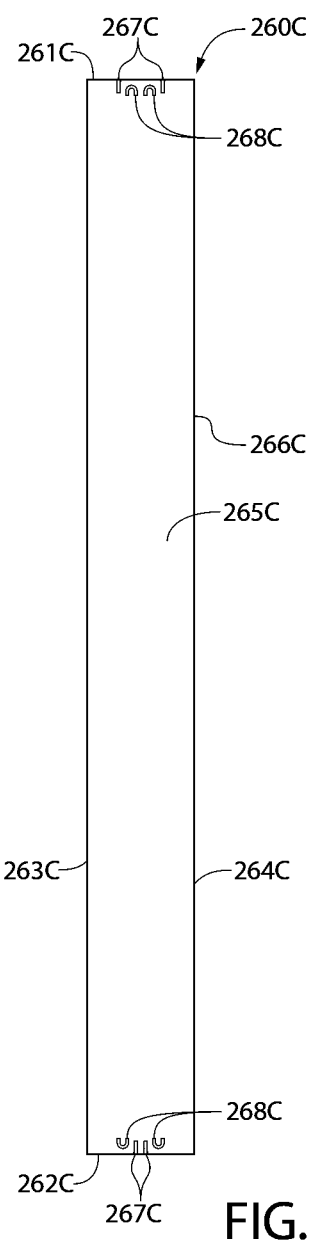
FIG. 49 is a top view of a second layer of the flow restrictor of FIG. 43.

FIG. 46 shows an exploded view of the layers 210C. The layers 210C comprise two first layers 230C and two second layers 260C. As best seen in FIGS. 48 and 49, the first layer 230C has a first side 231C, a second side 232C, a third side 233C, a fourth side 234C, a front face 235C, and an opposite rear face 236C. The second layer 260C has a first side 261C, a second side 262C, a third side 263C, a fourth side 264C, a front face 265C, and an opposite rear face 266C. The first layer 230C has a series of flow passages comprising entry passages 237C, U passages 238C, and longitudinal passages 239C. The entry passages and the U passages are each only formed into a portion of the thickness of the first layer 230C while the longitudinal passages 239C extend through the entirety of the thickness of the first layer 230C. The second layer 260C also has entry passages 267C and U passages 268C formed into the front face 265C that correspond to the entry passages 237C and U passages 238C of the first layer 240C. When a first layer 230C and a second layer 260C are stacked with the front faces 235C, 265C facing one another, the entry passages 237C, 267C form apertures 212C on the first and second sides 231C, 261C, 232C, 262C of the layers 230C, 260C. As is best shown in FIG. 47, in combination with additional first layers 230C and second layers 260C, a plurality of flow passages 270C are formed, extending from apertures 212C on one end 213C of the plurality of layers 210C to the opposite second end 214C of the plurality of layers 210C.

Returning to FIG. 45A, the apertures 212C have a first edge 215C, a second edge 216C, a third edge 217C, and a fourth edge 218C. The first edge 215C is formed by the first layer 230C, the second edge 216C is formed by the second layer 260C, and the third and fourth edges 217C, 218C are each formed by a portion of the first layer 230C and a portion of the second layer 260C.

The flow passages 270C may be varied in any desired manner to achieve a desired flow impedance. For instance, the number of flow passages 270C may be increased or decreased by reducing or increasing the number of the plurality of layers 210C. Furthermore, the length of the flow passages 270C may be increased or decreased by changing the number of times that the flow passages 270C double back on themselves, changing the resulting number of U passages 238C, 268C and longitudinal passages 239C. A greater or fewer number of flow passages 270C may be formed into pairs of first and second layers 230C, 260C. The width of the flow passages 270C may also be increased or decreased, and the thickness of the first and second layers 230C, 260C may be varied. Indeed, it is not necessary that the same thickness be used for every pair of first and second layers 230C, 260C. Each layer within the plurality of layers 210C could be individually varied to alter the resulting flow impedance of the flow restrictor 160C.

The flow restrictor 160C is manufactured by first etching each of the layers 210C individually or in an array. The layers 210C may all be formed of the same material or may be formed of different materials. The etching may be carried out in a single step or in a series of steps to achieve the multiple depths required. Alternative processes such as laser ablation, micromachining, or other known processes may also be used. Once the plurality of layers 210C have been formed, they are assembled with the non-etched outer layers 220C and joined by diffusion bonding. Again, alternative techniques such as conventional bonding with adhesives, welding, or similar processes may also be used as is known in the art. The resulting stack of layers 210C, 220C is joined, sealing the flow passages 270C and forming the flow restrictor 160C. Subsequent finishing steps can be performed to alter the overall shape or size of the flow restrictor 160C to suit the dimensions of the flow passages into which the flow restrictor 160C is installed. These processes may include grinding, machining, laser cutting, water jetting, or other known techniques. Indeed, the flow restrictor 160C does not need to remain rectangular and may be formed into cylindrical shapes as will be discussed further below.

Figure 50:
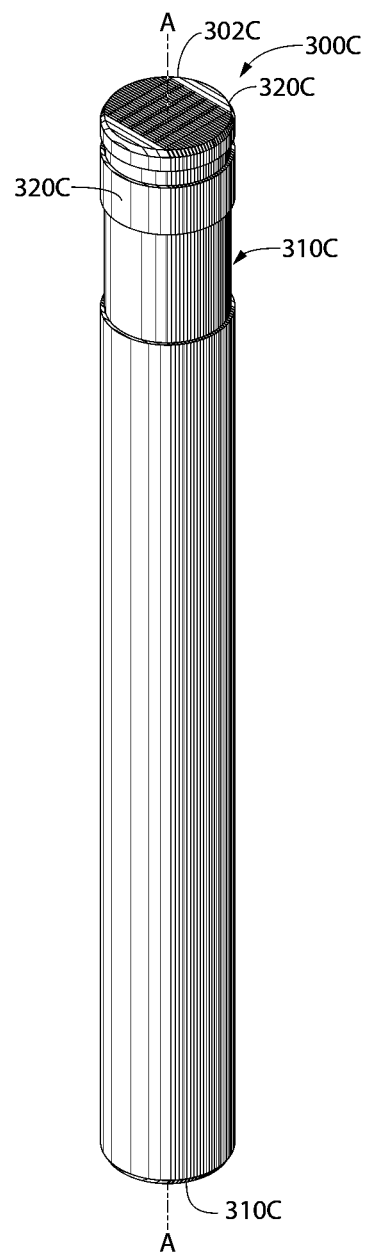
FIG. 50 is a perspective view of a second embodiment of a laminar flow restrictor.

Turning to FIGS. 50-56, a second embodiment of the flow restrictor 300C is best shown in FIG. 50. Where not explicitly noted, the reference numerals are identical to those of the first embodiment of the flow restrictor 160C. The second embodiment of the flow restrictor 300C extends from a first end 302C to a second end 303C along a longitudinal axis A-A and is also formed of a plurality of layers 310C having flow passages and a plurality of outer layers 320C which do not have flow passages. After bonding, the layers 310C, 320C are post-processed into a cylindrical shape which facilitates insertion into a cylindrical bore, enabling easy installation of the flow restrictor 300C into a valve or other flow device.

Figure 51:
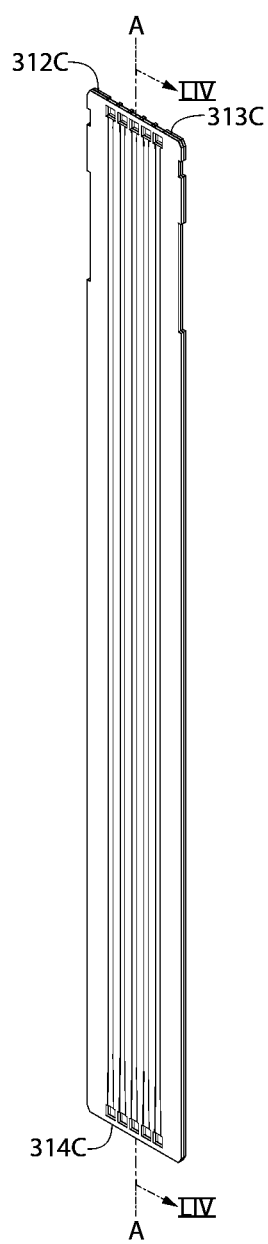
FIG. 51 is a perspective view illustrating a portion of the layers forming the flow restrictor of FIG. 50.
Figure 52A:
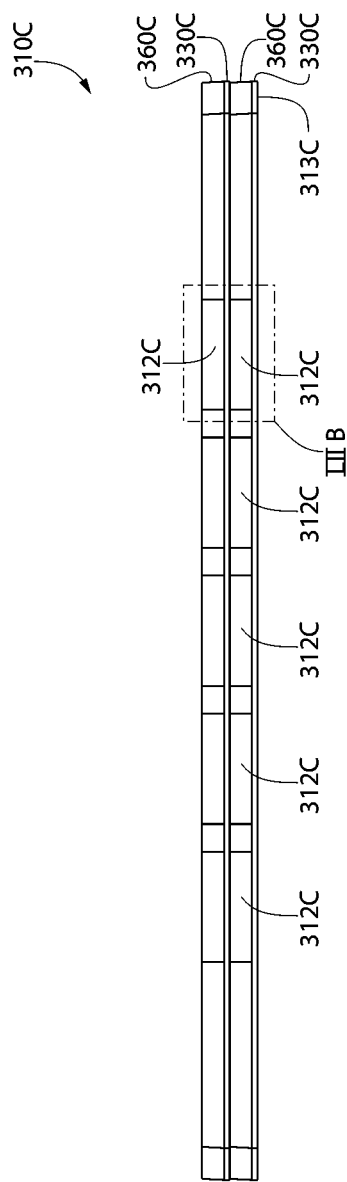
FIG. 52A is an end view of the portion of the flow restrictor of FIG. 51.

As shown in FIG. 51, a selection of the layers 310C are shown in perspective. The layers 310C extend from a first end 313C to a second end 314C opposite the first end 313C. FIGS. 52A and 52B best illustrate the apertures 312C formed into the first end 313C of the layers 310C. As can also be seen, the layers 310C comprise two first layers 330C and two second layers 360C. As best seen in FIG. 52B, the apertures 312C have a first edge 315C, a second edge 316C opposite the first edge 315C, a third edge 317C, and a fourth edge 318C opposite the third edge 317C. The first and second edges 315C, 316C are formed by the first layers 330C. The third and fourth edges 317C, 318C are each formed by the second layer 360C.

Figure 53:
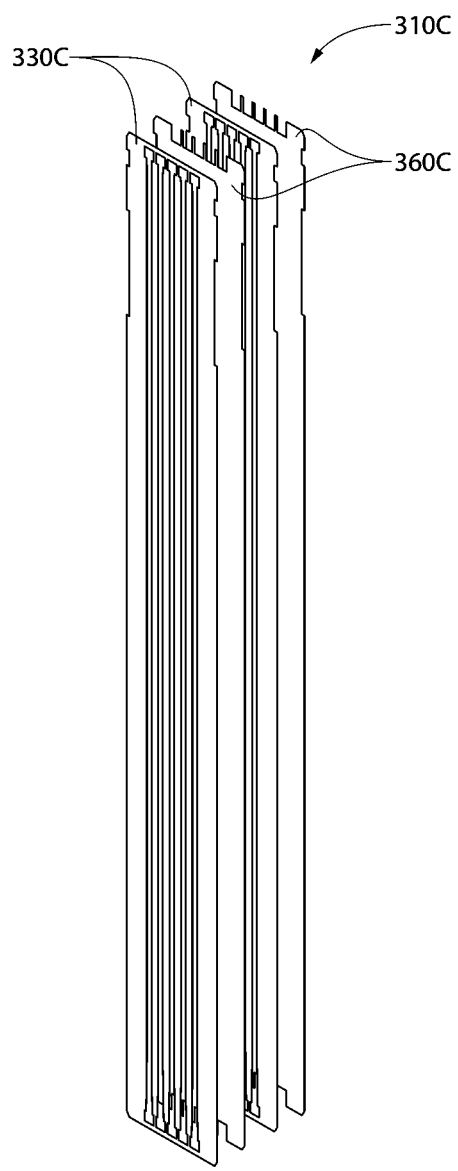
FIG. 53 is an exploded perspective view of the portion of the flow restrictor of FIG. 51.
Figure 54:
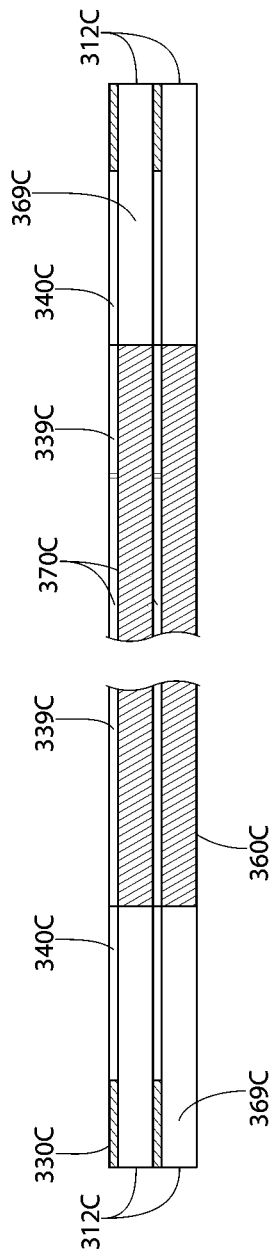
FIG. 54 is a cross-sectional view of the portion of the flow restrictor of FIG. 51, taken along line LIV-LIV.

An exploded view of the layers 310C is shown in FIG. 53, better illustrating the flow passages of the restrictor 300C. FIGS. 55 and 56 illustrate the first layer 330C and the second layer 360C, respectively. The first layer 330C has a first side 331C, a second side 332C, a third side 333C, a fourth side 334C, a front face 335C, and an opposite rear face 336C. The second layer 360C has a first side 361C, a second side 362C, a third side 363C, a fourth side 364C, a front face 365C, and an opposite rear face 366C. The first layer 330C has a series of longitudinal passages 339C that terminate in layer transition apertures 340C. The longitudinal passages 339C and the layer transition apertures 340C extend through the entirety of the first layer 330C. The second layer 360C has notches 369C that extend from the first and second sides 361C, 362C. The notches 369C also extend through the entirety of the second layer 360C. As can be best seen in FIG. 54, the apertures 312C are formed by the open ends of the notches 369C when the layers 330C, 360C are alternately stacked as shown. Flow passages 370C are formed by the stacking of the layers 330C, 360C as shown. In alternate embodiments, the layer transition apertures may be formed in a variety of shapes and may be formed with or without flow passage contouring at the ends of the channel, or with contouring of different shapes.

Once again, a plurality of the layers 330C, 360C are stacked and assembled with the outer layers 320C. The layers are then bonded through diffusion bonding or a similar technique. The resulting restrictor stack is then ground or machined into a cylindrical shape as shown in FIG. 50. This cylindrical shape also incorporates annular grooves which facilitate the mounting of a seal which seals the flow restrictor 300C into a bore of a device to ensure that the only gas passing by the flow restrictor 300C must pass through the passages 370C. In other embodiments, the final part may be machined into different shapes, or alternatively left in its raw shape formed by the bonded restrictor stack.

Figure 57:
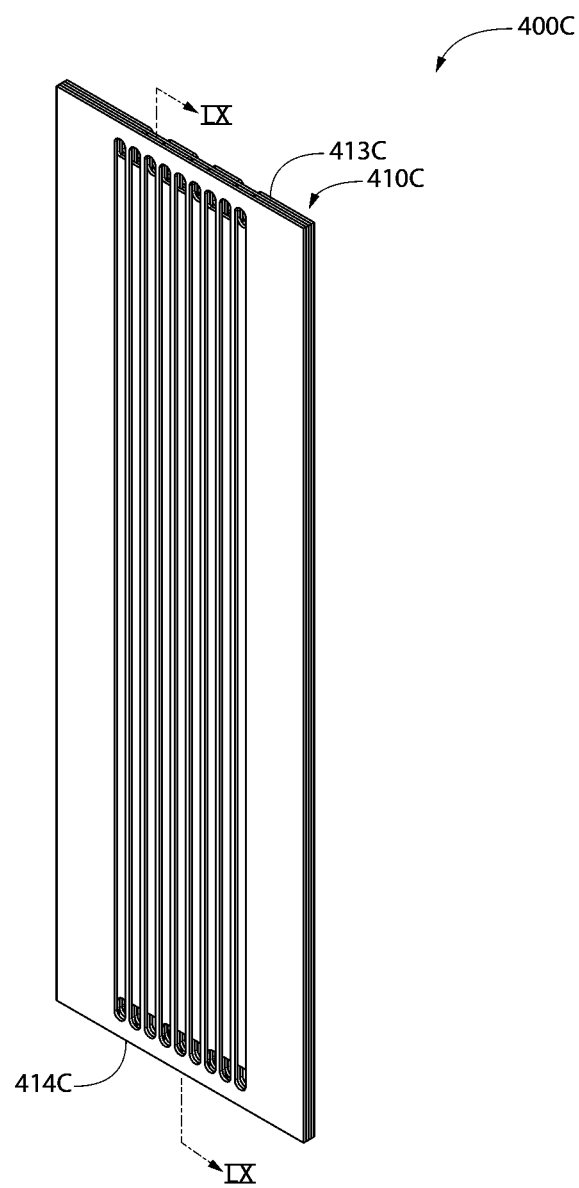
FIG. 57 is a perspective view of a portion of a third embodiment of a laminar flow restrictor.
Figure 58:
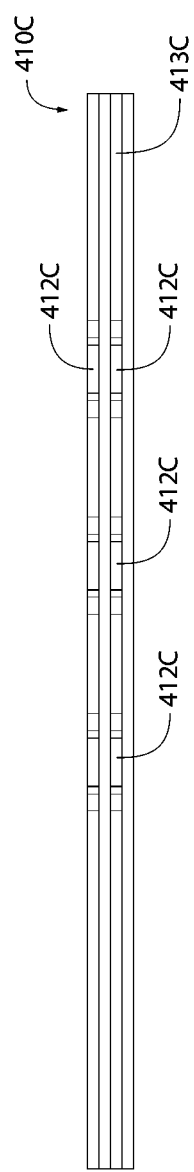
FIG. 58 is an end view of the portion of the flow restrictor of FIG. 57.
Figure 59:
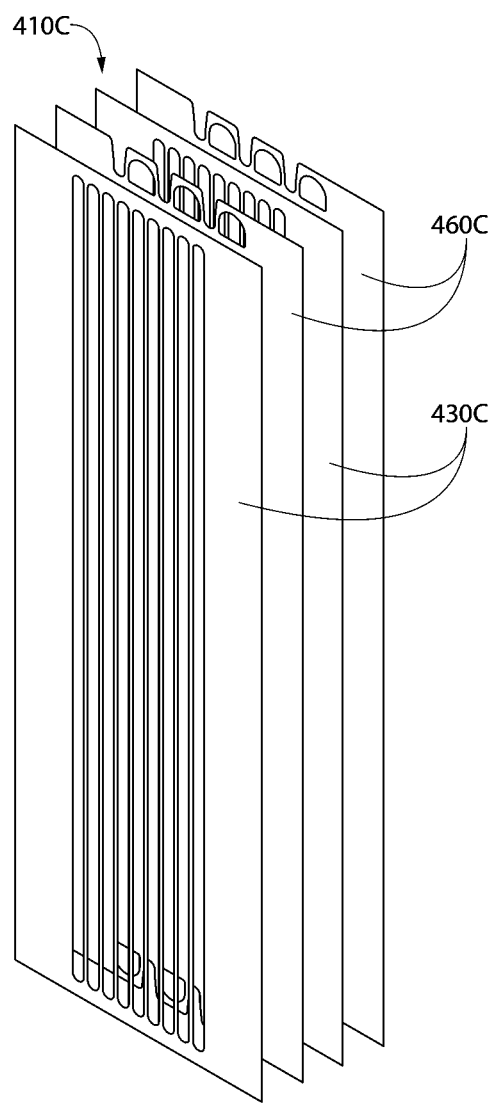
FIG. 59 is an exploded perspective view of the portion of the flow restrictor of FIG. 57.

A third embodiment of the flow restrictor 400C is shown in FIGS. 57-62. FIG. 57 shows a selection of the plurality of layers 410C forming the flow passages of the flow restrictor 400C. The outer layers are not shown in this embodiment as they are substantially identical to those of the other embodiments. The plurality of layers 410C extend from a first end 413C to a second end 414C opposite the first end 413C. As best shown in FIG. 58, apertures 412C are formed in the first end 413C and the second end 414C to permit passage of gas into and out of the flow restrictor 400C. FIG. 59 shows an exploded view of the plurality of layers 410C to better illustrate the flow passages. As can be seen, the plurality of layers 410C comprise two first layers 430C and two second layers 460C.

Figures 61, 62:
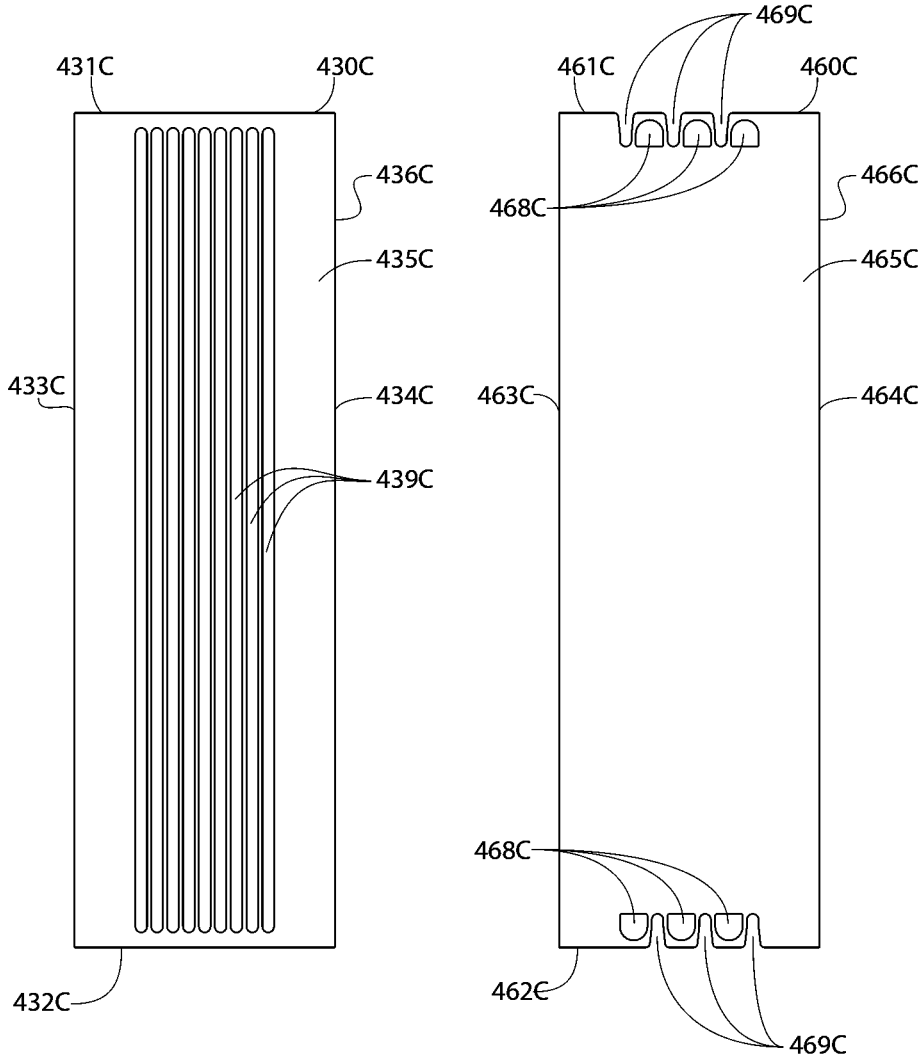
FIG. 61 is a top view of a first layer of the flow restrictor of FIG. 57.
FIG. 62 is a top view of a second layer of the flow restrictor of FIG. 57.

FIGS. 61 and 62 illustrate the first layer 430C and the second layer 460C, respectively. The first layer 430C has a first side 431C, a second side 432C, a third side 433C, a fourth side 434C, a front face 435C, and an opposite rear face 436C. The second layer 460C has a first side 461C, a second side 462C, a third side 463C, a fourth side 464C, a front face 465C, and an opposite rear face 466C. The first layer 430C has a series of longitudinal passages 439C having an elongated configuration with straight sides and a radius at each end. The second layer 460C has notches 469C that transition from a u-shape having parallel sides to angled sides which increase in width as they approach the first side 461C or second side 462C of the second layer 460C. The notches 469C overlap with the longitudinal passages 439C when the first and second layers are aligned. The second layer 460C also has D-shaped apertures 468C which allow the connection of two adjacent longitudinal passages 439C to increase the effective length of the flow passage from one aperture 412C to another aperture 412C. There is no limit to the number of D-shaped apertures 468C which may be employed. Furthermore, there is no need to limit the apertures 468C to a D shape, and they may be any desired shape to facilitate a connection between adjacent longitudinal passages 439C. In alternate embodiments the notches 469C can be shaped differently. For instance, shapes such as rectangular, wedge, or other shapes may be used. Additionally, longitudinal passages 439C can have contouring in them to improve flow characteristics. Thus, the longitudinal passages 439C need not be formed with a constant width, and may have varying widths at either ends or anywhere along their length. In yet further embodiments a third layer (or a plurality of layers) can be interleaved between the first layer 430C and the second layer 460C such that each first layer 430C only contacts one second layer 460C, and the apertures 468C between subsequent sheets do not allow flow transitions except for adjacent first and second layers 430C, 460C.

Figure 60:
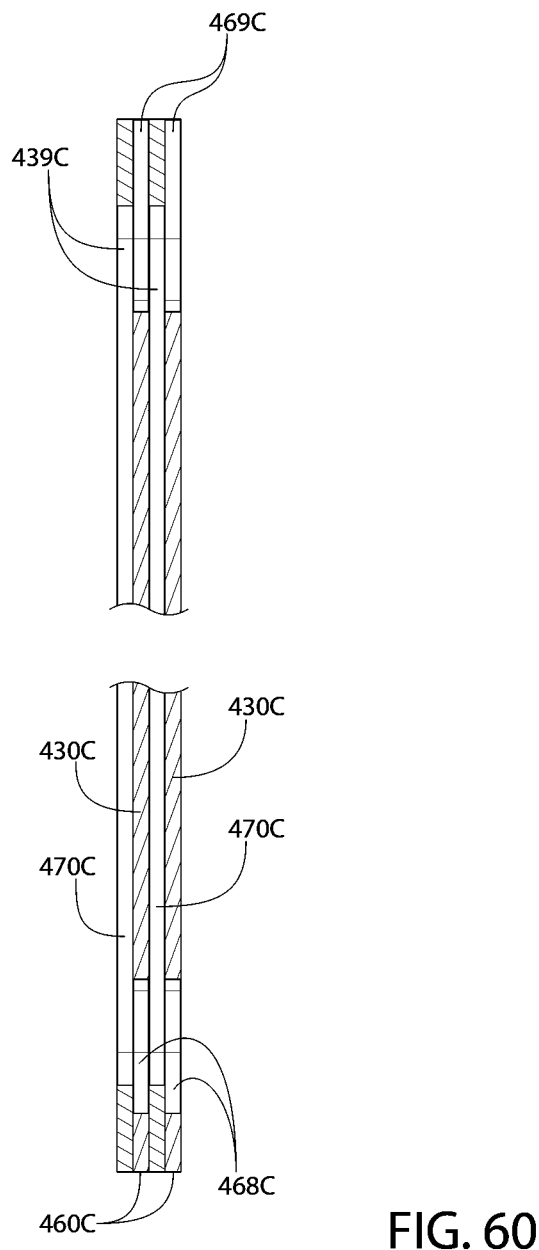
FIG. 60 is a cross-sectional view of the portion of the flow restrictor of FIG. 57, taken along line LX-LX.

As can be best seen in FIG. 60, the apertures 412C are formed by the open ends of the notches 469C when the layers 430C, 460C are alternately stacked as shown. Flow passages 470C are formed by the stacking of the layers 430C, 460C as shown. The layers 430C, 460C are of equal thickness in this embodiment, but may have different thicknesses if desired.

Figure 63:
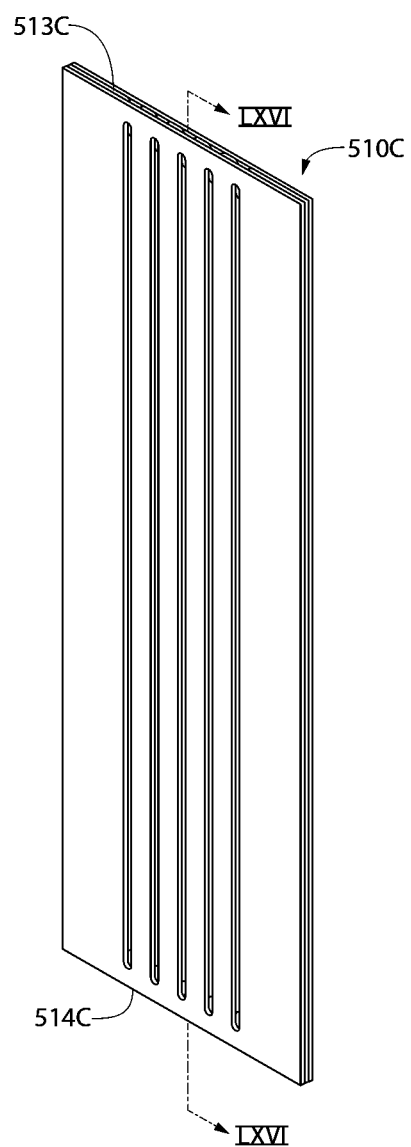
FIG. 63 is a perspective view of a portion of a fourth embodiment of a laminar flow restrictor.
Figure 64:
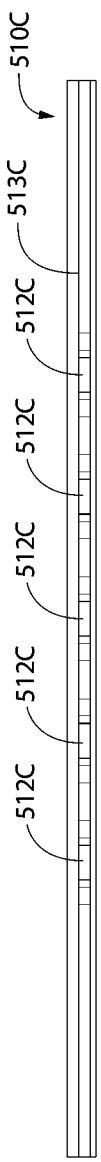
FIG. 64 is an end view of the portion of the flow restrictor of FIG. 63.
Figure 65:
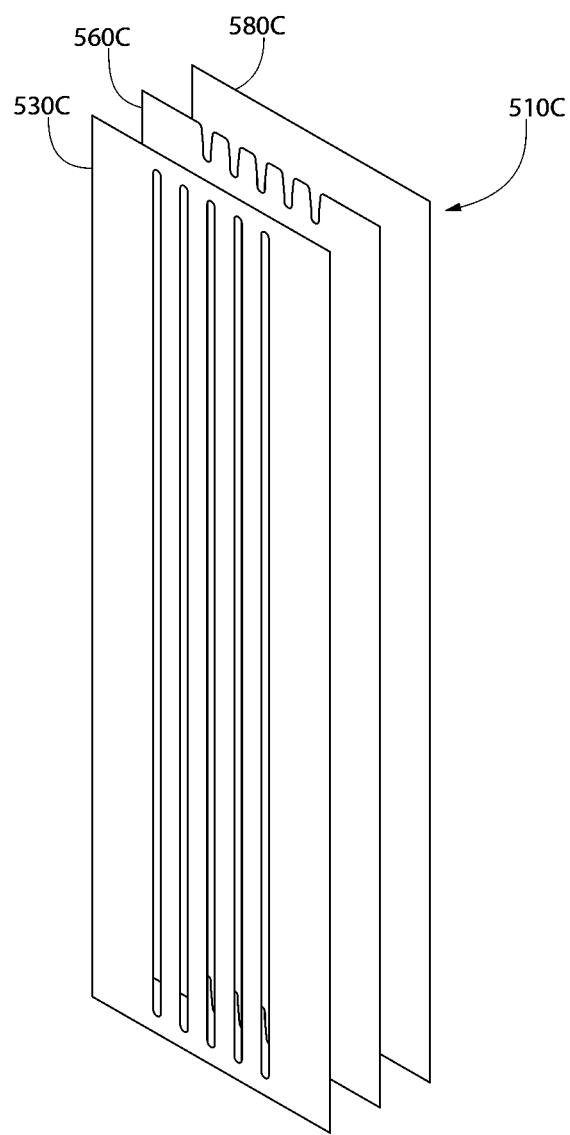
FIG. 65 is an exploded perspective view of the portion of the flow restrictor of FIG. 63.
Figure 66:
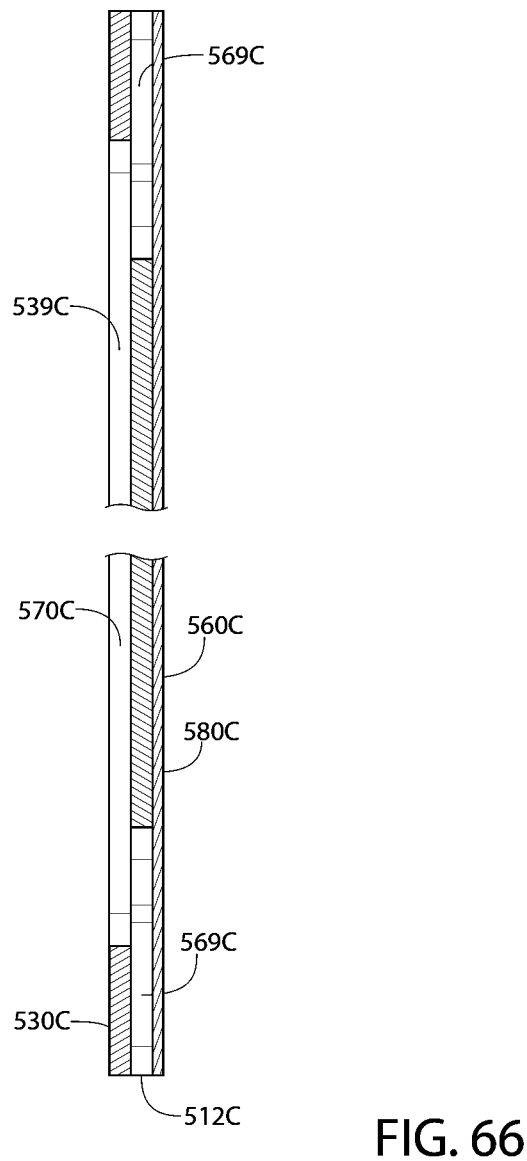
FIG. 66 is a cross-sectional view of the portion of the flow restrictor of FIG. 63, taken along line LXVI-LXVI.

A fourth embodiment of the flow restrictor 500C is shown in FIGS. 63-69. FIG. 63 shows a selection of the plurality of layers 510C forming the flow passages of the flow restrictor 500C. The outer layers are not shown in this embodiment as they are substantially identical to those of the other embodiments. The plurality of layers 510C extend from a first end 513C to a second end 514C opposite the first end 513C. As best shown in FIG. 64, apertures 512C are formed in the first end 513C and the second end 514C to permit passage of gas into and out of the flow restrictor 500C. FIG. 65 shows an exploded view of the plurality of layers 510C to better illustrate the flow passages. As can be seen, the plurality of layers 510C comprise a first layer 530C, a second layer 560C, and a third layer 580C.

FIGS. 67-69 illustrate the first layer 530C, the second layer 560C, and the third layer 580C, respectively. The first layer 530C has a first side 531C, a second side 532C, a third side 533C, a fourth side 534C, a front face 535C, and an opposite rear face 536C. The second layer 560C has a first side 561C, a second side 562C, a third side 563C, a fourth side 564C, a front face 565C, and an opposite rear face 566C. The first layer 530C has a series of longitudinal passages 539C having an elongate configuration with straight sides and a radius at each end. The second layer 560C has notches 569C that transition from a u-shape having parallel sides to angled sides which increase in width as they approach the first side 561C or second side 562C of the second layer 560C. The notches 569C overlap with the longitudinal passages 539C when the first and second layers are aligned. The third layer 580C has a first side 581C, a second side 582C, a third side 583C, a fourth side 584C, a front face 585C, and an opposite rear face 586C. As can be best seen in FIG. 66, the apertures 512C are formed by the open ends of the notches 569C when the layers 530C, 560C are alternately stacked as shown. Flow passages 570C are formed by the stacking of the layers 530C, 560C as shown. The layers 530C, 560C are of equal thickness in this embodiment, but may have different thicknesses if desired. The third layer may be useful for decreasing the density of the flow passages, ensuring that flow is more evenly distributed across the cross-sectional area of the flow restrictor 500C. This is particularly useful for producing very high flow impedance flow restrictors.

Figure 70:
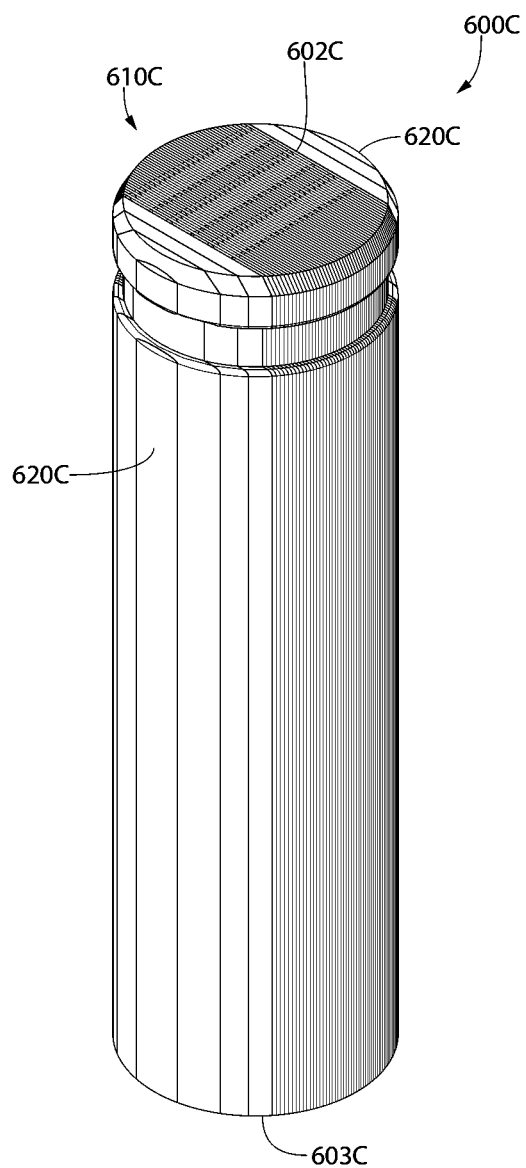
FIG. 70 is a perspective view of a fifth embodiment of a laminar flow restrictor.
Figure 71:
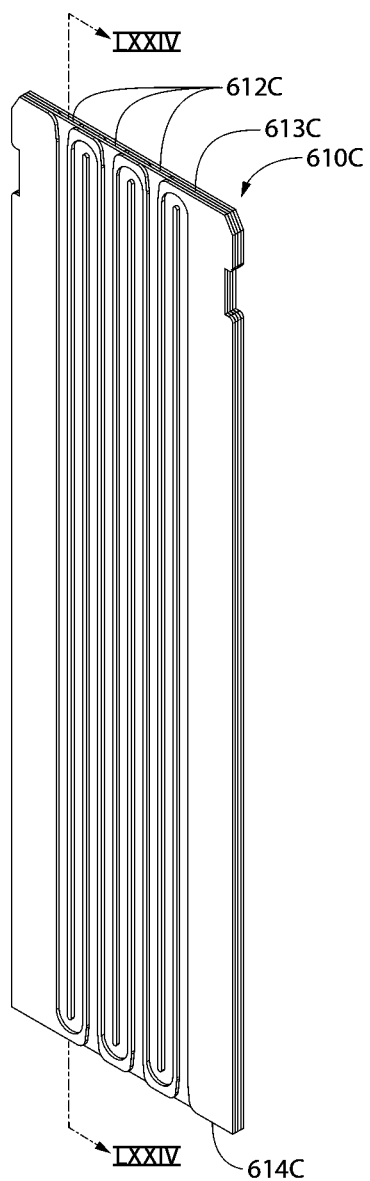
FIG. 71 is a perspective view illustrating a portion of the layers forming the flow restrictor of FIG. 70.
Figure 72:
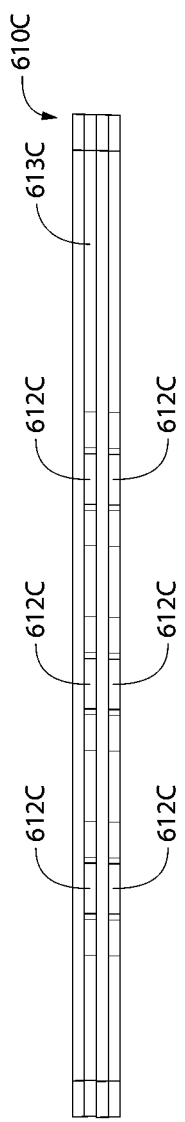
FIG. 72 is an end view of the portion of the flow restrictor of FIG. 71.
Figure 73:
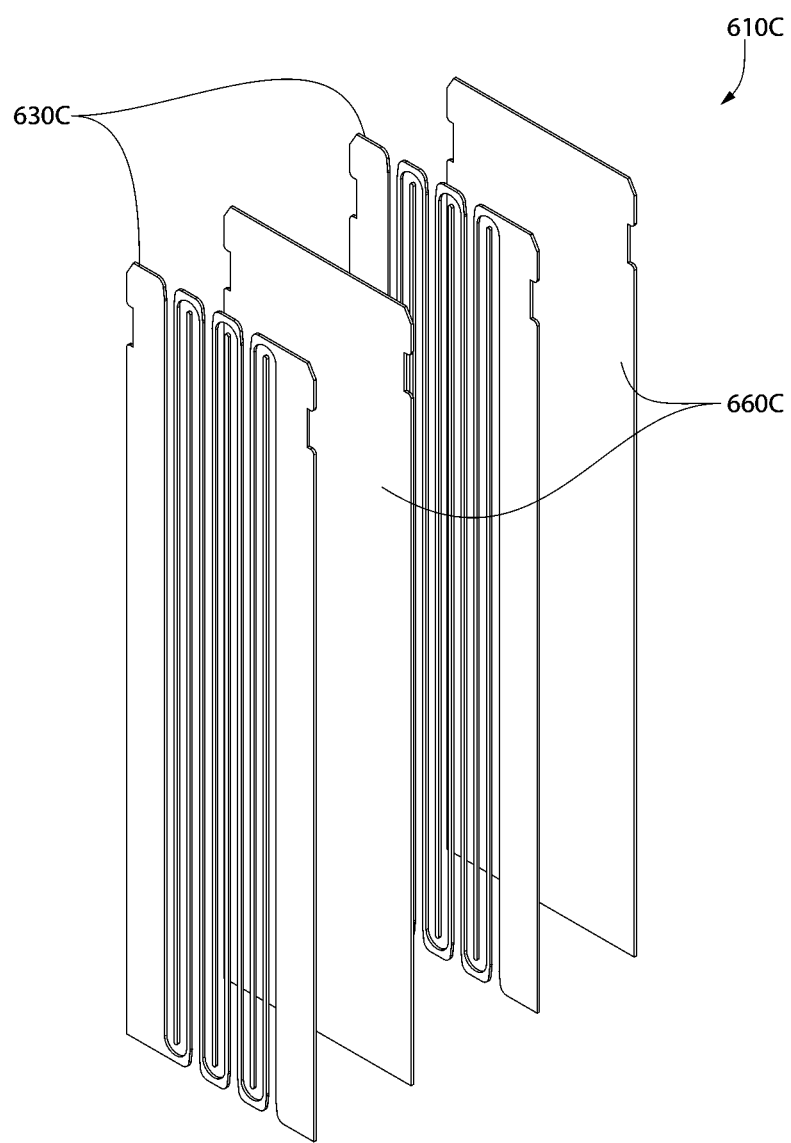
FIG. 73 is an exploded perspective view of the portion of the flow restrictor of FIG. 71.

A fifth embodiment of the flow restrictor 600C is shown in FIGS. 70-76. FIG. 70 shows the flow restrictor 600C in perspective. The flow restrictor 600C extends from a first end 602C to a second end 603C and has outer layers 620C which surround layers 610C which have flow passages therein. A selection of the layers 610C are shown in FIG. 71 in perspective view. These layers 610C extend from a first end 613C to a second end 614C, with apertures 612C on the first and second ends 613C, 614C. An exploded view of the layers 610C is shown in FIG. 73, illustrating two first layers 630C and two second layers 660C.

Figures 75, 76:
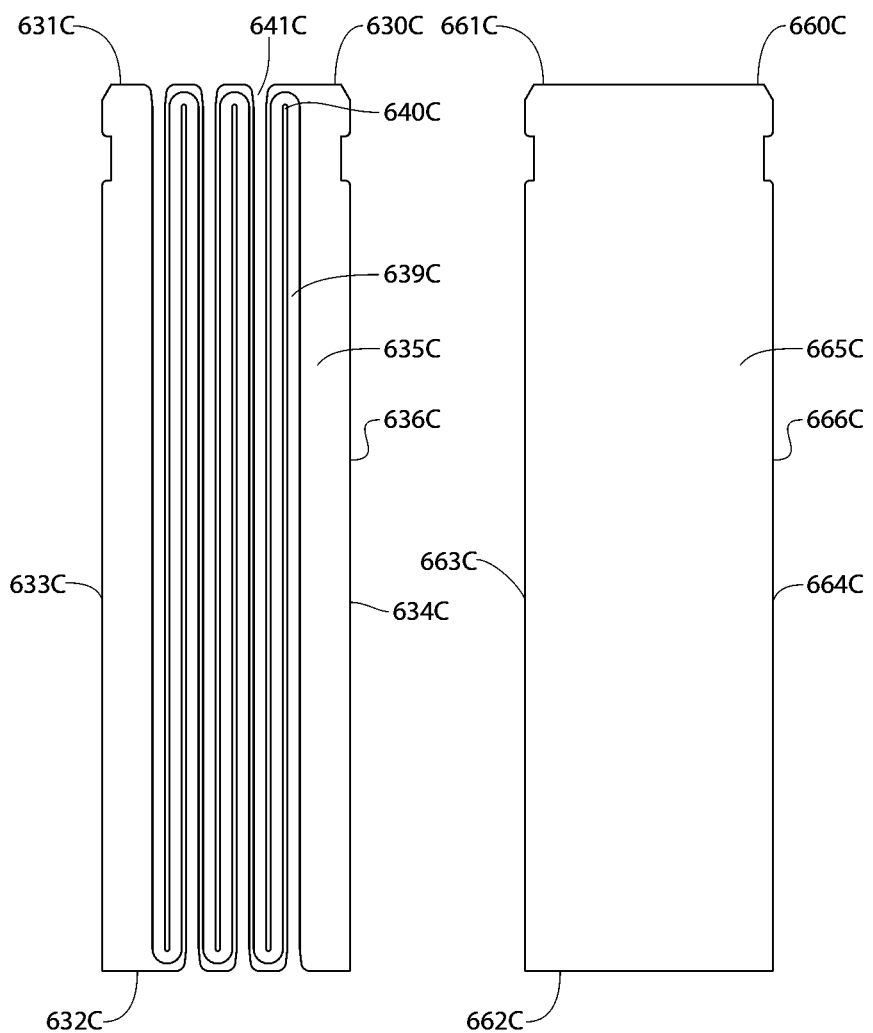
FIG. 75 is a top view a first layer of the flow restrictor of FIG. 71.
FIG. 76 is a top view a second layer of the flow restrictor of FIG. 71.

The first layer 630C and the second layer 660C are illustrated in FIGS. 75 and 76. The first layer 630C has a first side 631C, a second side 632C, a third side 633C, a fourth side 634C, a front face 635C, and an opposite rear face 636C. The second layer 660C has a first side 661C, a second side 662C, a third side 663C, a fourth side 664C, a front face 665C, and an opposite rear face 666C. The first layer 630C has a series of longitudinal passages 639C having an elongated configuration which meet with U shaped portions 640C or with openings 641C. The second layer 660C is free of any flow passages or other features. As can be seen, in the flow restrictor 600C, gas remains exclusively on a single layer 630C and does not transition between first and second layers 630C, 660C. Instead, it enters through an opening 641C at the first side 631C, travels down a longitudinal passage 639C, returns along a U shaped portion 640C at least two times, then exits through an opening 641C on the second side 632C. The exact flow path may be altered to zig-zag, utilize more than two U shaped portions 640C, no U shaped portions 640C, or take any other path on the layer 630C. However, it never flows through the second layer 660C in this embodiment. The longitudinal passages 369C, U shaped portions 640C, and openings 641C all extend through the entirety of the thickness of the first layer 630C. In alternate configurations, single sheet flow may be obtained by forming the flow passage depth only partially through the sheet such that the sheet dimensions remain intact during assembly prior to bonding.

Figure 74:
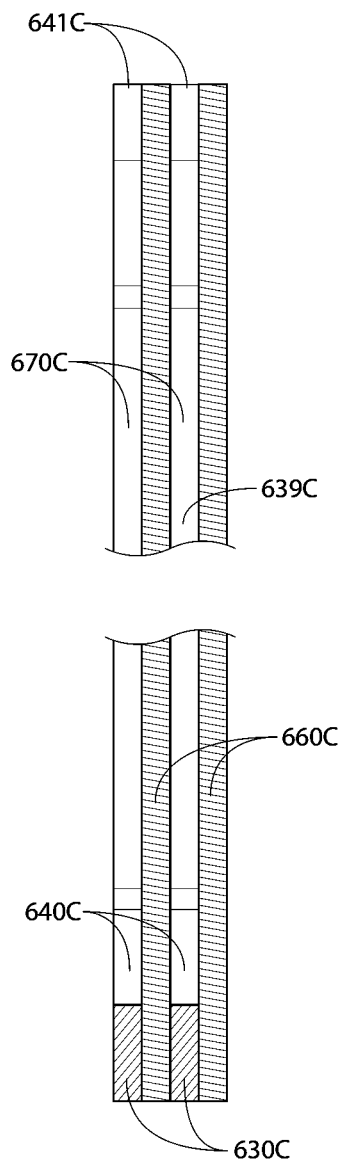
FIG. 74 is a cross-sectional view of the portion of the flow restrictor of FIG. 71, taken along line LXXIV-LXXIV.

As best shown in FIG. 74, flow passages 670C are formed by the stacking of the layers 630C, 660C as shown. The layers 630C, 660C are of equal thickness in this embodiment, but may have different thicknesses if desired. The layers 630C, 660C are formed individually of different materials having a different reactivity when subjected to etching chemicals. The material of the first layer 630C may be more reactive than the material of the second layer 660C, facilitating effective etching of the first layer 630C without significant etching of the second layer 660C. Layer pairs are formed by assembling one first layer 630C with one second layer 660C. The layer pairs are then diffusion bonded so they cannot be readily separated. As discussed above, other bonding techniques may be utilized. Then, the layer pairs are etched so that the flow passages 670C are formed into the first layer 630C without etching the second layer 660C. The layer pairs are then assembled into the plurality of layers 610C having flow passages 670C. Outer layers 620C are also assembled with the plurality of layers 610C having the flow passages 670C. Finally, the layers 610C, 620C are diffusion bonded together. Optionally, post processing such as grinding may be used to form the flow restrictor 600C and adapt it for installation into a flow passage of a device.

It should be noted that the flow passages do not need to extend straight from one end of the flow restrictor to the other end of the flow restrictor, or double back in parallel rows. Instead, it is conceived that the flow passages may zig-zag, arc, or take any other path needed to achieve the desired flow impedance in the completed flow restrictor. Multiple layer transitions may also be made, enabling the use of flow passages which fork and rejoin, transition across more than two or three layers, or the like. It is further conceived that flow restrictors may incorporate features of specific embodiments in combination, such that a hybrid of the disclosed embodiments may be constructed. The above-disclosed restrictor designs can be used to achieve highly laminar flow and high part to part reproducibility. This high reproducibility reduces calibration requirements when manufacturing flow control devices utilizing one or more laminar flow elements.

Figure 77:
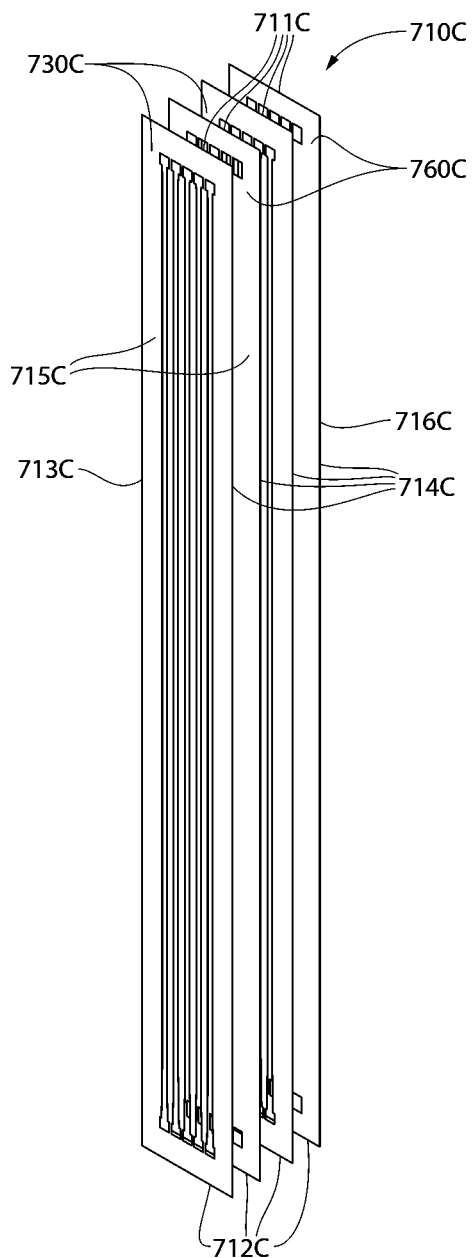
FIG. 77 is an exploded perspective view of a plurality of layer blanks illustrating methods of manufacturing the disclosed flow restrictors.
Figure 78:
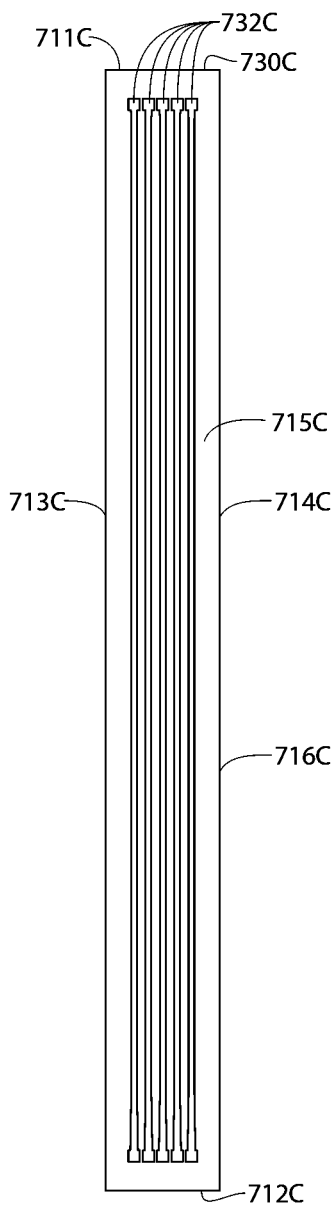
FIG. 78 is a top view of a first layer of the invention of FIG. 77.
Figure 79:
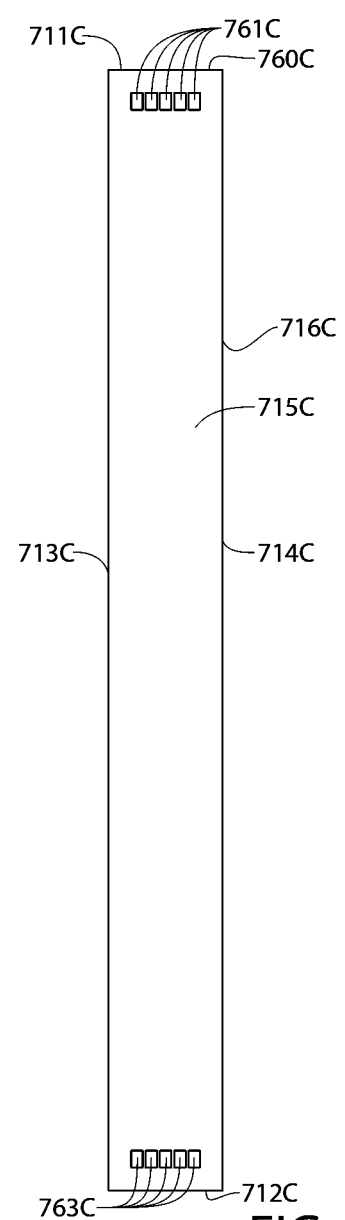
FIG. 79 is a top view of a second layer of the invention of FIG. 77.

Details illustrating a method of forming the flow restrictors according to the present invention are shown in FIGS. 77-81. FIG. 77 shows a plurality of layer blanks 710C in an exploded view. Each of the layer blanks has a first edge 711C, a second edge 712C opposite the first edge, a third edge 713C, and a fourth edge 714C opposite the third edge. The layer blanks 710C further comprise a front face 715C and a rear face 716C opposite the front face 715C. The layer blanks 710C are formed into first layers 730C and second layers 760C as further illustrated in FIGS. 78 and 79. The first layer 730C is modified from a layer blank 710C by forming a second cavity 732C into the first layer 730C. The second layer 760C is modified from a layer blank 710C by forming a first cavity 761C and a third cavity 763C into the second layer 760C. The first, second, and third cavities 761C, 732C, 763C are formed into the front faces 715C of their respective first and second layers 730C, 760C. Preferably the cavities 761C, 732C, 763C are formed through the thickness of the layers 730C, 760C. In some embodiments, some or all of the cavities 761C, 732C, 763C may be formed only partially through the thickness of the layers 730C, 760C. In the illustrated method, the cavities 761C, 732C, 763C are formed from the front face 715C to the rear face 716C. The cavities 761C, 732C, 763C are spaced from the first, second, third, and fourth edges 711C, 712C, 713C, 714C of the layer blanks 710C.

Figure 80:
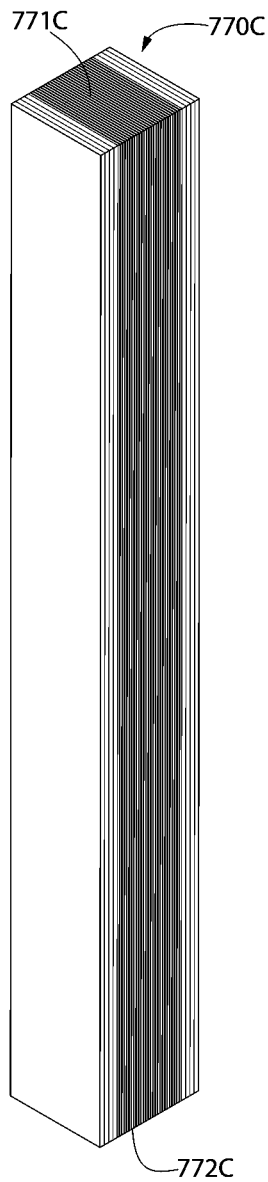
FIG. 80 is a perspective view of a restrictor stack prior to finishing according to the invention of FIG. 77.

The cavities 761C, 732C, 763C are formed by etching the layer blanks 710C. Alternate processes are available such as micromachining, laser ablation, or other known techniques. As illustrated in FIG. 80, a restrictor stack 770C is formed from the plurality of layers 730C, 760C. Subsequent to formation of the cavities 761C, 732C, 763C, the layers 730C, 760C are stacked in alternating layers, ensuring that the layers 730C, 760C are kept in alignment so that the second cavity 762C overlaps with the first and third cavities 761C, 763C. The layers 730C, 760C are then bonded to form the restrictor stack 770C as a unitary component. The layers 730C, 760C may be bonded by diffusion bonding, welding, gluing, or any other known technique.

The restrictor stack 770C comprises a first unfinished end 771C formed by the first edges 711C of the first and second layers 730C, 760C. An opposite second unfinished end 772C is formed by the second edges 712C of the first and second layers 730C, 760C of the restrictor stack 770C. As can be seen, no cavities are exposed on the unfinished ends 771C, 772C. In alternate embodiments, only one of the layers 730C, 760C need have cavities, with the other layers 730C, 760C being free of cavities. This allows formation of restrictor such as those shown in FIGS. 70-76. In yet other embodiments, three or more different types of layers may be utilized such as is shown in FIGS. 63-67. The layers need not be alternately stacked, but instead may simply be separated from each other. Thus, un-modified layer blanks 710C may be interleaved with the first and second layers if so desired. Any combination of layers can be made so long as at least one flow passage is formed in the finished flow resistor.

Figure 81:
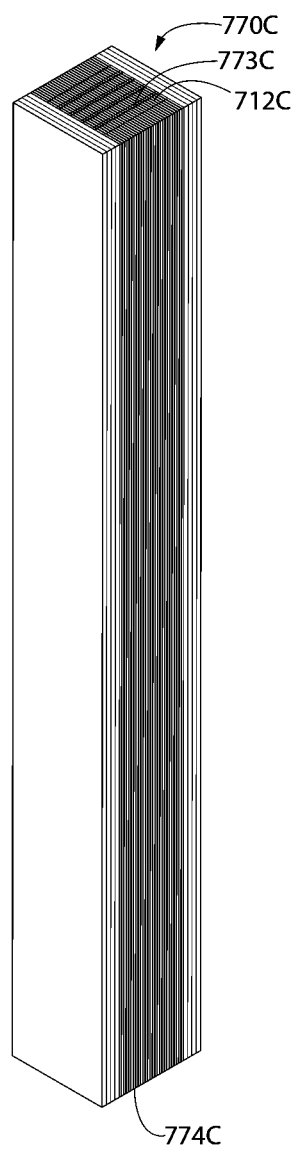
FIG. 81 is a perspective view of a restrictor stack after finishing according to the invention of FIG. 77.

FIG. 81 illustrates the restrictor stack 770C after finishing operations have been completed. These finishing operations can take one of two alternative forms. In the first process, the unfinished ends 771C, 772C are broken off of the restrictor stack 770C to expose the first and third cavities 761C, 763C. The exposed first and third cavities 761C, 763C form apertures 712C on first and second finished ends 773C, 774C. This results in flow passages extending from the apertures 712C on the first finished end 773C to the apertures 712C on the second finished end. Optionally, additional material removal operations can be done to the restrictor stack 770C prior to removal of the unfinished ends 771C, 772C. This has the benefit of minimizing the amount of debris which enters the flow passages, ensuring that the resulting flow restriction closely matches the theoretical flow restriction provided by the flow restrictor. Furthermore, manufacturing repeatability is greatly improved by ensuring that debris cannot enter the flow passages.

In an alternative second process, the unfinished ends 771C, 772C of the restrictor stack 770C are removed through conventional material removal processes such as machining, milling turning, sawing, grinding, electrical discharge machining, or etching. Once the unfinished ends 771C, 772C are removed to form the finished ends 773C, 774C, the restrictor stack 770C is rinsed with deionized water. An electropolish process is used to dissolve any remaining metal particles and produce a surface having very low roughness. Next, deionized water is pumped through the flow passages to flush the electropolishing solution. The restrictor stack 770C is then dried and subsequently a nitric acid solution is used to remove any remaining free iron, phosphates, and sulfates. This results in a surface which is extremely clean and free of contaminants.

Section V

The present invention is directed to a seal for a flow restrictor for use in an apparatus for controlling gas flow. In some embodiments, the apparatus may function as a mass flow controller to deliver a known mass flow of gas to a semiconductor or similar process. Semiconductor fabrication is one industry which demands high performance in control of gas flows. As semiconductor fabrication techniques have advanced, customers have recognized the need for flow control devices with increased accuracy and repeatability in the mass of the delivered gas flows. Modern semiconductor processes require that the mass of the gas flow is tightly controlled, the response time minimized, and the gas flow is highly accurate. The present seals ensure that the flow restrictor is sealed into its flow passage more effectively and at a reduced cost.

Figure 82:
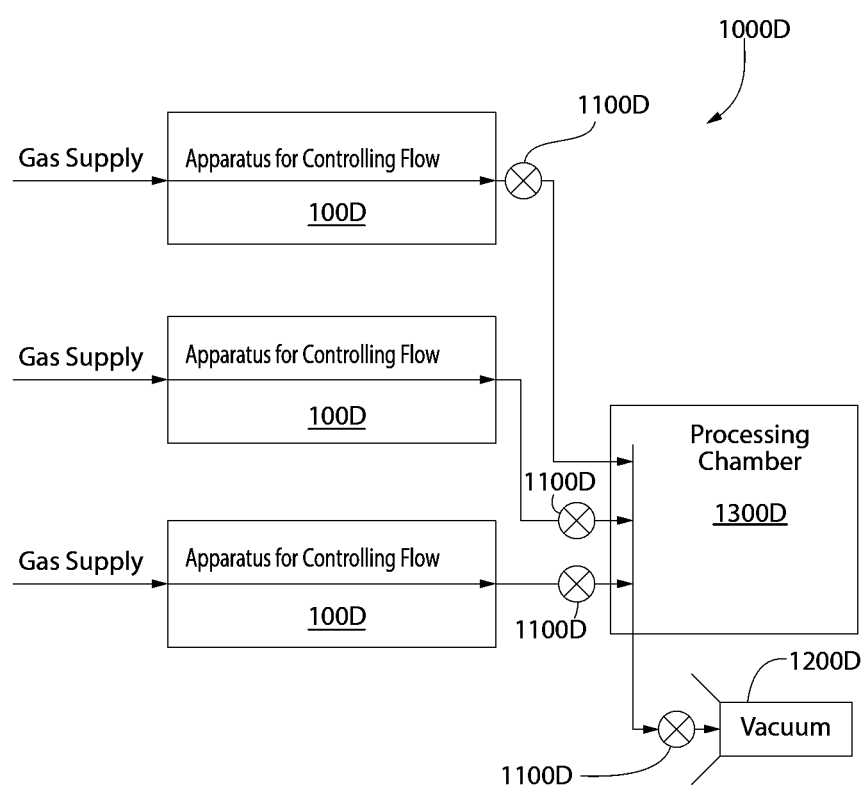
FIG. 82 is a schematic of a process utilizing one or more flow restrictors.

FIG. 82 shows a schematic of an exemplary processing system 1000D utilizing one or more flow restrictors. The processing system 1000D may utilize a plurality of apparatus for controlling flow 100D fluidly coupled to a processing chamber 1300D. The plurality of apparatus for controlling flow 100D are used to supply one or more different process gases to the processing chamber 1300D. Articles such as semiconductors may be processed within the processing chamber 1300D. Valves 1100D isolate each of the apparatus for controlling flow 100D from the processing chamber 1300D, enabling each of the apparatus for controlling flow 100D to be selectively connected or isolated from the processing chamber 1300D, facilitating a wide variety of different processing steps. The processing chamber 1300D may contain an applicator to apply process gases delivered by the plurality of apparatus for controlling flow 100D, enabling selective or diffuse distribution of the gas supplied by the plurality of apparatus for controlling flow 100D. In addition, the processing system 1000D may further comprise a vacuum source 1200D which is isolated from the processing chamber 1300D by a valve 1100D to enable evacuation of process gases or facilitate purging one or more of the apparatus for controlling flow 100D to enable switching between process gases in the same apparatus for controlling flow 100D. Optionally, the apparatus for controlling flow 100D may be mass flow controllers, flow splitters, or any other device which controls the flow of a process gas in a processing system. Furthermore, the valves 1100D may be integrated into the apparatus for controlling flow 100D if so desired.

Processes that may be performed in the processing system 1000D may include wet cleaning, photolithography, ion implantation, dry etching, atomic layer etching, wet etching, plasma ashing, rapid thermal annealing, furnace annealing, thermal oxidation, chemical vapor deposition, atomic layer deposition, physical vapor deposition, molecular beam epitaxy, laser lift-off, electrochemical deposition, chemical-mechanical polishing, wafer testing, or any other process utilizing controlled volumes of a process gas.

Figure 83:
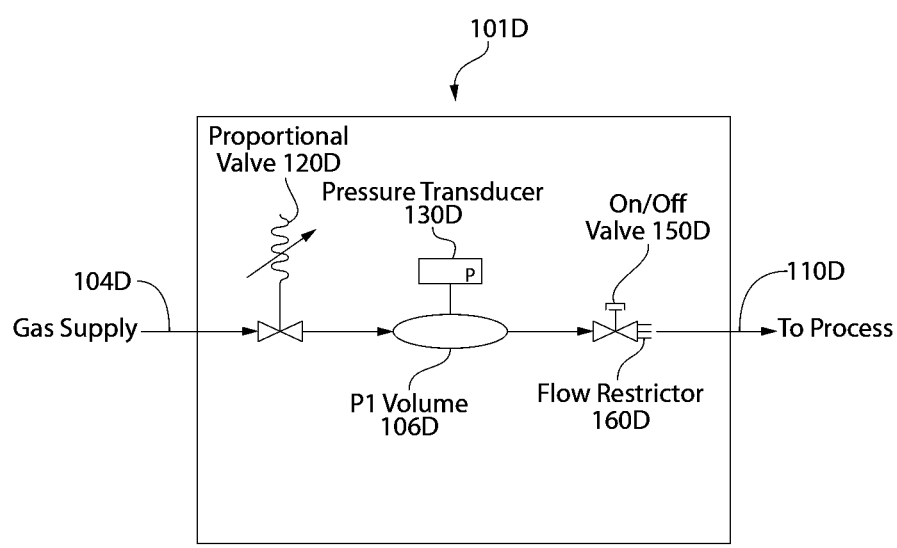
FIG. 83 is a schematic of a mass flow controller as may be utilized in the process of FIG. 82.

FIG. 83 shows a schematic of an exemplary mass flow controller 101D, which is one type of apparatus for controlling flow 100D that may be utilized in the processing system 1000D. The mass flow controller 101D has a gas supply of a process gas fluidly coupled to an inlet 104D. The inlet 104D is fluidly coupled to a proportional valve 120D which is capable of varying the volume of process gas flowing through the proportional valve 120D. The proportional valve 120D meters the mass flow of process gas which passes to the P1 volume 106D. The proportional valve 120D is capable of providing proportional control of the process gas such that it need not be fully open or closed, but instead may have intermediate states to permit control of the mass flow rate of process gas.

A P1 volume 106D is fluidly coupled to the proportional valve 120D, the P1 volume 106D being the sum of all the volume within the mass flow controller 101D between the proportional valve 120D and a flow restrictor 160D. A pressure transducer 130D is fluidly coupled to the P1 volume 106D to enable measurement of the pressure within the P1 volume 106D. An on/off valve 150D is located between the flow restrictor 160D and the proportional valve 120D and may be used to completely halt flow of the process gas out of the P1 volume 106D. Optionally, the flow restrictor 160D may be located between the on/off valve 150D and the proportional valve 120D in an alternate configuration. Finally, the flow restrictor 160D is fluidly coupled to an outlet 110D of the mass flow controller 101D. In the processing system, the outlet 110D is fluidly coupled to a valve 1100D or directly to the processing chamber 1300D. In the present embodiment, the flow restrictor 160D is located between the on/off valve 150D and the outlet 110D. In an alternate embodiment, the on/off valve 150D is located between the flow restrictor 160D and the outlet 110D. Thus, the arrangement of the on/off valve 150D and the flow restrictor 160D may be reversed.

Internal to the first on/off valve 150D is a valve seat and a closure member. When the apparatus 100D is delivering process gas, the first on/off valve 150D is in an open state, such that the valve seat and the closure member are not in contact. This permits flow of the process gas and provides a negligible restriction to fluid flow. When the first on/off valve 150D is in a closed state the closure member and the valve seat are biased into contact by a spring, stopping the flow of process gas through the first on/off valve 150D.

The flow restrictor 160D is used, in combination with the proportional valve 120D, to meter flow of the process gas. In most embodiments, the flow restrictor 160D provides a known restriction to fluid flow. The first characterized flow restrictor 160D may be selected to have a specific flow impedance so as to deliver a desired range of mass flow rates of a given process gas. The flow restrictor 160D has a greater resistance to flow than the passages upstream and downstream of the flow restrictor 160D.

Optionally, the mass flow controller 101D comprises one or more P2 pressure transducers downstream of the flow restrictor 160D and the on/off valve 150D. The P2 pressure transducer is used to measure the pressure differential across the flow restrictor 160D. In some embodiments, the P2 pressure downstream of the flow restrictor 160D may be obtained from another apparatus 100D connected to the processing chamber, with the readings communicated to the mass flow controller 101D.

Optionally, temperature sensors may be employed to further enhance the accuracy of the mass flow controller 101D. They may be mounted in the base of the mass flow controller 101D near the P1 volume 106D. Additional temperature sensors may be employed in a variety of locations, including the proportional valve 120D, the pressure transducer 130D, and the on/off valve 150D.

Figure 84:
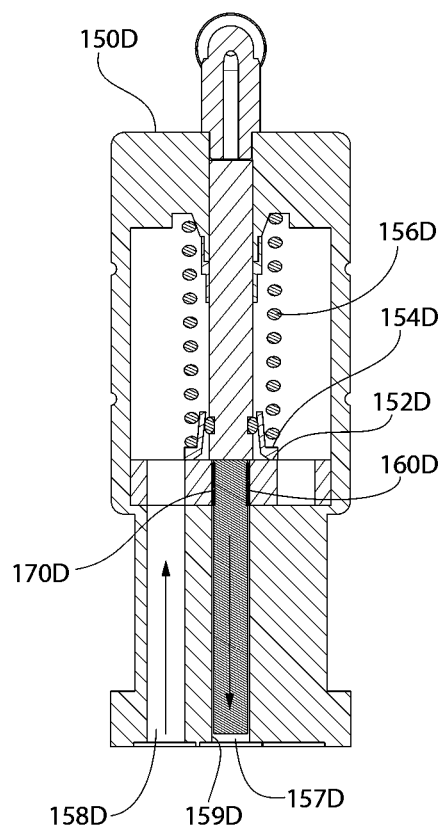
FIG. 84 is a schematic view of a valve incorporating a first embodiment of a flow restrictor and seal as may be utilized in the mass flow controller of FIG. 83.

Turning to FIG. 84, a schematic of an on/off valve 150D is shown with a first embodiment of the flow restrictor 160D located within an outlet passage 157D of the on/off valve 150D. The on/off valve 150D has an inlet passage 158D which allows process gas to flow into the valve 150D. A spring 156D biases a closure member 154D into contact with a valve seat 152D, preventing process gas from flowing when the valve 150D is in a closed state. When in an open state, the closure member 154D is moved so that it is spaced from the valve seat 152D, allowing process gas to pass the valve seat 152D into the outlet 157D. The outlet 157D is formed as a cylindrical bore, but may also be formed as an oval, polygon, or any other shape. The flow restrictor 160D is inserted into the outlet 157D with a seal 170D preventing gas flow between the flow restrictor 160D and the wall 159D of the outlet 157D.

Figure 85:
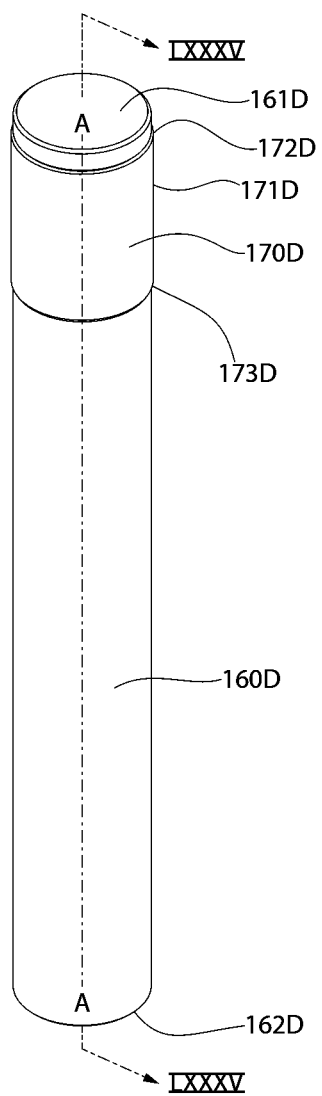
FIG. 85 is a perspective view of the first embodiment of the flow restrictor and seal as may be utilized in the valve of FIG. 84.

Turning to FIGS. 85-88, the flow restrictor 160D and the seal 170D are shown in greater detail. FIG. 85 shows a perspective view of the flow restrictor 160D and the seal 170D. The flow restrictor 160D extends from a first end 161D to a second end 162D along a longitudinal axis A-A. The seal 170D is fitted to the flow restrictor 160D. The seal 170D circumferentially surrounds the flow restrictor 160D and has an outer surface 171D. The seal 170D extends between a first end 172D and a second end 173D along a longitudinal axis B-B. The longitudinal axis B-B of the seal 170D is collinear with the longitudinal axis A-A of the flow restrictor 160D. However, in alternate embodiments, the longitudinal axis B-B of the seal 170D may not be collinear with the longitudinal axis A-A of the flow restrictor 170D. In some embodiments, the longitudinal axis B-B of the seal is angled with respect to the longitudinal axis A-A of the flow restrictor 160D. In yet other embodiments, the longitudinal axis B-B of the seal may be spaced but parallel to the longitudinal axis A-A of the flow restrictor 160D. In yet other embodiments, the axes may be both angled and spaced from one another.

Figure 86:
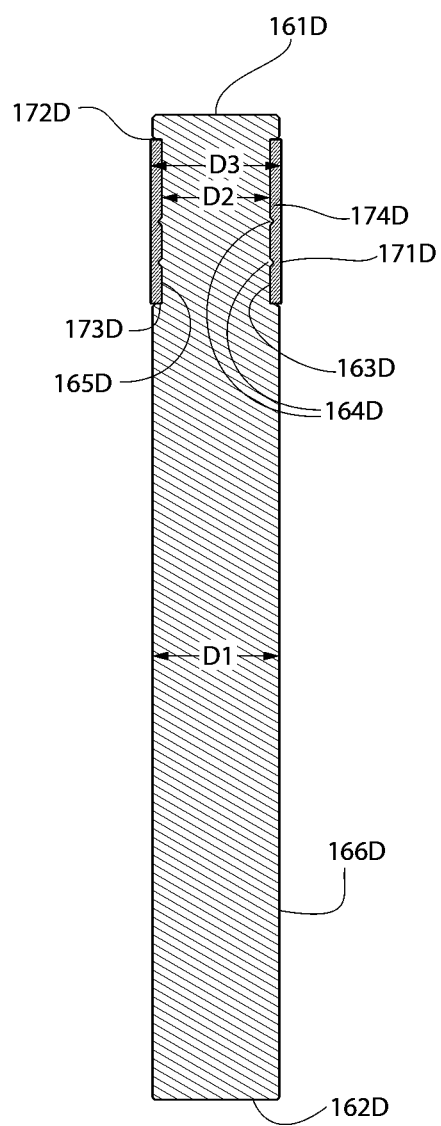
FIG. 86 is a cross-sectional view of the flow restrictor and seal of FIG. 85, taken along line LXXXV-LXXXV.
Figure 87:
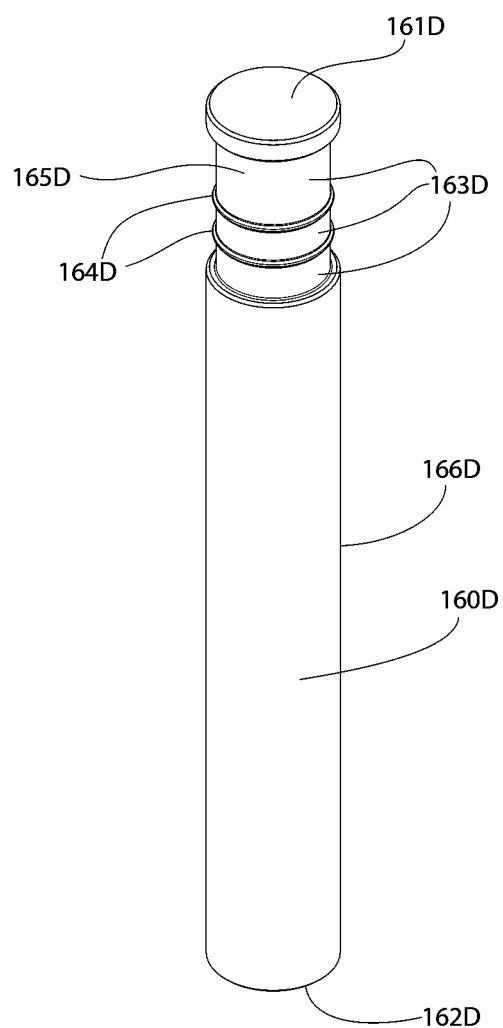
FIG. 87 is a perspective view of the flow restrictor of FIG. 85 without the seal.
Figure 88:
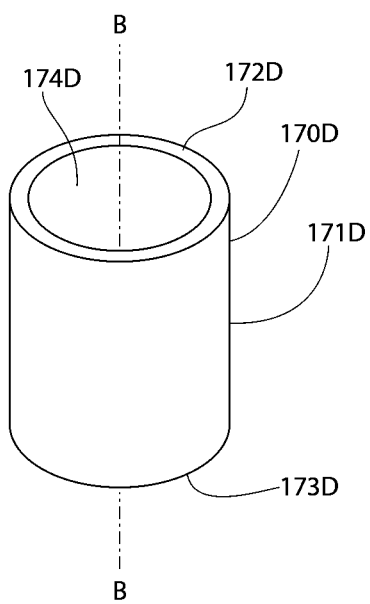
FIG. 88 is a perspective view of the seal of FIG. 85 without the flow restrictor.

As best seen in FIG. 86, the flow restrictor 160D has a sealing portion 163D and an unsealed portion 166D. The unsealed portion 166D has a first diameter D1 and the sealing portion 163D has a second diameter D2, the first diameter D1 being greater than the second diameter D2. The seal 170D further comprises an inner surface 174D which is in surface contact with the sealing portion 163D of the flow restrictor 160D. The outer surface 171D has a third diameter D3 which is greater than either of the first and second diameters D1, D2. This results in an interference fit between the wall 159D and the outer surface 171D and ensures that the seal 170D seals against the wall 159D of the outlet 157D while simultaneously preventing contact between the flow restrictor 160D and the wall 159D. The inner surface 174D defines an aperture through which the flow restrictor 160D is received and through which all gas flows generally along the axis B-B from the first end 161D to the second end 162D of the flow restrictor 160D. In yet other embodiments, the sealing portion 163D extends the entire length of the flow restrictor 160D. In yet further embodiments, the first diameter D1 may be the same diameter as the second diameter D2. Preferably, the third diameter D3 has an interference fit with the wall 159D. The third diameter D3 may also be the same diameter as the second diameter D2. Furthermore, the gas need not enter from the first end 161D and exit the second end 162D of the flow restrictor, but may also enter through the circumference of the flow restrictor 160D. Flow of gas within the flow restrictor 160D need not flow strictly along the axis B-B, but need only pass through the flow restrictor 160D and past the seal 170D rather than around it.

The sealing portion 163D has a seal receiving surface 165D and a plurality of ridges 164D used to improve sealing and retain the seal in place. The second diameter D2 is reduced as compared with the first diameter D1 so as to provide room for the seal 170D and enhance retention of the seal 170D on the flow restrictor 160D. The ridges 164D have a triangular cross-section and encircle the flow restrictor 160D. When the seal 170D is installed onto the sealing portion 163D of the flow restrictor 160D, the ridges 164D deform the seal 170D to further enhance the retention of the seal 170D. This ensures that the seal 170D is maintained on the flow restrictor 160D when the flow restrictor is pressed into the outlet 157D. The third diameter D3 is typically an interference fit with the outlet 157D, so substantial force may be required to press the seal 170D into the outlet 157D depending on the extent of the interference. In the exemplary embodiment, the sealing portion 163D has two ridges 164D. In alternate embodiments, the sealing portion 163D may have greater or fewer ridges 164D. The cross-sectional profile of the ridges 164D may be rectangular, trapezoidal, or any other shape. In yet further variations, a texture may be formed on the seal receiving surface 165D. This texture may be formed by knurling, grinding, or any other known process. In alternate embodiments, a single model of flow restrictor 160D may be installed into a plurality of outlets 157D having differing diameters by modifying the thickness of the seal such that the third diameter D3 is modified to have a suitable interference with the wall 159D of each of the respective outlets 157D. This configuration beneficially allows the restrictor to be installed directly against the seat of the valve, greatly reducing the volume enclosed between the valve seat and the flow restrictor 160D. In addition, multiple valve geometries, bore sizes, and fitting geometries can be accommodated by positioning the flow restrictor 160D within the outlet 157D.

In use, process gas flows through the flow restrictor 160D from the first end 161D to the second end 162D. The seal 170D provides a close fit with both the flow restrictor 160D and the wall 159D of the outlet 157D so as to prevent process gas from flowing around the flow restrictor 160D. Although some leakage of gas is possible, this leaking is reduced to at least $1\times10^{-7}$ atm-cc/sec when Helium is used as a process gas. This leak rate ensures that a negligible volume of process gas flows around the flow restrictor 160D rather than through the flow restrictor 160D.

The seal 170D is preferably formed of a non-metallic material such as a plastic material. One exemplary material could be Polytetrafluoroethylene (also known as "PTFE" or "Teflon"). Alternate materials may include metals, ceramics, or composite materials. The seal 170D is preferably shrunk or stretched onto the flow restrictor 160D so as to ensure a tight fit between the seal receiving surface 165D and the inner surface 174D. However, other methods are contemplated. In yet further embodiments, the seal may be welded, bonded, or pressed onto the flow restrictor 160D so as to achieve a secure gas tight connection between the seal 170D and the flow restrictor 160D. In yet another embodiment, a plurality of identical flow restrictors 160D are mounted to differing seals 170D to allow installation into different size outlets 157D.

Figure 89:
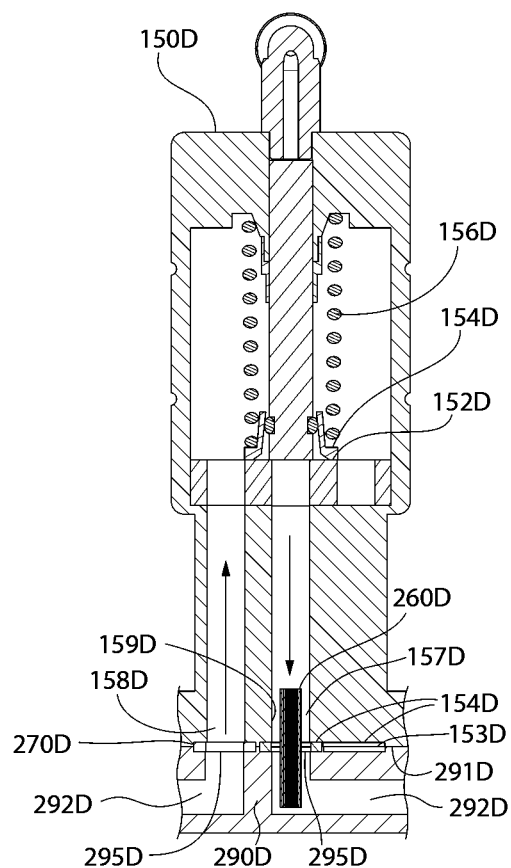
FIG. 89 is a schematic view of a valve incorporating a second embodiment of a flow restrictor and seal as may be utilized in the mass flow controller of FIG. 83.
Figure 90:
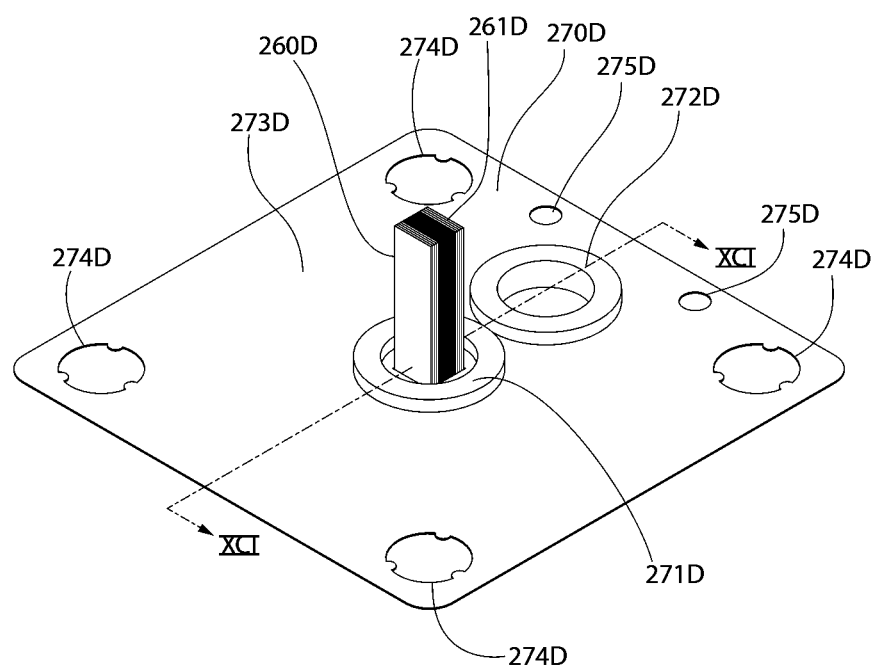
FIG. 90 is a perspective view of the second embodiment of the flow restrictor and seal as may be utilized in the valve of FIG. 89.
Figure 91:
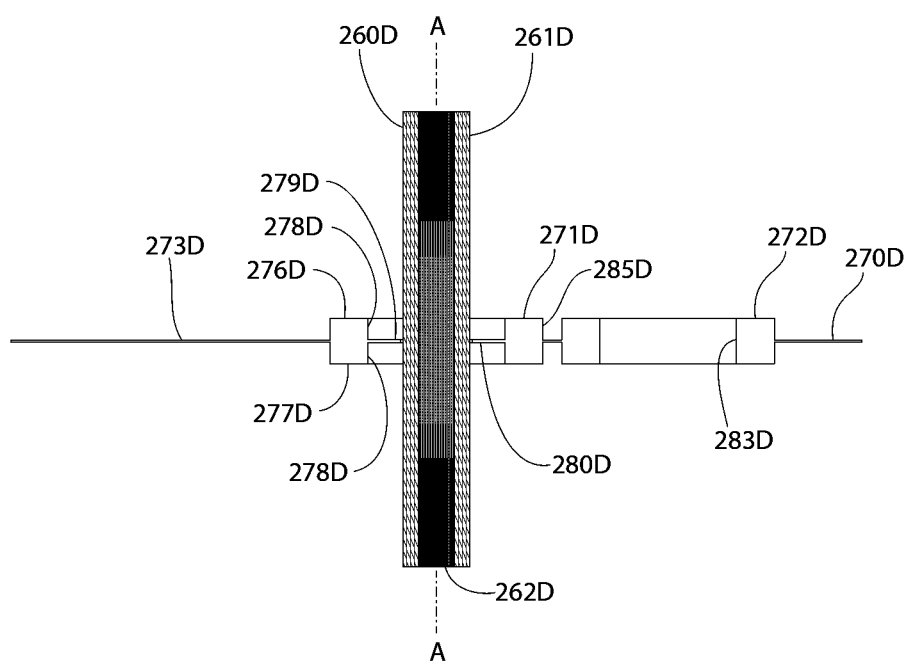
FIG. 91 is a cross-sectional view of the flow restrictor and seal of FIG. 90, taken along line XCI-XCI.

Turning to FIGS. 89-95, a second embodiment of a flow restrictor 260D is shown with a seal 270D. As can be seen in the schematic of FIG. 89, a valve 150D is illustrated. The valve 150D is substantially identical to the valve 150D of FIG. 84. However, instead of having a flow restrictor pressed into the outlet 157D, a seal 270D is mounted between a sealing surface 153D of the valve 150D and a sealing surface 291D of a base 290D, the base 290D comprising flow passages 292D which connect the on/off valve 150D to the various components of the mass flow controller 101D or other apparatus for controlling flow 100D. The seal 270D is installed between the sealing surface 153D and the sealing surface 291D and has a first seal ring 271D and a second seal ring 272D as best shown in FIGS. 90 and 91. The first seal ring 271D and second seal ring 272D are mounted to a gasket sheet 273D and extend beyond the gasket sheet 273D to engage sealing recesses 155D, 295D of the valve 150D and the base 290D, respectively. A plurality of apertures 274D are provided through the gasket sheet 273D to allow the passage of fasteners used to join the valve 150D to the base 290D. Additional holes 275D may be used to facilitate manufacturing of the seal 270D or for other purposes such as to seal additional flow passages.

Figure 92:
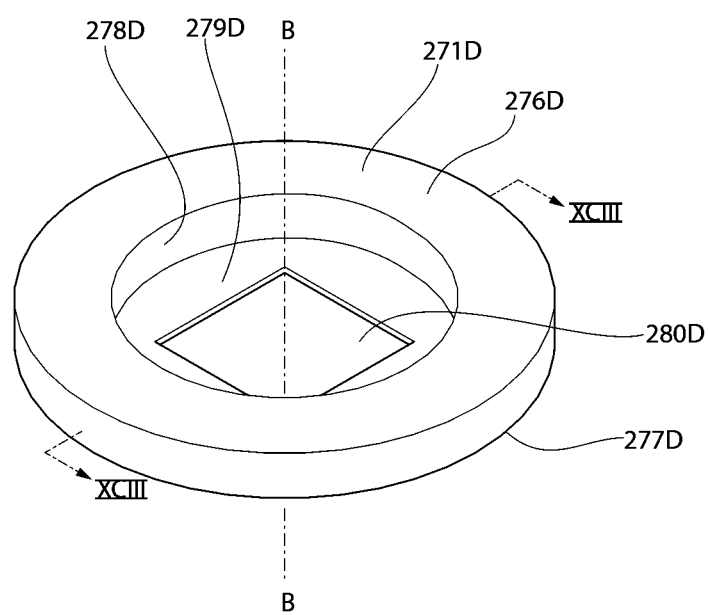
FIG. 92 is a perspective view of the seal of FIG. 90 without the flow restrictor.
Figure 93:
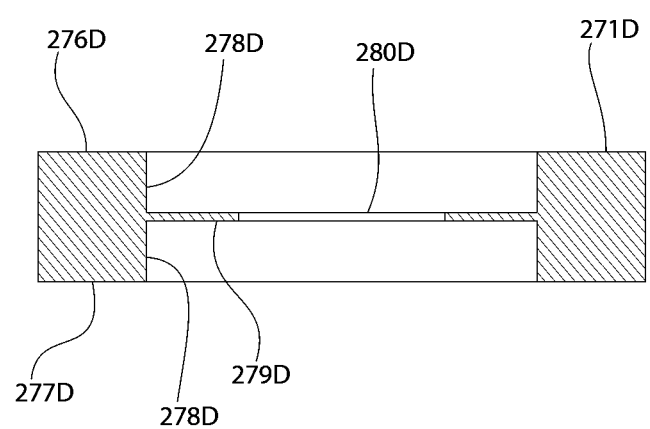
FIG. 93 is a cross-sectional view of the seal of FIG. 92, taken along line XCIII-XCIII.
Figure 94:
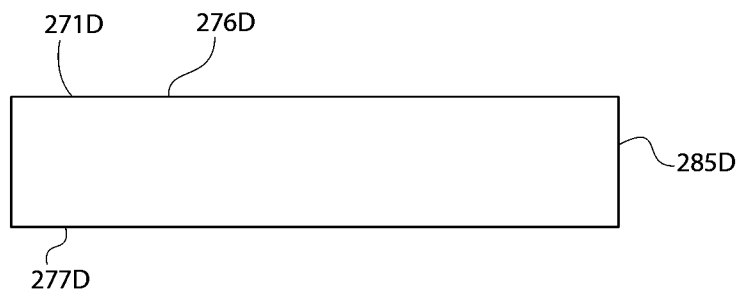
FIG. 94 is a front view of the seal of FIG. 92.
Figure 95:
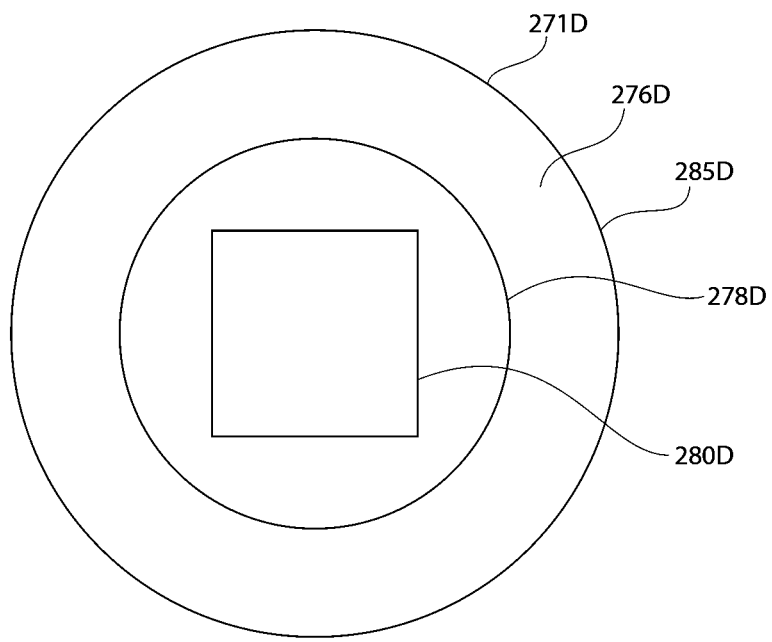
FIG. 95 is a top view of the seal of FIG. 92.

As can be seen in FIG. 91, the first seal ring 271D of the seal 270D receives the flow restrictor 260D. The flow restrictor 260D extends from a first end 261D to a second end 262D along a longitudinal axis A-A. As best seen in FIGS. 91 and 92, the first seal ring 271D has a first side 276D and a second side 277D opposite the first side 276D, a longitudinal axis B-B extending through the first seal ring 271D perpendicular to the first and second sides 276D, 277D. The first and second sides 276D, 277D engage the sealing recesses 155D, 295D and are compressed between them when the valve 150D is mounted to the base 290D. The first seal ring 271D also has an inner surface 278D which is generally cylindrical and a sealing web 279D which extends across the inner surface 278D. A flow aperture 280D is formed in the sealing web 279D to receive the flow restrictor 260D. The flow aperture 280D has a generally rectangular shape in the present embodiment, but in other embodiments it may be circular, elliptical, or any other shape suitable to accommodate a corresponding flow restrictor. The flow restrictor 260D has a generally rectangular profile along the longitudinal axis and is a close fit within the flow aperture 280D. Once the flow restrictor 260D is installed in the flow aperture 280D, it can be welded, bonded, or press fit to achieve a gas tight seal between the outer surface of the flow restrictor 260D and the sealing web 279D, ensuring that no process gas escapes past the flow restrictor 260D without passing through the flow restrictor 260D. The first seal ring 271D also has an outer surface 285D which may be of any size or diameter so long as the first seal ring 271D can nest within the sealing recesses 155D, 295D. In alternate configurations, the sealing recesses 155D, 295D may be omitted. In yet further configurations, the inner surface 278D and outer surface 285D need not be cylindrical, and may be rectangular, ellipsoid, polygonal, or any other shape.

The second seal ring 272D also has a first side 281D and a second side 282D. However, the second seal ring 272D differs from the first seal ring 271D in that it has no corresponding sealing web. Instead, the inner surface 283D defines a flow aperture that enables the passage of process gas without significant flow impedance. Ideally, the flow passages and the second seal ring 272D provide no restriction to fluid flow. In alternate embodiments, the seal 270D may comprise only the first seal ring 271D and be free of the second seal ring 272D or any other components. Alternately, there may be more than one of the first or second seal rings 271D, 272D.

In alternate embodiments, the flow aperture 280D of the first seal ring 271D may be circular, rectangular, have a polygon shape, may comprise arcs, or may have any known shape. Thus, any cross-section of flow restrictor may be accommodated in the seal ring 271D. In yet further embodiments, the seal ring 271D may be press fit, welded, bonded, or otherwise secured directly within a flow passage such as the outlet 157D of the valve 150D or the flow passages 292D of the base 290D. In yet further embodiments, the gasket sheet 273D may be omitted, such that the seal is comprised only of the seal ring 271D. The seal 270D is preferably constructed at least partially of a metal material. In the most preferred embodiments, the first and second seal rings 271D, 272D are metallic.

During assembly, the seal 270D is placed between the valve 150D and the base 290D and aligned so that the first and second seal rings 271D, 272D align with the sealing recesses 155D, 295D. The flow restrictor 260D then extends into the outlet 157D and the corresponding flow passage 292D in the base 290D. The flow restrictor 260D may be attached to the first seal ring 271D so that the seal is halfway along the length of the flow restrictor 260D, or it may be attached at any point along the length of the flow restrictor 260D. It may even be attached substantially flush with either the first or second end 261D, 262D. Furthermore, the seal 270D may be installed such that it is located within a portion of the valve 150D to minimize the distance between the valve seat 152D and the flow restrictor 260D, minimizing the volume therebetween. As noted previously, the seal 270D may also be configured so that the flow restrictor 260D is positioned upstream of the valve seat 152D and positioned in the inlet 158D instead of the outlet 157D. The seal of this embodiment can reliably produce a seal with a Helium leak rate better than $1 \times 10^{-11}$ atm-cc/sec, substantially eliminating all flow of process gas around the flow restrictor 260D.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A gas flow control system for delivering a plurality of gas flows, the gas flow control system comprising:
    a gas flow path extending from a gas inlet to a first gas outlet and a second gas outlet;
    a first proportional valve operably coupled to the gas flow path;
    a first on/off valve operably coupled to the gas flow path and located between the first proportional valve and the first gas outlet;
    a first flow restrictor having a first flow impedance operably coupled to the gas flow path and located between the first proportional valve and the first gas outlet;

a second flow restrictor having a second flow impedance operably coupled to the gas flow path and located between the first proportional valve and the second gas outlet;

wherein, when both the first proportional valve and the first on/off valve are in a fully open state, a ratio between a first gas flow from the first gas outlet and a second gas flow from the second gas outlet is determined by a ratio of the first flow impedance and the second flow impedance.

2. The system of claim 1 further comprising a second on/off valve operably coupled to the gas flow path and located between the first proportional valve and the second gas outlet.

3. The system of claim 1 further comprising a controller having a memory, the memory storing a value representing the first flow impedance or the second flow impedance.

4. The system of claim 1 further comprising a pressure transducer operably coupled to the gas flow path between the first proportional valve and the first and second flow restrictors.

5. The system of claim 1 further comprising a base, the first on/off valve, the first proportional valve, the first flow restrictor, and the second flow restrictor all mounted to the base.

6. The system of claim 1 wherein the gas flow path comprises a third gas outlet and the gas flow control system further comprises a third valve operably coupled to the gas flow path and located between the gas inlet and the third gas outlet.

7. The system of claim 6 wherein the third valve is a proportional valve.

8. The system of claim 6 wherein the third valve is an on/off valve.

9. A gas flow control system for delivering a plurality of gas flows, the gas flow control system comprising:
  a gas flow path extending from a gas inlet to a first gas outlet and a second gas outlet;
  a first valve operably coupled to the gas flow path and located between the gas inlet and the first gas outlet;
  a second valve operably coupled to the gas flow path and located between the gas inlet and the second gas outlet;
  a first flow restrictor having a first flow impedance operably coupled to the gas flow path;
  a second flow restrictor having a second flow impedance operably coupled to the gas flow path;
  wherein, when both the first valve and the second valve are in a fully open state, a ratio between a first gas flow from the first gas outlet and a second gas flow from the second gas outlet is determined by a ratio of the first flow impedance and the second flow impedance.

10. The gas flow control system of claim 9 wherein the first valve is a proportional valve and the second valve is an on/off valve.

11. The gas flow control system of claim 9 wherein the first and second valves are on/off valves.

12. The gas flow control system of claim 9 wherein the first and second valves are proportional valves.

13. The gas flow control system of claim 9 further comprising a third valve operably coupled to the gas flow path, the third valve located upstream of the first and second valves.

14. The gas flow control system of claim 9 further comprising:
  a third flow restrictor having a third flow impedance operably coupled to the gas flow path and located between the gas inlet and a third gas outlet of the gas flow path; and
  a fourth valve operably coupled to the gas flow path, the fourth valve located between the gas inlet and the third gas outlet.

15. The gas flow control system of claim 9 further comprising a base, the first valve, the second valve, the first flow restrictor, and the second flow restrictor all mounted to the base.

16. The gas flow control system of claim 9 further comprising a pressure transducer operably coupled to the gas flow path upstream of the first and second valves and the first and second flow restrictors.

17. A method of delivering a process gas, the method comprising:
  (a) providing a gas flow apparatus having a gas flow path extending from a gas inlet to a first gas outlet and a second gas outlet, a first valve operably coupled to the gas flow path and located between the gas inlet and the first gas outlet, a second valve operably coupled to the gas flow path and located between the gas inlet and the second gas outlet, a first flow restrictor having a first flow impedance operably coupled to the gas flow path and located between the gas inlet and the first gas outlet, and a second flow restrictor having a second flow impedance operably coupled to the gas flow path and located between the gas inlet and the second gas outlet;
  (b) transitioning the first valve to a partially open state and delivering a first controlled flow of process gas to the first gas outlet;
  (c) transitioning the second valve to a fully open state and delivering a second controlled flow of process gas to the second gas outlet.

18. The method of claim 17 wherein the first valve is a proportional valve.

19. The method of claim 17 wherein step b) occurs substantially simultaneously with step c).

20. The method of claim 17 wherein, in step c), the first valve remains in a partially open state.

\* \* \* \* \*